(12) United States Patent
Nishikawa et al.

(10) Patent No.: US 10,074,313 B2
(45) Date of Patent: Sep. 11, 2018

(54) DISPLAY DEVICE AND METHOD FOR DRIVING SAME

(71) Applicant: Sharp Kabushiki Kaisha, Sakai, Osaka (JP)

(72) Inventors: Daichi Nishikawa, Sakai (JP); Yasuyuki Ogawa, Sakai (JP); Kaoru Yamamoto, Sakai (JP); Noritaka Kishi, Sakai (JP); Shigetsugu Yamanaka, Sakai (JP); Masanori Ohara, Sakai (JP); Noboru Noguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/316,921

(22) PCT Filed: Jun. 5, 2015

(86) PCT No.: PCT/JP2015/066316
§ 371 (c)(1),
(2) Date: Mar. 17, 2017

(87) PCT Pub. No.: WO2015/190407
PCT Pub. Date: Dec. 17, 2015

(65) Prior Publication Data
US 2017/0186373 A1    Jun. 29, 2017

(30) Foreign Application Priority Data
Jun. 10, 2014    (JP) .................... 2014-119952

(51) Int. Cl.
*G09G 5/00*    (2006.01)
*G09G 3/3258*    (2016.01)
(Continued)

(52) U.S. Cl.
CPC ......... *G09G 3/3258* (2013.01); *G09G 3/3266* (2013.01); *G09G 3/3291* (2013.01);
(Continued)

(58) Field of Classification Search
CPC .......... G11C 19/28; G09G 2310/0286; G09G 2310/08; G09G 2320/045; G09G 2330/023; G09G 2330/12
(Continued)

(56) References Cited

U.S. PATENT DOCUMENTS

2003/0117352 A1    6/2003  Kimura
2004/0036669 A1    2/2004  Yanagi et al.
(Continued)

FOREIGN PATENT DOCUMENTS

JP    2003-202834 A    7/2003
JP    2004-78124 A     3/2004
(Continued)

OTHER PUBLICATIONS

Official Communication issued in International Patent Application No. PCT/JP2015/066316, dated Sep. 1, 2015.

*Primary Examiner* — Mark Regn
(74) *Attorney, Agent, or Firm* — Keating & Bennett, LLP

(57) ABSTRACT

In a current measurement period set in a pause period, a display device of the present invention applies measurement voltages to data lines (S1 to Sm) and measures currents outputted to monitoring lines (M1 to Mm) from m pixel circuits (18), and then applies data voltages generated corresponding to video signals to the data lines (S1 to Sm).

19 Claims, 45 Drawing Sheets

(51) Int. Cl.
*G09G 3/3266* (2016.01)
*G09G 3/3291* (2016.01)
*G11C 19/28* (2006.01)

(52) U.S. Cl.
CPC ..... *G11C 19/28* (2013.01); *G09G 2310/0286* (2013.01); *G09G 2310/08* (2013.01); *G09G 2320/045* (2013.01); *G09G 2320/048* (2013.01); *G09G 2330/023* (2013.01); *G09G 2330/12* (2013.01)

(58) Field of Classification Search
USPC .......................................................... 345/214
See application file for complete search history.

(56) References Cited

U.S. PATENT DOCUMENTS

| 2007/0210996 | A1 | 9/2007 | Mizukoshi et al. |
| 2008/0007546 | A1 | 1/2008 | Kawabe |
| 2009/0262101 | A1 | 10/2009 | Nathan et al. |
| 2010/0188390 | A1 | 7/2010 | Min et al. |
| 2010/0245331 | A1* | 9/2010 | Shirouzu ............. G09G 3/3233 345/212 |
| 2012/0169386 | A1* | 7/2012 | Cheng ................... G11C 19/28 327/142 |
| 2014/0064439 | A1* | 3/2014 | Qing ..................... G11C 19/28 377/75 |
| 2016/0111044 | A1 | 4/2016 | Kishi et al. |
| 2016/0300534 | A1 | 10/2016 | Kishi |

FOREIGN PATENT DOCUMENTS

| JP | 2005-284172 A | 10/2005 |
| JP | 2006-17968 A | 1/2006 |
| JP | 2011-520138 A | 7/2011 |
| JP | 2014-006519 A | 1/2014 |
| WO | 2010/001594 A1 | 1/2010 |
| WO | 2014/208459 A1 | 12/2014 |
| WO | 2015/093097 A1 | 6/2015 |

\* cited by examiner

DISPLAY DEVICE AND METHOD FOR DRIVING SAME

TECHNICAL FIELD

The present invention relates to a display device, and more particularly to an active matrix-type display device including electro-optical elements such as organic EL elements, and a method for driving the display device.

BACKGROUND ART

In recent years, as a thin, lightweight, and fast responsible display device, attention has been focused on an organic EL (Electro Luminescence) display device. The organic EL display device includes a plurality of pixel circuits arranged two-dimensionally. Each pixel circuit of the organic EL display device includes an organic EL element and a drive transistor provided in series with the organic EL element. The drive transistor controls the amount of current flowing through the organic EL element, and the organic EL element emits light at a luminance depending on the amount of current flowing therethrough.

The organic EL display device has a problem of a reduction in the luminances of pixels with usage time. The reason for the reduction in the luminances of pixels is that the light-emission efficiency of the organic EL elements decreases and the characteristics (e.g., a threshold voltage) of the drive transistors change with usage time. For a method for solving this problem, there is known a method in which a current flowing through a pixel circuit is read out to a source external to the pixel circuit via a data line, etc., and a video signal is corrected based on a result of measurement of the read current (see, for example, Patent Document 1). Note that a video signal may be corrected based on a result of measurement of a voltage instead of a current.

Apart from this, as a low power consumption display device, there is known a display device that performs pause driving (also called intermittent driving or low-frequency driving). The pause driving is a drive method in which a drive period and a pause period are provided when the same image is continuously displayed, and drive circuits operate during the drive period, and the operation of the drive circuits is stopped during the pause period. The pause driving can be applied when transistors in pixel circuits have excellent off-leakage characteristics (small off-leakage current). A display device that performs pause driving is described in, for example, Patent Document 2.

PRIOR ART DOCUMENTS

Patent Documents

[Patent Document 1] Japanese Patent Application Laid-Open No. 2005-284172

[Patent Document 2] Japanese Patent Application Laid-Open No. 2004-78124

SUMMARY OF THE INVENTION

Problems to be Solved by the Invention

In an active matrix-type display device, one frame period is divided into a video signal period during which pixel circuits are selected row by row in turn, and data voltages are written to pixel circuits of the selected row; and a vertical flyback period during which no data voltages are written to the pixel circuits. In a case of correcting a video signal based on a result of measurement of a current flowing through a pixel circuit, taking into account that a generic scanning line drive circuit does not have the function of outputting a selection-level signal during the vertical flyback period, a method is considered in which a current measurement process is performed in the video signal period.

For a method for measuring currents for pixel circuits of a plurality of rows in one video signal period, there is considered a method (hereinafter, referred to as conventional method) in which a plurality of line periods are selected in a video signal period, and writing of data voltages and measurement of currents are performed with the lengths of the selected line periods extended over normal cases. In the conventional method, scanning lines G1 to Gn are selected at timing shown in FIG. 47. However, in the conventional method, since the lengths of line periods are not fixed, the timing of transferring data from a display control circuit to a data line drive circuit becomes irregular. Due to this, the conventional method has a problem that a frame memory or a line memory for several tens of lines are required for data transfer. In addition, in the conventional method, when a current measurement process is performed, a measurement voltage different than a data voltage is written to a pixel circuit. Hence, the conventional method has another problem that the average luminance of an organic EL element changes due to the writing of the measurement voltage to the pixel circuit, which results in a reduction in the image quality of a display image.

An object of the present invention is therefore to provide a display device capable of performing measurement of the amount of electricity (e.g., measurement of a current in a pixel circuit) for obtaining a characteristic of a circuit element, while preventing a reduction in the image quality of a display image, using simple circuits.

Means for Solving the Problems

A first aspect of the present invention is directed to an active matrix-type display device having a drive period and a pause period, the display device comprising:

a display unit including a plurality of scanning lines, a plurality of data lines, and a plurality of pixel circuits arranged two-dimensionally;

a scanning line drive circuit configured to drive the plurality of scanning lines; and a data line drive circuit having a function of measuring currents outputted from the respective pixel circuits, in addition to a function of driving the plurality of data lines, wherein the scanning line drive circuit applies scanning signals for current measurement and for writing a voltage to a scanning line selected from among the plurality of scanning lines, in a current measurement period set in the pause period, and the data line drive circuit applies measurement voltages to the plurality of data lines, measures currents outputted from pixel circuits provided for the selected scanning line, and applies data voltages generated corresponding to video signals to the plurality of data lines, in the current measurement period.

According to a second aspect of the present invention, in the first aspect of the present invention, the scanning line drive circuit selects the plurality of scanning lines in turn every line period and applies a scanning signal of a selection level to the selected scanning line in the drive period, and it applies a scanning signal of a non-selection level to the plurality of scanning lines in a period other than the current measurement period in the pause period, and the data line drive circuit applies the data voltages to the plurality of data lines every line period in the drive period.

According to a third aspect of the present invention, in the second aspect of the present invention, the display device further includes a display control circuit configured to output an enable signal that goes to the selection level in each line period in the drive period, and goes to the selection level in at least a part of the current measurement period in the pause period, wherein the scanning line drive circuit includes a shift register having a plurality of stages for the plurality of scanning lines and configured to output, based on the enable signal, scanning signals to be applied to the plurality of scanning lines.

According to a fourth aspect of the present invention, in the third aspect of the present invention, each of the stages of the shift register includes:
a node control circuit configured to switch a voltage of a first node between a selection level and a non-selection level, depending on signals inputted from a set terminal and a reset terminal;
a first output control circuit configured to apply a signal inputted from a clock terminal, to a set terminal of a subsequent stage and a reset terminal of a previous stage, when the voltage of the first node is at the selection level; and
a second output control circuit configured to apply the enable signal to a corresponding scanning line when the voltage of the first node is at the selection level.

According to a fifth aspect of the present invention, in the fourth aspect of the present invention, the first output control circuit includes a first output control transistor having a first conductive terminal connected to the clock terminal; a second conductive terminal connected to the set terminal of the subsequent stage and the reset terminal of the previous stage; and a control terminal connected to the first node, and the second output control circuit includes a second output control transistor having a first conductive terminal to which the enable signal is provided; a second conductive terminal connected to the corresponding scanning line; and a control terminal connected to the first node or a second node having a voltage of a same logic level as the first node.

According to a sixth aspect of the present invention, in the fifth aspect of the present invention, the display unit further includes a plurality of monitoring lines, and each of the pixel circuits includes:
an electro-optical element;
a drive transistor provided in series with the electro-optical element;
a write control transistor provided between a corresponding data line and a control terminal of the drive transistor, and having a control terminal connected to a corresponding scanning line;
a read control transistor provided between a corresponding monitoring line and one conductive terminal of the drive transistor, and having a control terminal connected to the corresponding scanning line; and
a capacitor provided between the control terminal of the drive transistor and one conductive terminal thereof.

According to a seventh aspect of the present invention, in the fifth aspect of the present invention, each of the pixel circuits includes:
an electro-optical element;
a drive transistor provided in series with the electro-optical element;
a write control transistor provided between a corresponding data line and one conductive terminal of the drive transistor, and having a control terminal connected to a corresponding scanning line;
a reference voltage application transistor provided between a control terminal of the drive transistor and a wiring line having a reference voltage, and having a control terminal connected to the corresponding scanning line; and
a capacitor provided between the control terminal of the drive transistor and one conductive terminal thereof.

According to an eighth aspect of the present invention, in the fourth aspect of the present invention, the plurality of scanning lines include a plurality of first scanning lines and a plurality of second scanning lines, the enable signal includes a first enable signal and a second enable signal, the first output control circuit includes a first output control transistor having a first conductive terminal connected to the clock terminal; a second conductive terminal connected to the set terminal of the subsequent stage and the reset terminal of the previous stage; and a control terminal connected to the first node, and the second output control circuit includes:
a second output control transistor having a first conductive terminal to which the first enable signal is provided; a second conductive terminal connected to a corresponding first scanning line; and a control terminal connected to the first node or a second node having a voltage of a same logic level as the first node; and
a third output control transistor having a first conductive terminal to which the second enable signal is provided; a second conductive terminal connected to a corresponding second scanning line; and a control terminal connected to the first node or a third node having a voltage of a same logic level as the first node.

According to a ninth aspect of the present invention, in the eighth aspect of the present invention, each of the pixel circuits includes:
an electro-optical element;
a drive transistor provided in series with the electro-optical element;
a write control transistor provided between a corresponding data line and a control terminal of the drive transistor, and having a control terminal connected to a corresponding first scanning line;
a read control transistor provided between the corresponding data line and one conductive terminal of the drive transistor, and having a control terminal connected to a corresponding second scanning line; and
a capacitor provided between the control terminal of the drive transistor and another conductive terminal thereof.

According to a tenth aspect of the present invention, in the third aspect of the present invention, the display control circuit outputs an enable signal for an odd-numbered stage of the shift register and an enable signal for an even-numbered stage of the shift register.

According to an eleventh aspect of the present invention, in the third aspect of the present invention, the display control circuit changes timing at which the enable signal of the selection level is outputted in the pause period, every plurality of pause periods.

According to a twelfth aspect of the present invention, in the third aspect of the present invention, the scanning line drive circuit includes a transistor formed using an oxide semiconductor containing indium, gallium, zinc, and oxygen.

According to a thirteenth aspect of the present invention, in the third aspect of the present invention, the shift register performs, in the drive period, shift operation every line period and performs, in the pause period, shift operation in a longer cycle than the line period.

According to a fourteenth aspect of the present invention, in the second aspect of the present invention, the display device further includes a correction computing unit configured to correct the video signals based on the currents measured by the data line drive circuit.

A fifteenth aspect of the present invention is directed to an active matrix-type display device that includes a plurality of pixel circuits forming a pixel matrix of a plurality of rows×a plurality of columns, each of the pixel circuits including a circuit element for displaying an image, the display device comprising:

data lines provided for respective columns of the pixel matrix in order to supply voltages to the respective pixel circuits;

first scanning lines provided for respective rows of the pixel matrix in order to control writing of voltages to the respective pixel circuits;

second scanning lines provided for the respective rows of the pixel matrix in order to control whether to perform measurement of an amount of electricity, the measurement being performed to obtain a characteristic of the circuit element;

a data line drive circuit having a function of measuring an amount of electricity in addition to a function of applying voltages to be supplied to the respective pixel circuits to the data lines; and a scanning line drive circuit including a shift register and configured to apply first scanning signals and second scanning signals to the first scanning lines and the second scanning lines, respectively, the shift register including a plurality of stages, the plurality of stages having a one-to-one correspondence with the plurality of rows forming the pixel matrix, and each of the stages being connected to a corresponding first scanning line and a corresponding second scanning line, wherein each of the stages of the shift register controls, based on one shift clock, levels of both a first scanning signal to be applied to a corresponding first scanning line and a second scanning signal to be applied to a corresponding second scanning line.

According to a sixteenth aspect of the present invention, in the fifteenth aspect of the present invention, each of the stages of the shift register includes:
a first node;
a first output node connected to a subsequent stage;
a second output node connected to a corresponding first scanning line;
a third output node connected to a corresponding second scanning line;
a first node control portion configured to change the first node from an off level to an on level when an output signal provided from the first output node changes from a non-selection level to a selection level;
an output signal control portion configured to control, when the first node is at the on level, a level of the output signal outputted from the first output node, based on a control clock;
a first scanning signal control portion configured to control, when the first node is at the on level, a level of the first scanning signal outputted from the second output node, based on a first enable signal; and
a second scanning signal control portion configured to control, when the first node is at the on level, a level of the second scanning signal outputted from the third output node, based on a second enable signal.

According to a seventeenth aspect of the present invention, in the sixteenth aspect of the present invention, each of the stages of the shift register further includes a first scanning signal resetting portion configured to bring the level of a first scanning signal outputted from the second output node to the non-selection level, and the first scanning signal control portion includes:
a first scanning control transistor having a control terminal connected to the first node; a first conductive terminal to which the first enable signal is provided; and a second conductive terminal connected to the second output node and the first scanning signal resetting portion; and
a first boost capacitance having one end connected to the first node; and another end connected to the second conductive terminal of the first scanning control transistor.

According to an eighteenth aspect of the present invention, in the seventeenth aspect of the present invention, the first enable signal is a clock signal of four or more phases, and clock signals of different phases are provided as the first enable signal to two adjacent stages in the shift register.

According to a nineteenth aspect of the present invention, in the sixteenth aspect of the present invention, each of the stages of the shift register further includes a second scanning signal resetting portion configured to bring a level of a third scanning signal outputted from the third output node to the non-selection level, and the second scanning signal control portion includes a second scanning control transistor having a control terminal connected to the first node; a first conductive terminal to which the second enable signal is provided; and a second conductive terminal connected to the third output node and the second scanning signal resetting portion.

According to a twentieth aspect of the present invention, in the nineteenth aspect of the present invention, the second scanning signal control portion further includes a second boost capacitance having one end connected to the first node; and another end connected to the second conductive terminal of the second scanning control transistor.

According to a twenty-first aspect of the present invention, in the nineteenth aspect of the present invention, the second enable signal is a clock signal of two or more phases, and clock signals of different phases are provided as the second enable signal to two adjacent stages in the shift register.

According to a twenty-second aspect of the present invention, in the nineteenth aspect of the present invention, each of the stages of the shift register further includes a first scanning signal resetting portion configured to bring the level of a first scanning signal outputted from the second output node to the non-selection level, the first scanning signal control portion includes a first scanning control transistor having a control terminal connected to the first node; a first conductive terminal to which the first enable signal is provided; and a second conductive terminal connected to the second output node and the first scanning signal resetting portion, and the first scanning control transistor has higher current capability than the second scanning control transistor.

According to a twenty-third aspect of the present invention, in the twenty-second aspect of the present invention, the first scanning control transistor has a larger channel width than the second scanning control transistor.

According to a twenty-fourth aspect of the present invention, in the sixteenth aspect of the present invention, each of the stages of the shift register further includes:
a first scanning signal resetting portion configured to bring the level of a first scanning signal outputted from the second output node to the non-selection level; and
a second scanning signal resetting portion configured to bring the level of a second scanning signal outputted from the third output node to the non-selection level, and
based on a same signal, the first scanning signal resetting portion brings the level of the first scanning signal to the non-selection level and the second scanning signal resetting portion brings the level of the second scanning signal to the non-selection level.

According to a twenty-fifth aspect of the present invention, in the sixteenth aspect of the present invention, each of the stages of the shift register further includes:
an output signal resetting portion configured to bring the level of a output signal outputted from the first output node to the non-selection level;
a first scanning signal resetting portion configured to bring the level of a first scanning signal outputted from the second output node to the non-selection level; and
a second scanning signal resetting portion configured to bring the level of a second scanning signal outputted from the third output node to the non-selection level, and
based on a same signal, the output signal resetting portion brings the level of the output signal to the non-selection level, the first scanning signal resetting portion brings the level of the first scanning signal to the non-selection level, and the second scanning signal resetting portion brings the level of the second scanning signal to the non-selection level.

According to a twenty-sixth aspect of the present invention, in the fifteenth aspect of the present invention, the data line drive circuit performs measurement of an amount of electricity in a vertical scanning period.

According to a twenty-seventh aspect of the present invention, in the fifteenth aspect of the present invention, the display device adopts pause driving where a drive period during which normal display operation is performed and a pause period during which operation of the data line drive circuit and the scanning line drive circuit is stopped are repeated, and the data line drive circuit performs measurement of an amount of electricity in the pause period.

According to a twenty-eighth aspect of the present invention, in the fifteenth aspect of the present invention, the data line drive circuit performs measurement of an amount of electricity in a non-display period, the non-display period being a period immediately after power to the device is turned on, and a period from when power-off of the device is instructed until the power to the device is turned off.

According to a twenty-ninth aspect of the present invention, in the twenty-eighth aspect of the present invention, the data line drive circuit applies a voltage corresponding to black display to the data lines every time it performs measurement of an amount of electricity, and the scanning line drive circuit applies a first scanning signal of a selection level to one of the first scanning lines and applies a second scanning signal of the selection level to one of the second scanning lines in a period during which the data line drive circuit applies the voltage corresponding to black display to the data lines.

According to a thirtieth aspect of the present invention, in the fifteenth aspect of the present invention, when a row where measurement of an amount of electricity is performed is defined as a measurement target row, a characteristic detection processing period during which a process of obtaining a characteristic of the circuit element is performed includes: a measurement preparation period during which preparation for measuring an amount of electricity is performed; an amount-of-electricity measurement period during which measurement of an amount of electricity is performed, the amount-of-electricity measurement period being provided after the measurement preparation period; and a display preparation period during which preparation is performed to perform desired display on the measurement target row, the display preparation period being provided after the amount-of-electricity measurement period, the scanning line drive circuit:
applies, during the measurement preparation period, a first scanning signal of a selection level to a first scanning line corresponding to the measurement target row;
applies, during the amount-of-electricity measurement period, a second scanning signal of the selection level to a second scanning line corresponding to the measurement target row; and
applies, during the display preparation period, a first scanning signal of the selection level to a first scanning line corresponding to the measurement target row, and
the data line drive circuit:
applies, during the measurement preparation period, voltages for performing measurement of an amount of electricity to obtain a characteristic of the circuit element to the data lines; and
applies, during the display preparation period, voltages to the data lines, the voltages being generated depending on target luminances of respective pixels provided for the measurement target row.

According to a thirty-first aspect of the present invention, in the thirtieth aspect of the present invention, the amount-of-electricity measurement period is set to be a longer period than the measurement preparation period and set to be a longer period than the display preparation period.

According to a thirty-second aspect of the present invention, in the thirtieth aspect of the present invention, a length of the amount-of-electricity measurement period is configured to be changeable.

According to a thirty-third aspect of the present invention, in the thirtieth aspect of the present invention, the characteristic detection processing period further includes a pixel reset period during which black display is performed on the measurement target row, the pixel reset period being provided before the measurement preparation period, the scanning line drive circuit applies a first scanning signal of the selection level to a first scanning line corresponding to the measurement target row and applies a second scanning signal of the selection level to a second scanning line corresponding to the measurement target row during the pixel reset period, and the data line drive circuit applies a voltage corresponding to the black display to the data lines during the pixel reset period.

According to a thirty-fourth aspect of the present invention, in the fifteenth aspect of the present invention, the plurality of pixel circuits and the scanning line drive circuit are formed on one glass substrate.

According to a thirty-fifth aspect of the present invention, in the thirty-fourth aspect of the present invention, the plurality of pixel circuits and the scanning line drive circuit include transistors formed using an oxide semiconductor containing indium, gallium, zinc, and oxygen.

According to a thirty-sixth aspect of the present invention, in the thirty-fourth aspect of the present invention, the scanning line drive circuit is provided on only one side of a rectangular region where the pixel matrix is formed, the one side pertaining to a direction in which the first scanning lines and the second scanning lines extend.

According to a thirty-seventh aspect of the present invention, in the thirty-fourth aspect of the present invention, the scanning line drive circuit is provided on one side and another side of a rectangular region where the pixel matrix is formed, the one and other sides pertaining to a direction in which the first scanning lines and the second scanning lines extend.

According to a thirty-eighth aspect of the present invention, in the fifteenth aspect of the present invention, the display device further includes a control unit configured to control operation of the data line drive circuit and the scanning line drive circuit, wherein when measurement of an amount of electricity is performed by the data line drive circuit, the control unit controls the operation of the scanning line drive circuit such that the shift register stops transfer of the shift clock.

A thirty-ninth aspect of the present invention is directed to a method for driving an active matrix-type display device having a display unit including a plurality of scanning lines, a plurality of data lines, and a plurality of pixel circuits arranged two-dimensionally; and having a drive period and a pause period, the method includes:

a step of driving the plurality of scanning lines; and a step of driving the plurality of data lines and measuring currents outputted from the respective pixel circuits, wherein in the step of driving the plurality of scanning lines, scanning signals for current measurement and for writing a voltage are applied to a scanning line selected from among the plurality of scanning lines, in a current measurement period set in the pause period, and in the step of driving the plurality of data lines and measuring currents, measurement voltages are applied to the plurality of data lines, currents outputted from pixel circuits provided for the selected scanning line are measured, and data voltages generated corresponding to video signals are applied to the plurality of data lines, in the current measurement period.

A fortieth aspect of the present invention is directed to a method for driving an active matrix-type display device including: a plurality of pixel circuits forming a pixel matrix of a plurality of rows×a plurality of columns, each of the pixel circuits including a circuit element for displaying an image; data lines provided for respective columns of the pixel matrix in order to supply voltages to the respective pixel circuits; first scanning lines provided for respective rows of the pixel matrix in order to control writing of voltages to the respective pixel circuits; and second scanning lines provided for the respective rows of the pixel matrix in order to control whether to perform measurement of an amount of electricity, the measurement being performed to obtain a characteristic of the circuit element, the method includes:

a data line driving step of driving the data lines to perform application of voltages to be supplied to the respective pixel circuits to the data lines, and to perform measurement of an amount of electricity; and a scanning line driving step of applying, by a shift register, first scanning signals and second scanning signals to the first scanning lines and the second scanning lines, respectively, the shift register including a plurality of stages, the plurality of stages having a one-to-one correspondence with the plurality of rows forming the pixel matrix, and each of the stages being connected to a corresponding first scanning line and a corresponding second scanning line, wherein in the scanning line driving step, each of the stages of the shift register controls, based on one shift clock, levels of both a first scanning signal to be applied to a corresponding first scanning line and a second scanning signal to be applied to a corresponding second scanning line.

Effects of the Invention

According to the first or thirty-ninth aspect of the present invention, when pause driving is performed using a drive period and a pause period, a current measurement period is set in the pause period, and a current outputted from a pixel circuit to which a measurement voltage has been written can be measured in the current measurement period. In addition, by writing a data voltage to the pixel circuit in the current measurement period, an influence exerted on a display image by the current measurement is suppressed, enabling to prevent a reduction in the image quality of the display image.

According to the second aspect of the present invention, by fixing the voltages of the scanning lines during a period other than the current measurement period in the pause period, power consumption of the display device can be reduced.

According to the third aspect of the present invention, by generating, using the same shift register, a scanning signal for the drive period and a scanning signal for the pause period based on an enable signal that changes in different manners for the drive period and the pause period, the configuration of the scanning line drive circuit can be simplified.

According to the fourth aspect of the present invention, a scanning signal based on the enable signal can be outputted separately from an output signal to the subsequent stage using two output control circuits.

According to the fifth aspect of the present invention, a first output control circuit that outputs an output signal to the subsequent stage can be configured using a first output control transistor, and a second output control circuit that outputs a scanning signal can be configured using a second output control transistor.

According to the sixth aspect of the present invention, a display device including: pixel circuits, each including an electro-optical element, three transistors, and a capacitor; and monitoring lines can measure currents in the pixel circuits while preventing a reduction in the image quality of a display image using simple circuits.

According to the seventh aspect of the present invention, a display device including: pixel circuits, each including an electro-optical element, three transistors, and a capacitor; and a wiring line having a reference voltage can measure currents in the pixel circuits while preventing a reduction in the image quality of a display image using simple circuits.

According to the eighth aspect of the present invention, in a display device including two types of scanning lines, a first output control circuit that outputs an output signal to the subsequent stage can be configured using a first output control transistor, and a second output control circuit that outputs two scanning signals can be configured using a second output control transistor and a third output control transistor.

According to the ninth aspect of the present invention, a display device including pixel circuits, each including an electro-optical element, three transistors, and a capacitor can measure currents in the pixel circuits while preventing a reduction in the image quality of a display image using simple circuits.

According to the tenth aspect of the present invention, by supplying different enable signals to an odd-numbered stage of the shift register and an even-numbered stage thereof, voltages of adjacent scanning lines can be prevented from going to a selection level in the same time slot.

According to the eleventh aspect of the present invention, by continuously selecting the same scanning line in the pause period, a current can be measured a plurality of times for the same pixel circuit with changed conditions.

According to the twelfth aspect of the present invention, an oxide semiconductor containing indium, gallium, zinc, and oxygen has higher mobility than amorphous silicon, and thus, by forming the transistors included in the scanning line drive circuit using the oxide semiconductor, the transistor size is reduced, enabling to reduce the layout area of the scanning line drive circuit. Therefore, when the pixel circuits are integrally formed with the scanning line drive circuit, the area of a picture-frame formed around a pixel region can be reduced. In addition, a transistor formed using the oxide semiconductor has a feature that off-leakage current is small. Therefore, by integrally forming the pixel circuits and the scanning line drive circuit, it is possible to implement the pixel circuits whose voltages held therein are less likely to fluctuate and which are suitable for the pause driving, and the scanning line drive circuit that is less likely to malfunction even when a period where operation is paused is long.

According to the thirteenth aspect of the present invention, by making the current measurement period longer than the line period, writing of a measurement voltage, measurement of a current, and writing of a data voltage can be performed taking necessary time in the current measurement period.

According to the fourteenth aspect of the present invention, by correcting a video signal based on a current measurement result, a reduction in the luminance of a pixel is compensated for, enabling to improve the image quality of a display image.

According to the fifteenth or fortieth aspect of the present invention, a shift register that controls the levels of both of a first scanning signal and a second scanning signal based on one shift clock is provided in the scanning line drive circuit. Therefore, measurement of the amount of electricity for obtaining a characteristic of the circuit element can be performed using simple circuits.

According to the sixteenth aspect of the present invention, by suitably controlling the waveforms of a control clock, a first enable signal, and a second enable signal, a display device that provides the effect of the fifteenth aspect of the present invention is implemented.

According to the seventeenth aspect of the present invention, a display device including first scanning signal control portions, each having a first scanning control transistor and a first boost capacitance, can obtain the same effect as that of the fifteenth aspect of the present invention.

According to the eighteenth aspect of the present invention, a display device that uses a clock signal of four or more phases as the first enable signal can obtain the same effect as that of the fifteenth aspect of the present invention.

According to the nineteenth aspect of the present invention, a display device including second scanning signal control portions, each having a second scanning control transistor, can obtain the same effect as that of the fifteenth aspect of the present invention.

According to the twentieth aspect of the present invention, a display device including second scanning signal control portions, each having a second scanning control transistor and a second boost capacitance, can obtain the same effect as that of the fifteenth aspect of the present invention.

According to the twenty-first aspect of the present invention, a display device that uses a clock signal of two or more phases as the second enable signal can obtain the same effect as that of the fifteenth aspect of the present invention.

According to the twenty-second aspect of the present invention, writing to a pixel can be performed in a sufficiently short time, enabling to secure a sufficient period during which the amount of electricity is measured.

According to the twenty-third aspect of the present invention, the same effect as that of the twenty-second aspect of the present invention can be obtained.

According to the twenty-fourth aspect of the present invention, the levels of both the first scanning signal and the second scanning signal can be brought to a non-selection level with a simple configuration.

According to the twenty-fifth aspect of the present invention, the levels of all of the output signal, the first scanning signal, and the second scanning signal can be brought to a non-selection level with a simple configuration.

According to the twenty-sixth aspect of the present invention, even when a special drive method such as pause driving is not adopted, measurement of the amount of electricity for obtaining a characteristic of the circuit element can be performed.

According to the twenty-seventh aspect of the present invention, measurement of the amount of electricity for obtaining a characteristic of the circuit element can be performed without influencing the image quality of a display image.

According to the twenty-eighth aspect of the present invention, even when a special drive method such as pause driving is not adopted, measurement of the amount of electricity for obtaining a characteristic of the circuit element can be performed. In addition, the measurement of the amount of electricity can be performed without influencing at all the image quality of a display image.

According to the twenty-ninth aspect of the present invention, unnecessary display (e.g., light emission of the organic EL elements) is prevented from being performed during a non-display period.

According to the thirtieth aspect of the present invention, since a voltage generated depending on a target luminance is applied to each pixel after measuring the amount of electricity, an influence exerted on a display image by the measurement of the amount of electricity is suppressed, enabling to prevent a reduction in the image quality of the display image.

According to the thirty-first aspect of the present invention, since the reliability of the result of measurement of the amount of electricity increases, degradation of the circuit element can be more effectively compensated for.

According to the thirty-second aspect of the present invention, when the result of measurement of the amount of electricity (analog data) is AD-converted, the resolution of AD conversion by an A/D converter can be effectively utilized.

According to the thirty-third aspect of the present invention, the display state of a pixel is brought into a black display state immediately before performing measurement of the amount of electricity. By this, it is possible to eliminate an influence exerted on a measurement result by a state in a pixel circuit that is before performing measurement of the amount of electricity.

According to the thirty-fourth aspect of the present invention, since the pixel circuits and the scanning line drive circuit are formed on the same glass substrate, miniaturization of the display device is possible.

According to the thirty-fifth aspect of the present invention, an oxide semiconductor containing indium, gallium, zinc, and oxygen has higher mobility than amorphous silicon, and thus, by forming the transistors included in the scanning line drive circuit using the oxide semiconductor, the transistor size is reduced, enabling to reduce the layout area of the scanning line drive circuit. Therefore, when the pixel circuits are integrally formed with the scanning line drive circuit, the area of a picture-frame formed around a pixel region can be reduced. In addition, a transistor formed using the oxide semiconductor has a feature that off-leakage current is small. Therefore, the S/N ratio for when measurement of the amount of electricity is performed can be increased.

According to the thirty-sixth aspect of the present invention, the overall size can be reduced compared to a configuration in which the scanning line drive circuits are provided on both sides of a rectangular region where the pixel matrix is formed.

According to the thirty-seventh aspect of the present invention, the same size can be easily obtained for picture-frames on both the left and right sides of a display unit.

According to the thirty-eighth aspect of the present invention, measurement of the amount of electricity can be securely performed during a period during which transfer of the shift clock is stopped.

MODES FOR CARRYING OUT THE INVENTION

1. First Embodiment

<1.1 Configuration>

Figure 1:
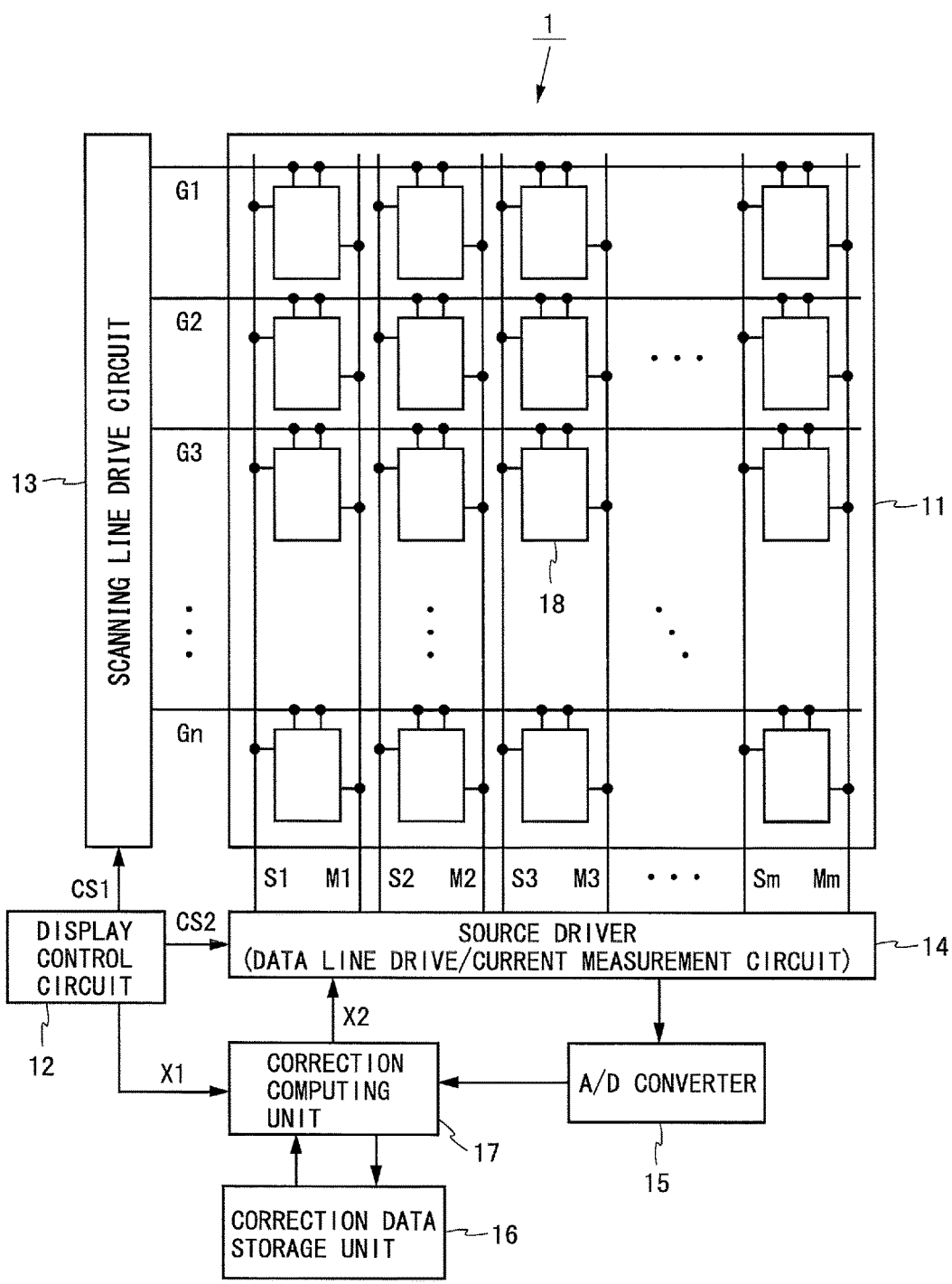
FIG. 1 is a block diagram showing a configuration of a display device according to a first embodiment of the present invention.

FIG. 1 is a block diagram showing a configuration of a display device according to a first embodiment of the present invention. A display device 1 shown in FIG. 1 is an active matrix-type organic EL display device including a display unit 11, a display control circuit 12, a scanning line drive circuit 13, a source driver (data line drive/current measurement circuit) 14, an A/D converter 15, a correction data storage unit 16, and a correction computing unit 17. In the following, m and n are integers greater than or equal to 2, i is an integer between 1 and n, inclusive, and j is an integer between 1 and m, inclusive.

The display unit 11 includes n scanning lines G1 to Gn, m data lines S1 to Sm, m monitoring lines M1 to Mm, and (m×n) pixel circuits 18. The scanning lines G1 to Gn are arranged parallel to each other. The data lines S1 to Sm and the monitoring lines M1 to Mm are arranged parallel to each other and orthogonal to the scanning lines G1 to Gn. The scanning lines G1 to Gn intersect the data lines S1 to Sm at (m×n) locations. The (m×n) pixel circuits 18 are arranged two-dimensionally at the respective intersections of the scanning lines G1 to Gn and the data lines S1 to Sm. By the (m×n) pixel circuits 18, a pixel matrix of n rows×m columns is formed. To the pixel circuits 18 are supplied a high-level power supply voltage ELVDD and a low-level power supply voltage ELVSS, using electrodes which are not shown. A direction in which the scanning lines extend (a horizontal direction in FIG. 1) is hereinafter referred to as row direction, and a direction in which the data lines extend (a vertical direction in FIG. 1) is hereinafter referred to as column direction.

The display control circuit 12 is a control circuit for the display device 1. The display control circuit 12 outputs control signals CS1 to the scanning line drive circuit 13, outputs control signals CS2 to the source driver 14, and outputs video signals X1 to the correction computing unit 17. The control signals CS2 include, for example, a source start pulse and a source clock. A detail of the control signals CS1 will be described later.

The scanning line drive circuit 13 drives the scanning lines G1 to Gn, according to the control signals CS1 (a detail will be described later). Note that to the scanning line drive circuit 13 are provided a high-level voltage VDD and a low-level voltage VSS from a power supply circuit which is not shown. To the source driver 14 are supplied the control signals CS2 and corrected video signals X2 outputted from the correction computing unit 17. The source driver 14 has the function of driving the data lines S1 to Sm (a function as a data line drive circuit) and the function of measuring currents outputted to the monitoring lines M1 to Mm from the pixel circuits 18 (a function as a current measurement circuit). More specifically, the source driver 14 applies, according to the control signals CS2, m voltages generated corresponding to the video signals X2 (hereinafter, referred to as data voltages) to the data lines S1 to Sm, respectively. In addition, the source driver 14 applies, according to the control signals CS2, m measurement voltages to the data lines S1 to Sm, respectively, converts m currents that are outputted at that time to the monitoring lines M1 to Mm from pixel circuits 18 into voltages, and outputs the voltages.

The A/D converter 15 converts the output voltages from the source driver 14 into digital data. The correction data storage unit 16 stores data required for correction computation performed by the correction computing unit 17 (hereinafter, referred to as correction data). The correction computing unit 17 updates the correction data stored in the correction data storage unit 16, based on the data outputted from the A/D converter 15. In addition, the correction computing unit 17 corrects the video signals X1 outputted from the display control circuit 12 by referring to the correction data stored in the correction data storage unit 16, and outputs the corrected video signals X2.

Figure 2:
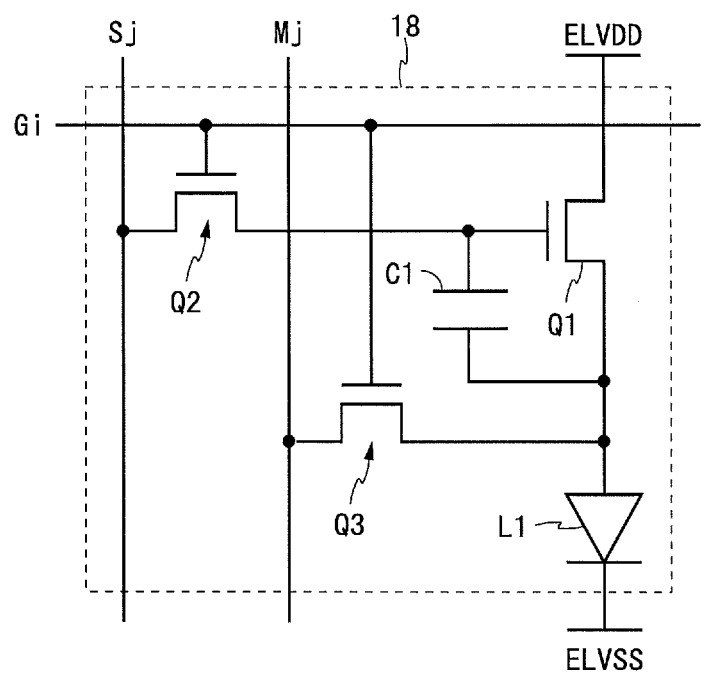
FIG. 2 is a circuit diagram of a pixel circuit of the display device shown in FIG. 1.

FIG. 2 is a circuit diagram of a pixel circuit 18 of an ith row and a jth column. As shown in FIG. 2, the pixel circuit 18 includes an organic EL element L1, transistors Q1 to Q3, and a capacitor C1, and is connected to a scanning line Gi, a data line Sj, and a monitoring line Mj. The transistors Q1 to Q3 are N-channel TFTs (Thin Film Transistors). A high-level power supply voltage ELVDD is applied to a drain terminal of the transistor Q1. A source terminal of the transistor Q1 is connected to an anode terminal of the organic EL element L1. A low-level power supply voltage ELVSS is applied to a cathode terminal of the organic EL element L1. One conductive terminal (a left-side terminal in FIG. 2) of the transistor Q2 is connected to the data line Sj, and the other conductive terminal of the transistor Q2 is connected to a gate terminal of the transistor Q1. One conductive terminal (a left-side terminal in FIG. 2) of the transistor Q3 is connected to the monitoring line Mj, and the other conductive terminal of the transistor Q3 is connected to the source terminal of the transistor Q1 and the anode terminal of the organic EL element L1. Gate terminals of the transistors Q2 and Q3 are connected to the scanning line Gi. The capacitor C1 is provided between the gate and source terminals of the transistor Q1. The transistor Q1 functions as a drive transistor, the transistor Q2 functions as a write control transistor, and the transistor Q3 functions as a read control transistor.

Figure 3:
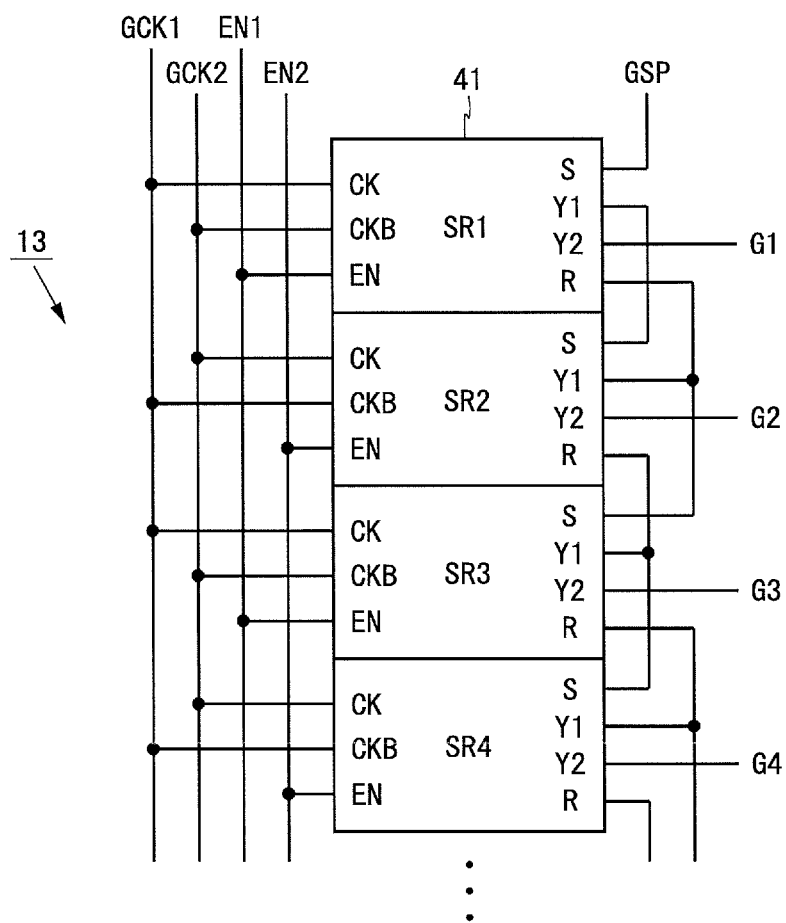
FIG. 3 is a block diagram of a scanning line drive circuit of the display device shown in FIG. 1.

FIG. 3 is a block diagram showing a configuration of the scanning line drive circuit 13. As shown in FIG. 3, the scanning line drive circuit 13 includes a shift register having n cascaded unit circuits 41. Although FIG. 3 shows unit circuits 41 of the first to fourth stages, unit circuits 41 of the fifth to nth stages are also connected in the same manner. Each unit circuit 41 has clock terminals CK and CKB, an enable terminal EN, a set terminal S, a reset terminal R, and output terminals Y1 and Y2. The control signals CS1 supplied to the scanning line drive circuit 13 include a gate start pulse GSP, gate clocks GCK1 and GCK2, and enable signals EN1 and EN2.

The gate start pulse GSP is provided to the set terminal S of the unit circuit 41 of the first stage. The gate clock GCK1 is provided to the clock terminals CK of the unit circuits 41 of the odd-numbered stages and the clock terminals CKB of the unit circuits 41 of the even-numbered stages. The gate clock GCK2 is provided to the clock terminals CK of the unit circuits 41 of the even-numbered stages and the clock terminals CKB of the unit circuits 41 of the odd-numbered stages. The enable signal EN1 is provided to the enable terminals EN of the unit circuits 41 of the odd-numbered stages, and the enable signal EN2 is provided to the enable terminals EN of the unit circuits 41 of the even-numbered stages. The output terminal Y1 of the unit circuit 41 of the first stage is connected to the set terminal S of the unit circuit 41 of the second stage. The output terminals Y1 of the unit circuits 41 of the second to (n−1)th stages are connected to the set terminals S of the unit circuits 41 of their subsequent stages and the reset terminals R of the unit circuits 41 of their previous stages. The output terminal Y1 of the unit circuit 41 of the nth stage is connected to the reset terminal R of the unit circuit 41 of the (n−1)th stage. A signal indicating the end of a video signal period is provided to the reset terminal R of the unit circuit 41 of the nth stage (not shown). The output terminal Y2 of the unit circuit 41 of an ith stage is connected to a scanning line Gi.

Figure 4:
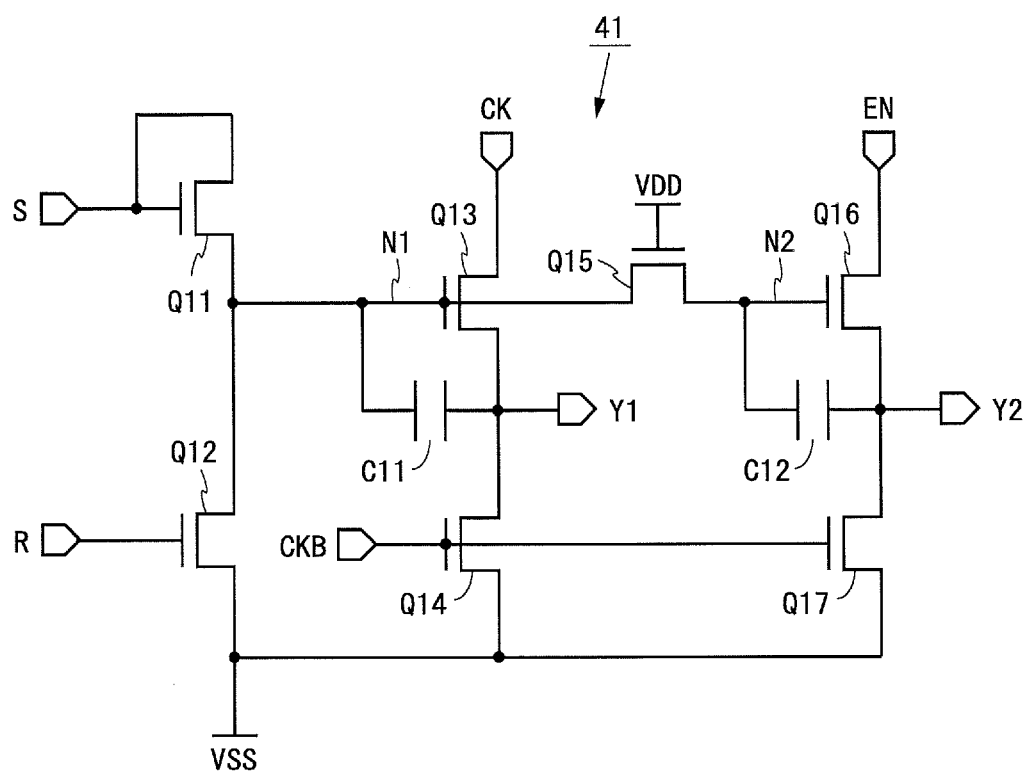
FIG. 4 is a circuit diagram of a unit circuit of the scanning line drive circuit shown in FIG. 3.

FIG. 4 is a circuit diagram of a unit circuit 41. As shown in FIG. 4, the unit circuit 41 includes transistors Q11 to Q17 and capacitors C11 and C12. The transistors Q11 to Q17 are N-channel TFTs. The drain and gate terminals of the transistor Q11 are connected to a set terminal S. A source terminal of the transistor Q11 is connected to a drain terminal of the transistor Q12, a gate terminal of the transistor Q13, and one conductive terminal (a left-side terminal in FIG. 4) of the transistor Q15. A drain terminal of the transistor Q13 is connected to a clock terminal CK, and a source terminal of the transistor Q13 is connected to a drain terminal of the transistor Q14 and an output terminal Y1. The other conductive terminal of the transistor Q15 is connected to a gate terminal of the transistor Q16, and a high-level voltage VDD is applied to a gate terminal of the transistor Q15. A drain terminal of the transistor Q16 is connected to an enable terminal EN, and a source terminal of the transistor Q16 is connected to a drain terminal of the transistor Q17 and an output terminal Y2. A low-level voltage VSS is applied to source terminals of the transistors Q12, Q14, and Q17. A gate terminal of the transistor Q12 is connected to a reset terminal R, and gate terminals of the transistors Q14 and Q17 are connected to a clock terminal CKB. The capacitor C11 is provided between the gate and source terminals of the transistor Q13, and the capacitor C12 is provided between the gate and source terminals of the transistor Q16.

The transistors Q11 and Q12 function as a node control circuit that switches the voltage of a node N1 (first node) shown in FIG. 4 between a high level and a low level, according to signals inputted from the set terminal S and the reset terminal R. The transistors Q13 and Q14 and the capacitor C11 function as a first output control circuit that applies, when the node N1 is in a boost state, a signal inputted from the clock terminal CK to a set terminal S of a unit circuit 41 of the subsequent stage and a reset terminal R of a unit circuit 41 of the previous stage. The transistors Q15 to Q17 and the capacitor C12 function as a second output control circuit that applies, when the voltage of the node N1 is at a high level, an enable signal EN1 or EN2 outputted from the display control circuit 12, to a scanning line Gi.

The transistors Q1 to Q3 included in the pixel circuits 18 and the transistors Q11 to Q17 included in the unit circuits 41 of the scanning line drive circuit 13 are formed using, for example, an oxide semiconductor containing indium (In), gallium (Ga), zinc (Zn), and oxygen (O).

Figure 5:
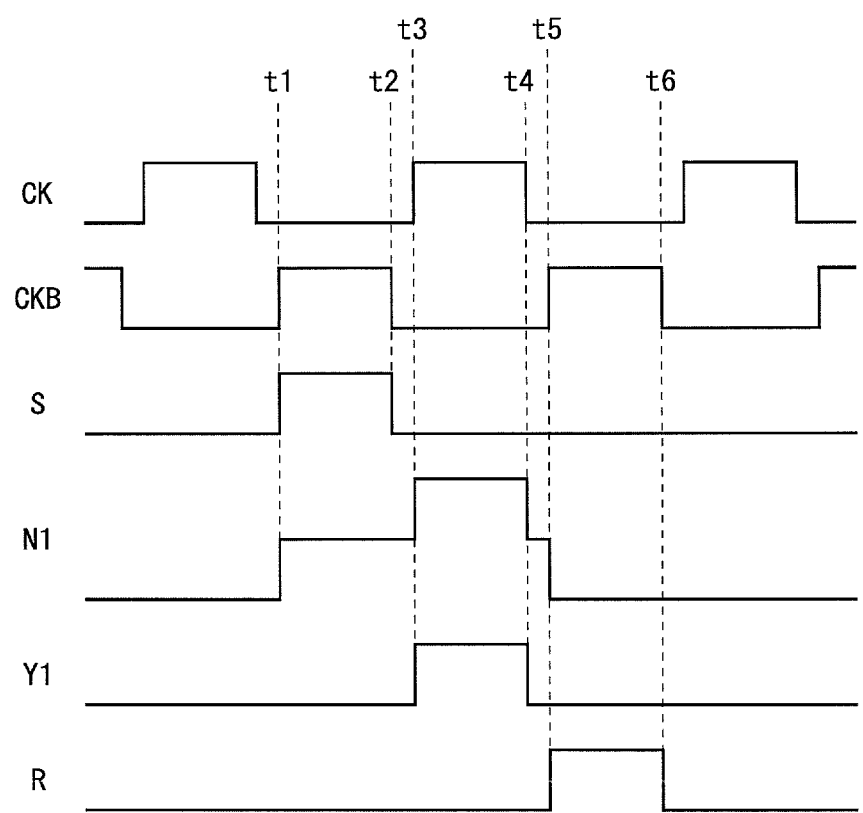
FIG. 5 is a timing chart for the unit circuit shown in FIG. 4.

FIG. 5 is a timing chart for a unit circuit 41. With reference to FIG. 5, the operation of the unit circuit 41 will be described. A signal inputted or outputted through a terminal of the unit circuit 41 is hereinafter called the same name as the terminal. For example, a signal inputted through the clock terminal CK is called a clock signal CK. In addition, nodes to which the gate terminals of the transistors Q13 and Q16 are connected are referred to as node N1 and node N2, respectively. As shown in FIG. 5, clock signals CK and CKB go to a high level in different periods. A set signal S goes to a high level in a high-level period of the clock signal CKB (time t1 to t2 in FIG. 5). A reset signal R goes to a high level in the next high-level period of the clock signal CKB (time t5 to t6 in FIG. 5).

Before time t1, the voltage of the node N1 is at a low level. When the set signal S changes to a high level at time t1, the transistor Q11 goes into an on state, and the voltage of the node N1 changes to a high level. Note that although the transistor Q13 goes into an on state when the voltage of the node N1 is at a normal high level, an output signal Y1 is maintained at a low level since the clock signal CK is at a low level. When the set signal S changes to a low level at time t2, the transistor Q11 goes into an off state and the node N1 goes into a high-impedance state. The voltage of the node N1 is maintained at a high level after time t2, too.

At time t3, the clock signal CK changes to a high level. Since the node N1 is in the high-impedance state at this time, when the clock signal CK changes to a high level, the voltage of the node N1 becomes higher than the normal high level due to bootstrap (the node N1 goes into a boost state). Therefore, the high-level clock signal CK passes through the transistor Q13 and is outputted from the output terminal Y1, with the level thereof maintained (without the level of the clock signal CK reduced by an amount corresponding to a threshold voltage of the transistor Q13). When the clock signal CK changes to a low level at time t4, the voltage of the node N1 goes back to the normal high level, and the output signal Y1 changes to a low level.

When the reset signal R changes to a high level at time t5, the transistor Q12 goes into an on state and the voltage of the node N1 changes to a low level. In addition, when the clock signal CKB changes to a high level at time t5, the transistor Q14 goes into an on state. The transistor Q14 has the function of securely bringing the output signal Y1 to a low level. As such, when the voltage of the node N1 is at a high level, the clock signal CK is outputted from the output terminal Y1.

The transistors Q16 and Q17 and the capacitor C12 are connected in the same manner as the transistors Q13 and Q14 and the capacitor C11. When the enable signal EN changes to a high level with the node N2 being in a high-impedance state and the voltage of the node N2 being at a high level, the voltage of the node N2 becomes higher than the normal high level due to bootstrap (the node N2 goes into a boost state). The transistor Q15 is maintained in an on state except for when the voltage of the node N2 is higher than the normal high level. The node N2 has a voltage of the same logic level as the node N1. Therefore, when the voltages of the nodes N1 and N2 are at a high level, the enable signal EN is outputted from the output terminal Y2.

Note that the transistor Q15 has the function of assisting in an increase in the voltage of the node N2 by bootstrap by going into an off state and electrically disconnecting the nodes N1 and N2 when the voltage of the node N2 reaches a predetermined level or higher. The capacitor C11 has the function of assisting in an increase in the voltage of the node N1 by bootstrap, and the function of reducing an influence exerted on the voltage of the node N1 by noise mixed in the clock signal CK through a parasitic capacitance of the transistor Q13. The capacitor C12 has the same functions as the capacitor C11.

Figure 6:
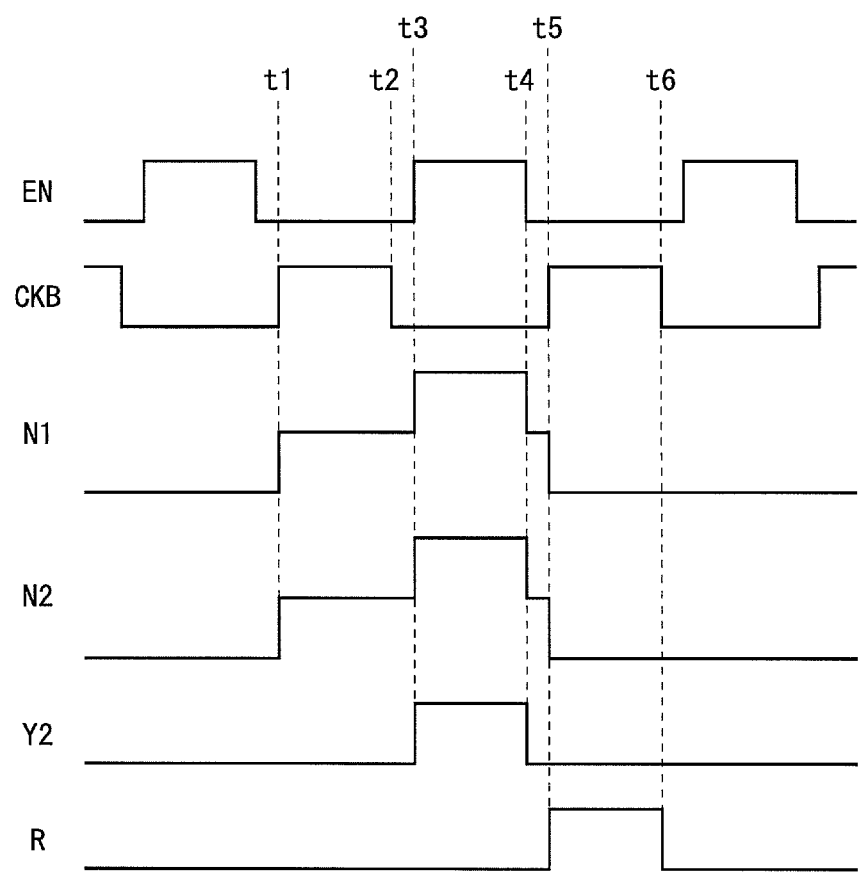
FIG. 6 is a timing chart for the unit circuit shown in FIG. 4.
Figure 7:
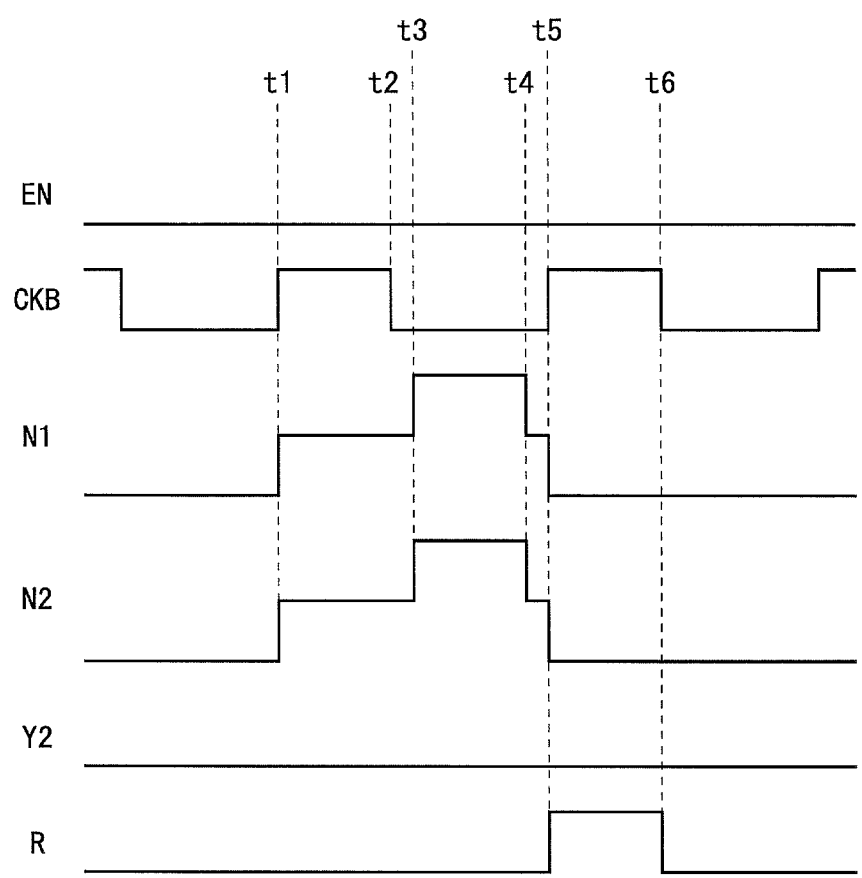
FIG. 7 is a timing chart for the unit circuit shown in FIG. 4.
Figure 8:
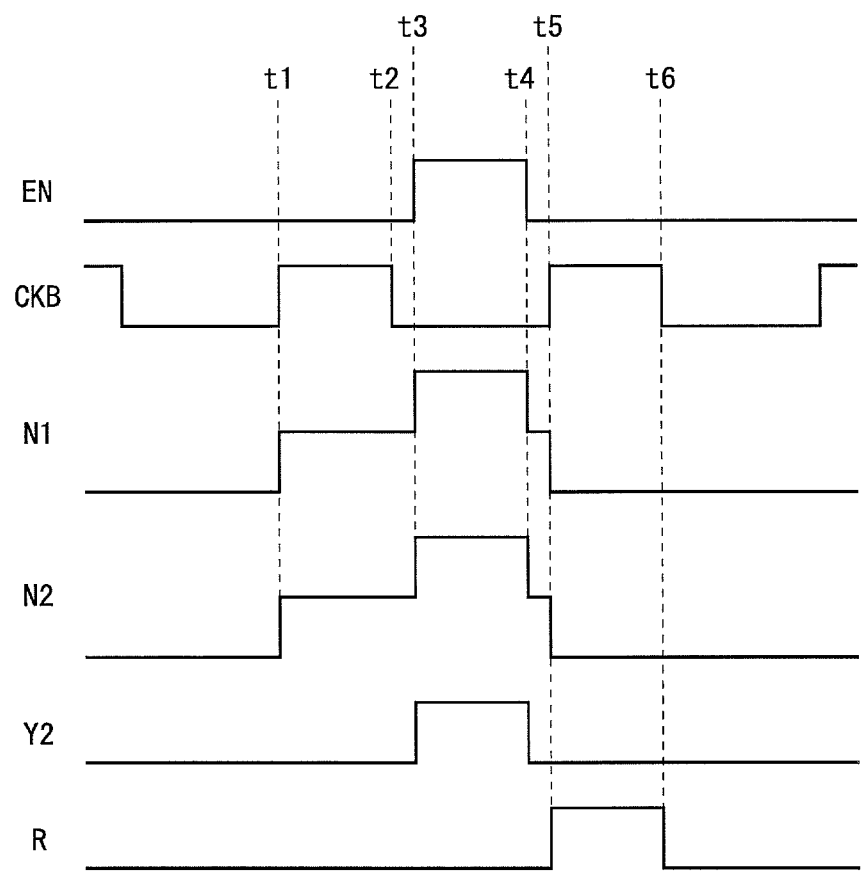
FIG. 8 is a timing chart for the unit circuit shown in FIG. 4.

As described above, the node N2 has a voltage of the same logic level as the node N1. Here, in a drive period, an enable signal EN of a waveform shown in FIG. 6 is provided to the unit circuit 41. Hence, at time t3, the voltage of the node N2 becomes higher than the normal high level due to bootstrap (the node N2 goes into a boost state). By this, the high-level enable signal EN passes through the transistor Q16 and is outputted from the output terminal Y2, with the level thereof maintained (without the level of the enable signal EN reduced by an amount corresponding to a threshold voltage of the transistor Q16) (see FIG. 6). On the other hand, during a pause period, the enable signal EN is maintained at a low level as shown in FIG. 7, except for a current measurement period which will be described later. Hence, even when the voltage of the node N2 becomes higher than the normal high level at time t3 due to bootstrap, the voltage at the output terminal Y2 is maintained at a low level. In the pause period, the enable signal EN goes to a high level only in the current measurement period as shown in FIG. 8. Hence, during the current measurement period (a period from time t3 to time t4 in FIG. 8), by the voltage of the node N2 becoming higher than the normal high level due to bootstrap, the high-level enable signal EN passes through the transistor Q16 and is outputted from the output terminal Y2, with the level thereof maintained (without the level of the enable signal EN reduced by an amount corresponding to the threshold voltage of the transistor Q16).

<1.2 Drive Method>

Figure 9:
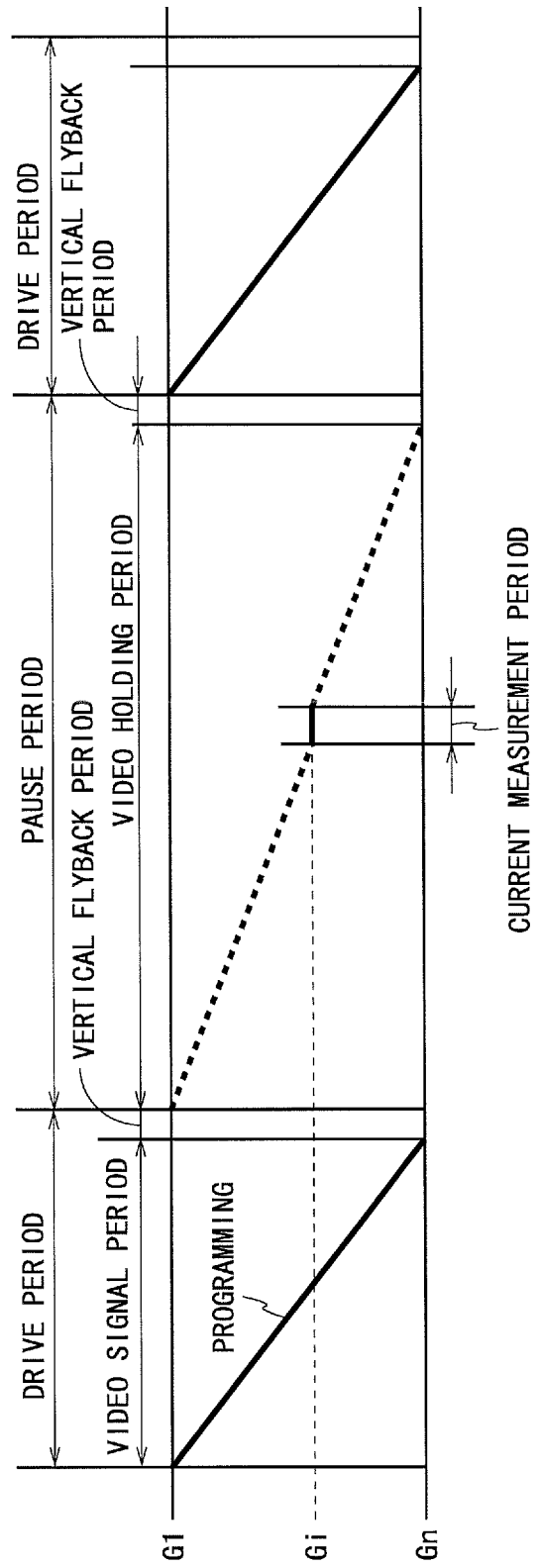
FIG. 9 is a timing chart showing the operation of the display device shown in FIG. 1.

FIG. 9 is a timing chart showing the operation of the display device 1. The display device 1 performs pause driving that uses a drive period and a pause period. The length of the drive period is set to one frame period, and the drive period is divided into a video signal period and a vertical flyback period. The video signal period includes n line periods (also called horizontal periods) for the pixel circuits 18 of the n rows. During the video signal period, each of the cycles of the gate clocks GCK1 and GCK2 is two line periods, and the n scanning lines G1 to Gn are selected in turn on a per line period basis. During an ith line period, the scanning line drive circuit 13 controls the voltage of a scanning line Gi to a high level, and the source driver 14 applies m data voltages to the data lines S1 to Sm. By this, the data voltages are written to m pixel circuits 18 connected to the scanning line Gi (represented as "PROGRAMMING" in FIG. 9).

Figure 10:
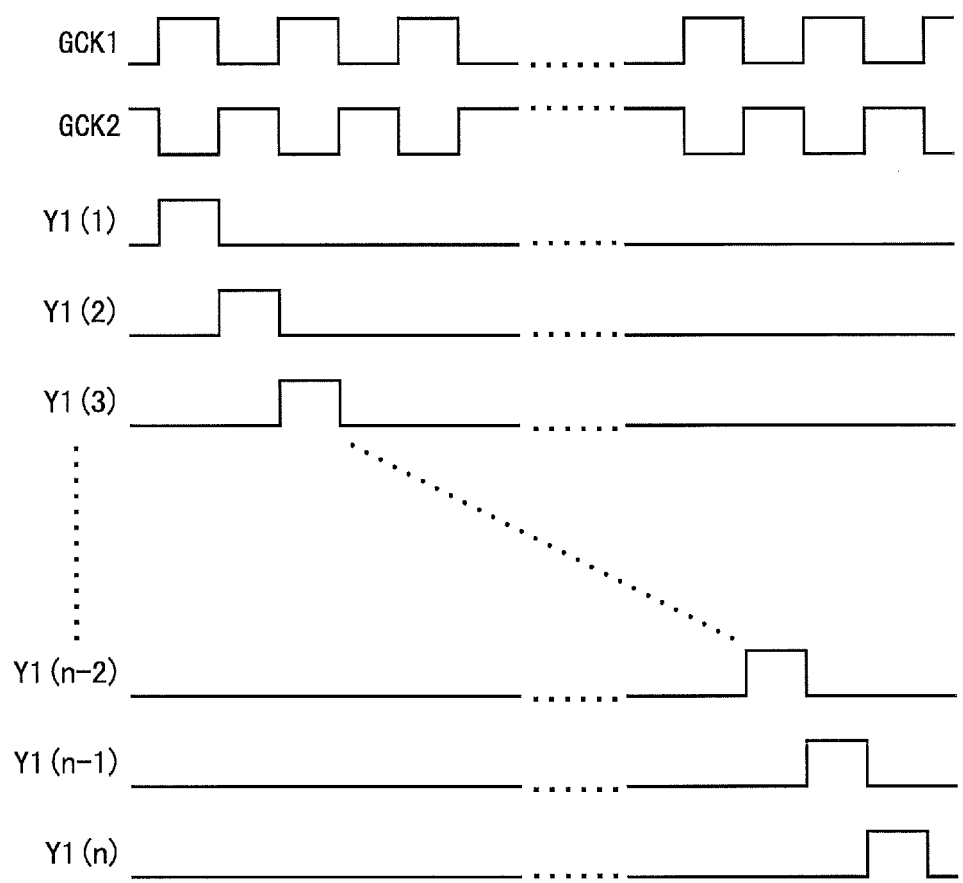
FIG. 10 is a timing chart showing the waveforms of output signals Y1 during a pause period of the display device shown in FIG. 1.

The length of the pause period is longer than one frame period and is set to, for example, a plurality of frame periods. The pause period is divided into a video holding period and a vertical flyback period. The gate clocks GCK1 and GCK2 change to a high level and a low level not only in the drive period but also in the pause period. The cycles of the gate clocks GCK1 and GCK2 during the pause period are longer than two line periods. In the pause period, as shown in FIG. 10, output signals Y1 from the n unit circuits 41 go to a high level for one-half cycle of the gate clocks GCK1 and GCK2, in ascending order (in order of the first stage, the second stage, the third stage, . . . ). The periods during which the output signals Y1 from the unit circuits 41 of the first to nth stages go to a high level in the pause period are hereinafter referred to as the first to nth pause line periods, respectively. In the following description, it is assumed that the video holding period includes each of the first to nth pause line periods once.

In the pause period, one pause line period (hereinafter, the pause line period is an ith pause line period) is selected as a current measurement period. During the current measurement period, a scanning line Gi is selected. During the current measurement period, the scanning line drive circuit 13 applies a scanning signal for current measurement and a scanning signal for writing a voltage to the selected scanning line Gi. A scanning line to be selected in the pause period is determined by a predetermined method (e.g., in ascending order or randomly), and is changed every four pause periods. During a period other than the current measurement period in the pause period, the scanning line drive circuit 13 controls the voltages of the scanning lines G1 to Gn to a low level (shown by thick dashed lines in FIG. 9).

Figure 11:
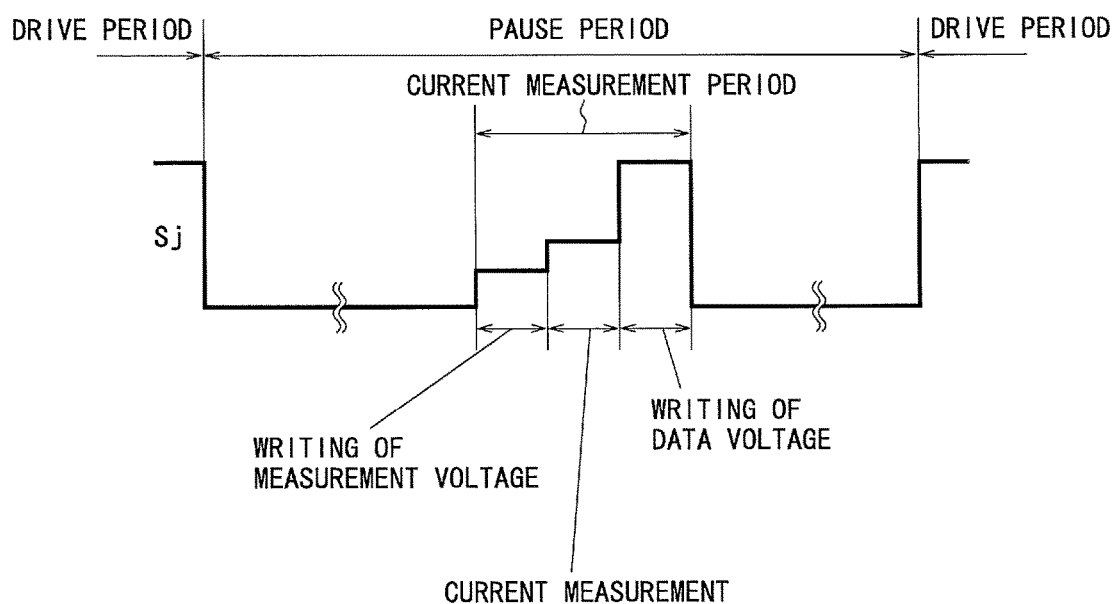
FIG. 11 is a schematic diagram showing changes in the voltages of a data line and a monitoring line during the pause period of the display device shown in FIG. 1.

FIG. 11 is a schematic diagram showing changes in the voltages of a data line Sj and a monitoring line Mj during the pause period. In the current measurement period, the source driver 14 applies measurement voltages to the data lines S1 to Sm, measures currents outputted to the monitoring lines M1 to Mm from m pixel circuits 18, and applies m data voltages to the data lines S1 to Sm. By this, a process of writing a measurement voltage, a process of measuring a current, and a process of writing a data voltage are performed on the m pixel circuits 18 connected to the scanning line Gi. The display device 1 performs the process of writing a measurement voltage and the process of measuring a current in the same time slot. The source driver 14 does not drive the data line Sj in a period other than the current measurement period in the pause period.

Figure 12:
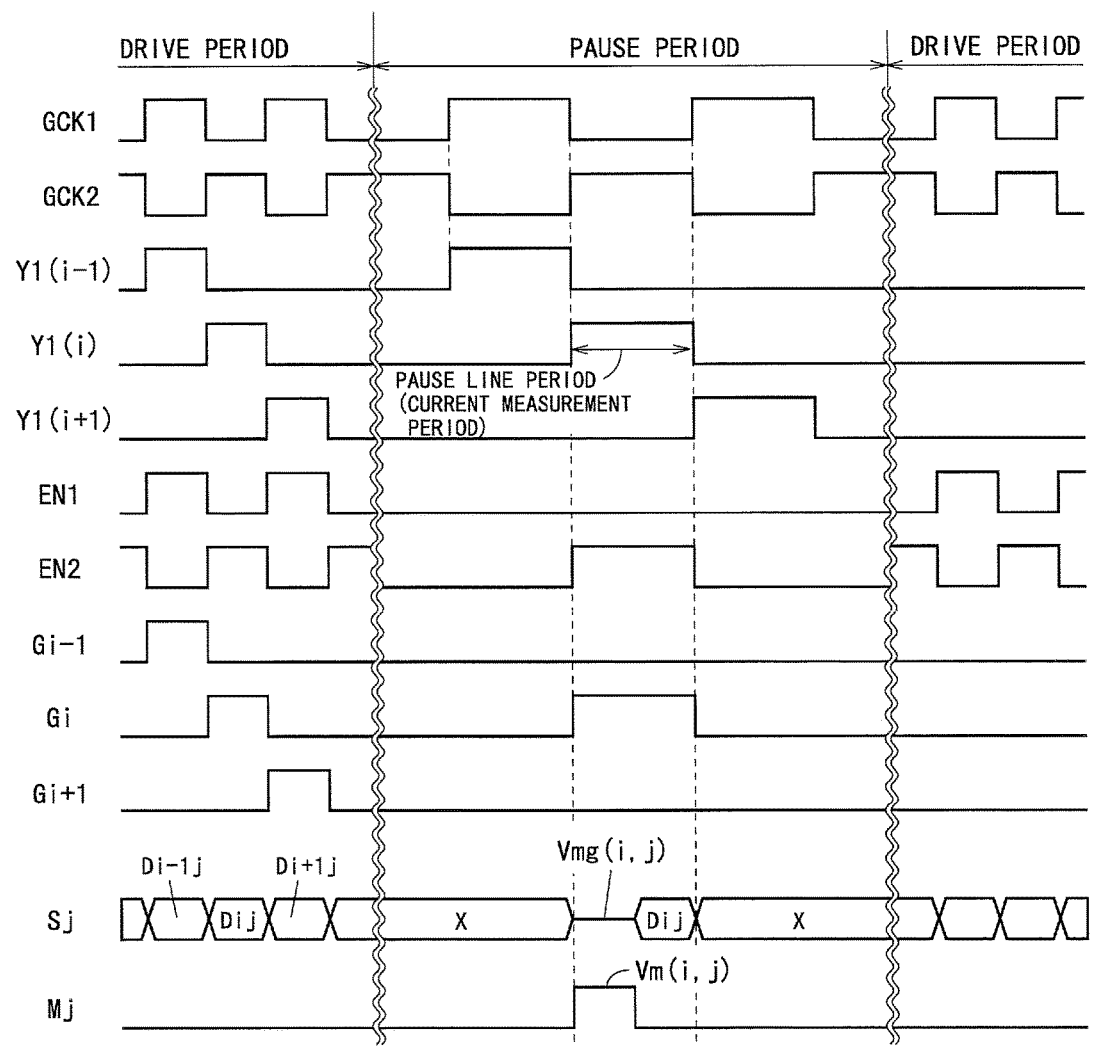
FIG. 12 is a detailed timing chart for the display device shown in FIG. 1.

FIG. 12 is a detailed timing chart for the display device 1. FIG. 12 shows timing for when an even-numbered scanning line Gi (i is an even number) is selected in a pause period. Note that although some interval is provided between a fall time of one clock and a rise time of the other clock as shown in FIG. 5, FIG. 12 shows the clocks ignoring the interval for convenience of description. As shown in FIG. 12, the gate clocks GCK1 and GCK2 go to a high level in different periods. The cycles of the gate clocks GCK1 and GCK2 are two line periods during the drive period, and the gate start pulse GSP (not shown) goes to a high level only for one line period before the start of the drive period. Therefore, the output signals Y1 from the unit circuits 41 of the first to nth stages go to a high level during the first to nth line periods, respectively, and go to a low level during other periods in the drive period. During the drive period, the enable signals EN1 and EN2 change in the same manner as the gate clocks GCK1 and GCK2, respectively. Hence, in the unit circuit 41 of each stage, the clock signal CK and the enable signal EN change in the same manner, and the output signal Y2 changes in the same manner as the output signal Y1. Accordingly, in the drive period, the voltages of the scanning lines G1 to Gn go to a high level only during the first to nth line periods, respectively.

Each of the cycles of the gate clocks GCK1 and GCK2 is two pause line periods during the pause period, and the gate start pulse GSP goes to a high level only for one pause line period at predetermined timing in the pause period. Therefore, each of the output signals Y1 from the unit circuits 41 of the first to nth stages goes to a high level during an ith pause line period, and goes to a low level during other periods in the pause period. When the scanning line Gi is selected in the pause period as described above, during the ith pause line period, the enable signal EN1 goes to a high level when i is an odd number and the enable signal EN2 goes to a high level when i is an even number. The enable signals EN1 and EN2 go to a low level during other periods in the pause period (FIG. 12 shows the case of i being an even number). Hence, in the unit circuit 41 of an ith stage, the clock signal CK and the enable signal EN change in the same manner, and the output signal Y2 changes in the same manner as the output signal Y1. In the unit circuits 41 of the first to nth stages (excluding the ith stage), since the enable signal EN is at a low level, the output signal Y2 is at a low level. Therefore, in the pause period, the voltage of the scanning line Gi goes to a high level only during the ith pause line period, and the voltages of the scanning lines G1 to Gn (excluding Gi) are maintained at a low level.

The operation of a pixel circuit 18 of an ith row and a jth column for when the scanning line Gi and the data line Sj are driven at the timing shown in FIG. 12 will be described below. A characteristic of the transistor Q1 is hereinafter referred to as "TFT characteristic" and a characteristic of the organic EL element L1 is hereinafter referred to as "OLED characteristic". During an ith line period, the voltage of the scanning line Gi is at a high level and thus the transistors Q2 and Q3 go into an on state. At this time, the source driver 14 applies a data voltage Dij to the data line Sj. Therefore, the gate voltage of the transistor Q1 becomes Dij.

At the end of the ith line period, the voltage of the selected scanning line Gi changes to a low level. Accordingly, the transistors Q2 and Q3 go into an off state. After this, the gate voltage of the transistor Q1 is maintained at Dij by the action of the capacitor C1. When the data voltage Dij is greater than or equal to a predetermined level, the transistor Q1 goes into an on state, and an amount of current depending on the voltage between the gate and source of the transistor Q1 flows through the organic EL element L1. The organic EL element L1 emits light at a luminance depending on the amount of current flowing therethrough.

In an ith pause line period (current measurement period), the voltage of the selected scanning line Gi goes to a high level. Accordingly, the transistors Q2 and Q3 go into an on state. During the first half part of the ith pause line period, the source driver 14 applies a measurement voltage Vmg(i,j) to the data line Sj. Therefore, the gate voltage of the transistor Q1 becomes Vmg(i,j). The measurement voltage Vmg(i,j) is either a TFT characteristic measurement voltage or an OLED characteristic measurement voltage. Note that the value of the measurement voltage Vmg(i,j) is set such that a current flows through only either one of the transistor Q1 and the organic EL element L1 in the current measurement period. The measurement voltage Vmg(i,j) applied when the OLED characteristic is measured is an arbitrary voltage that does not bring the transistor Q1 into an on state. In addition, when the source driver 14 applies the OLED characteristic measurement voltage to the data line Sj, it further applies a voltage Vm(i,j) for allowing a current to flow through the organic EL element L1, to the monitoring line Mj. When the TFT characteristic measurement voltage is applied, the transistor Q1 goes into an on state, and a current that passes through the transistors Q1 and Q3 from an electrode having a high-level power supply voltage ELVDD flows through the monitoring line Mj. When the OLED characteristic measurement voltage is applied, the transistor Q1 goes into an off state, and a current that passes through the transistor Q3 and the organic EL element L1 from the monitoring line Mj flows through an electrode having a low-level power supply voltage ELVSS. The source driver 14 measures the current flowing through the monitoring line Mj, in the first half part of the ith pause line period.

During the second half part of the ith pause line period, the source driver 14 applies a data voltage Dij to the data line Sj. At this time, the pixel circuit 18 operates in the same manner as for the ith line period. At the end of the ith pause line period, the voltage of the scanning line Gi changes to a low level. After this, the organic EL element L1 emits light at a luminance depending on the data voltage Dij.

<1.3 Correction Computation and Update to Correction Data>

Figure 13:
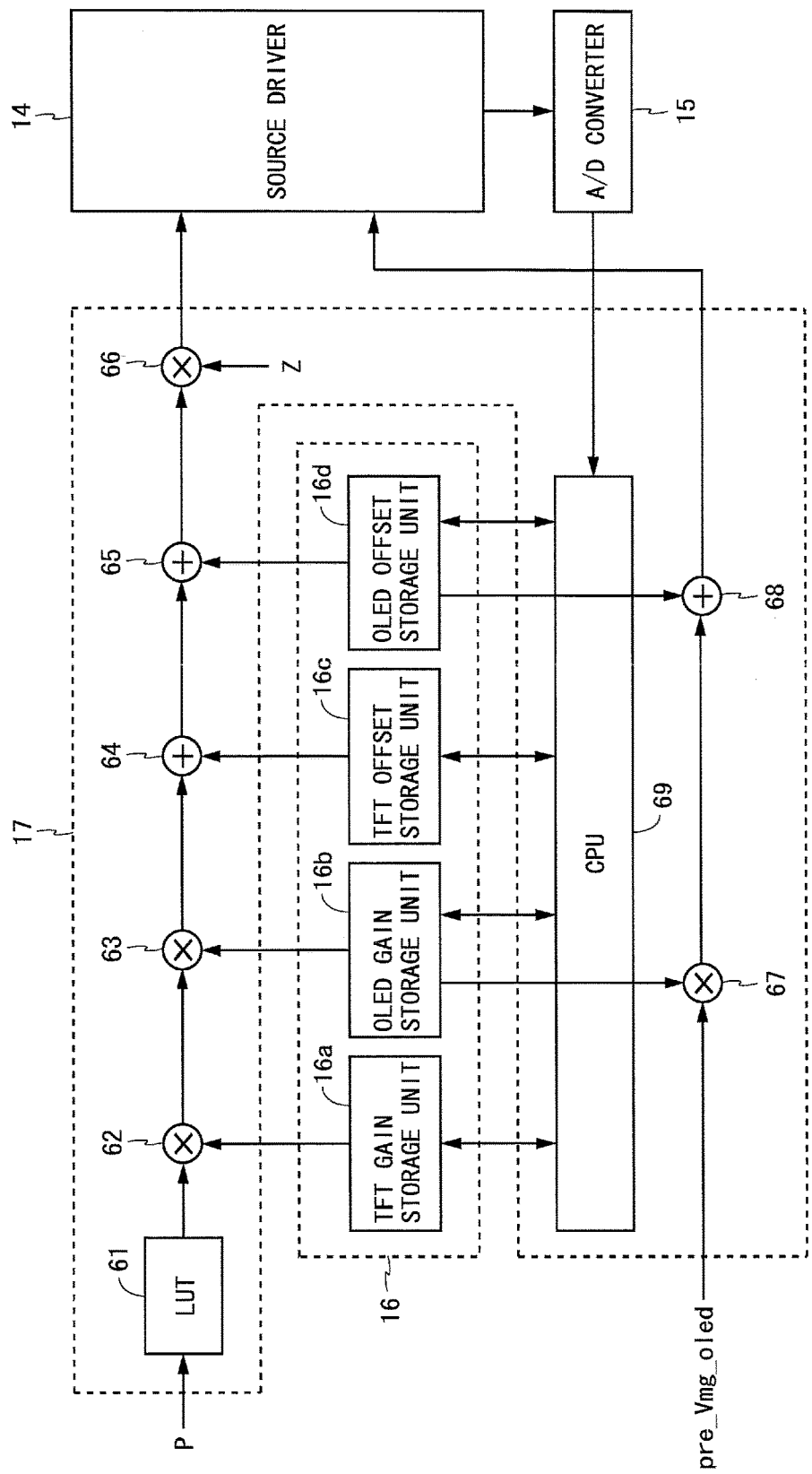
FIG. 13 is a block diagram showing details of a correction data storage unit and a correction computing unit of the display device shown in FIG. 1.

FIG. 13 is a block diagram showing details of the correction data storage unit 16 and the correction computing unit 17. As shown in FIG. 13, the correction data storage unit 16 includes a TFT gain storage unit 16a, an OLED gain storage unit 16b, a TFT offset storage unit 16c, and an OLED offset storage unit 16d. Each of the four storage units 16a to 16d stores (m×n) pieces of correction data for the (m×n) pixel circuits 18. The TFT gain storage unit 16a stores gains obtained based on the results of detection of TFT characteristics (hereinafter, referred to as TFT gains). The OLED gain storage unit 16b stores gains obtained based on the results of detection of OLED characteristics (hereinafter, referred to as OLED gains). The TFT offset storage unit 16c stores offsets obtained based on the results of detection of TFT characteristics (hereinafter, referred to as TFT offsets). The OLED offset storage unit 16d stores offsets obtained based on the results of detection of OLED characteristics (hereinafter, referred to as OLED offsets).

The correction computing unit 17 includes a LUT 61, multipliers 62, 63, 66, and 67, adders 64, 65, and 68, and a CPU 69. To the correction computing unit 17 are inputted a tone value P included in a video signal X1, a tone value P for TFT characteristic detection, a value pre_Vmg_oled for OLED characteristic detection, and an output from the A/D converter 15. Correction data for a pixel circuit 18 of an ith row and a jth column are read from the four storage units 16a to 16d.

The LUT 61 performs gamma correction on the tone value P. The multiplier 62 multiplies an output from the LUT 61 by the TFT gain read from the TFT gain storage unit 16a. The multiplier 63 multiplies an output from the multiplier 62 by the OLED gain read from the OLED gain storage unit 16b. The adder 64 adds the TFT offset read from the TFT offset storage unit 16c to an output from the multiplier 63. The adder 65 adds the OLED offset read from the OLED offset storage unit 16d to an output from the adder 64. The multiplier 66 multiplies an output from the adder 65 by a factor Z for compensating for attenuation of a data voltage. In a video signal period, the correction computing unit 17 outputs a video signal X2 including an output from the multiplier 66, to the source driver 14. In a current measurement period during which a TFT characteristic is detected, the correction computing unit 17 outputs the output from the multiplier 66 to the source driver 14, as data corresponding to a measurement voltage Vmg(i,j).

The multiplier 67 multiplies the value pre_Vmg_oled by the OLED gain read from the OLED gain storage unit 16b.

The adder 68 adds the OLED offset read from the OLED offset storage unit 16*d*, to an output from the multiplier 67. In a current measurement period during which an OLED characteristic is detected, the correction computing unit 17 outputs an output from the adder 68 to the source driver 14, as data corresponding to a voltage (a voltage for allowing a current to flow through the organic EL element L1) Vm(i,j).

Figure 14:
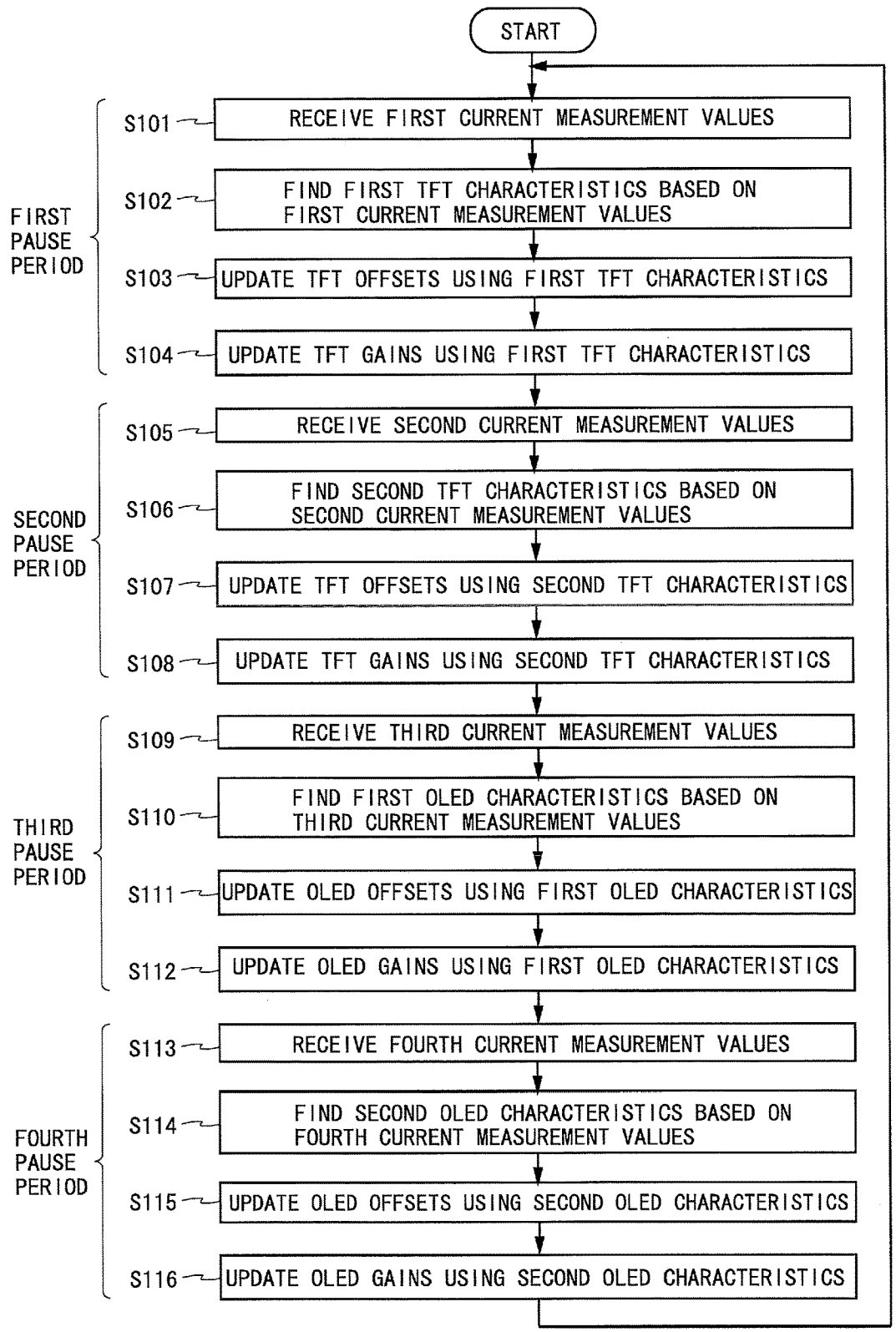
FIG. 14 is a flowchart showing the operation of a CPU of the display device shown in FIG. 1.

The CPU 69 updates the correction data stored in the four storage units 16*a* to 16*d*, based on the output from the A/D converter 15. FIG. 14 is a flowchart showing the operation of the CPU 69. The CPU 69 performs steps S101 to S116 shown in FIG. 14 every four pause periods. The CPU 69 performs steps S101 to S104 in a first pause period, performs steps S105 to S108 in a second pause period, performs steps S109 to S112 in a third pause period, and performs steps S113 to S116 in a fourth pause period.

During the first half part of a current measurement period in the first pause period, the source driver 14 applies first measurement voltages Vmg(i,j) for measuring a TFT characteristic to the data lines S1 to Sm, and measures currents that are outputted at this time to the monitoring lines M1 to Mm from pixel circuits 18. The CPU 69 receives first current measured values obtained at this time, from the A/D converter 15 (step S101). Then, the CPU 69 finds first TFT characteristics, based on the first current measured values received at step S101 (step S102). Then, using the first TFT characteristics, the CPU 69 updates corresponding TFT offsets stored in the TFT offset storage unit 16*c* (step S103) and updates corresponding TFT gains stored in the TFT gain storage unit 16*a* (step S104).

During the first half part of a current measurement period in the second pause period, the source driver 14 applies second measurement voltages Vmg(i,j) for measuring a TFT characteristic to the data lines S1 to Sm, and measures currents that are outputted at this time to the monitoring lines M1 to Mm from the pixel circuits 18. The CPU 69 receives second current measured values obtained at this time, from the A/D converter 15 (step S105). Then, the CPU 69 finds second TFT characteristics, based on the second current measured values received at step S105 (step S106). Then, using the second TFT characteristics, the CPU 69 updates corresponding TFT offsets stored in the TFT offset storage unit 16*c* (step S107) and updates corresponding TFT gains stored in the TFT gain storage unit 16*a* (step S108). Note that the first measurement voltages differ from the second measurement voltages. For example, the first measurement voltages are data voltages corresponding to a relatively low tone value, and the second measurement voltages are data voltages corresponding to a relatively high tone value.

During the first half part of a current measurement period in the third pause period, the source driver 14 applies third measurement voltages Vm(i,j) for measuring an OLED characteristic to the monitoring lines M1 to Mm while applying voltages that do not bring the transistors Q1 into an on state to the data line S1 to Sm, and measures currents that are outputted at this time to the monitoring lines M1 to Mm from the pixel circuits 18. The CPU 69 receives third current measured values obtained at this time, from the A/D converter 15 (step S109). Then, the CPU 69 finds first OLED characteristics, based on the third current measured values received at step S109 (step S110). Then, using the first OLED characteristics, the CPU 69 updates corresponding OLED offsets stored in the OLED offset storage unit 16*d* (step S111) and updates corresponding OLED gains stored in the OLED gain storage unit 16*b* (step S112).

During the first half part of a current measurement period in the fourth pause period, the source driver 14 applies fourth measurement voltages Vm(i,j) for measuring an OLED characteristic to the monitoring lines M1 to Mm while applying voltages that do not bring the transistors Q1 into an on state to the data line S1 to Sm, and measures currents that are outputted at this time to the monitoring lines M1 to Mm from the pixel circuits 18. The CPU 69 receives fourth current values obtained at this time, from the A/D converter 15 (step S113). Then, the CPU 69 finds second OLED characteristics, based on the fourth current measured values received at step S113 (step S114). Then, using the second OLED characteristics, the CPU 69 updates corresponding OLED offsets stored in the OLED offset storage unit 16*d* (step S115) and updates corresponding OLED gains stored in the OLED gain storage unit 16*b* (step S116). Note that the third measurement voltages differ from the fourth measurement voltages.

The display control circuit 12 changes a pause line period during which high-level enable signals EN1 and EN2 are outputted in a pause period, every four pause periods. Therefore, a scanning line to be selected in a pause period is changed every four pause periods. The source driver 14 measures, in first to fourth pause periods, currents outputted from pixel circuits 18 to which first to fourth measurement voltages are written. The correction computing unit 17 updates corresponding correction data stored in the correction data storage unit 16 in the first to fourth pause periods, based on first to fourth current measured values, respectively. By thus continuously selecting the same scanning line in the pause period, a current can be measured a plurality of times for the same pixel circuit 18 with changed conditions, and correction data can be updated based on the results of the plurality of current measurements.

<1.4 Effects, Etc.>

As described above, the display device 1 according to the present embodiment includes: the display unit 11 including the n scanning lines G1 to Gn, the m data lines S1 to Sm, the m monitoring lines M1 to Mm, and the (m×n) pixel circuits 18 arranged two-dimensionally; the display control circuit 12; the scanning line drive circuit 13; and the source driver 14. In a drive period, the scanning line drive circuit 13 selects the scanning lines G1 to Gn in turn every line period, and applies a scanning signal of a high-level (selection level) to the selected scanning line. During a current measurement period set in a pause period, the scanning line drive circuit 13 applies a scanning signal of a high-level (for current measurement and for writing a voltage) to a scanning line Gi selected from among the scanning lines G1 to Gn. During a period other than the current measurement period in the pause period, the scanning line drive circuit 13 applies a scanning signal of a low-level (non-selection level) to the scanning lines G1 to Gn. In the drive period, the source driver 14 applies data voltages corresponding to video signal X2 to the data lines S1 to Sm every line period. In the current measurement period, the source driver 14 applies measurement voltages to the data lines S1 to Sm, measures currents outputted to the monitoring lines M1 to Mm from pixel circuits 18, and applies data voltages to the data lines S1 to Sm.

Therefore, according to the display device 1 according to the present embodiment, when pause driving is performed using a drive period and a pause period, a current measurement period is set in the pause period, and currents outputted from pixel circuits 18 to which measurement voltages have been written can be measured in the current measurement period. In addition, by writing data voltages to the pixel circuits 18 in the current measurement period, an influence exerted on a display image by the current measurement is suppressed, enabling to prevent a reduction in the image quality of the display image. In addition, by fixing the voltages of the scanning lines G1 to Gn during a period other than the current measurement period in the pause period, the power consumption of the display device 1 can be reduced.

The display control circuit 12 outputs two enable signals EN1 and EN2 which alternately go to a high level every line period during the drive period, and one of which goes to a high level during the current measurement period in the pause period. The scanning line drive circuit 13 includes a shift register that has the plurality of unit circuits 41 (a plurality of stages) corresponding to the scanning lines G1 to Gn and that outputs, based on the enable signals EN1 and EN2, scanning signals to be applied to the scanning lines G1 to Gn. By generating a scanning signal for the drive period and a scanning signal for the pause period using the same shift register, based on the enable signals EN1 and EN2 that change in different manners for the drive period and the pause period, the configuration of the scanning line drive circuit 13 can be simplified.

Each unit circuit 41 (each stage of the shift register) includes the node control circuit (the transistors Q11 and Q12), the first output control circuit (the transistors Q13 and Q14 and the capacitor C11), and the second output control circuit (the transistors Q15 to Q17 and the capacitor C12). A scanning signal based on the enable signal EN1 or EN2 can be outputted separately from an output signal to a unit circuit 41 of the subsequent stage by thus using the two output control circuits.

The first output control circuit can be configured using the transistor Q13 (first output control transistor) having a drain terminal (first conductive terminal) connected to the clock terminal CK, a source terminal (second conductive terminal) connected to the set terminal S of the subsequent stage and the reset terminal R of the previous stage, and a gate terminal (control terminal) connected to the node N1; the transistor Q11 having a drain terminal connected to the set terminal S of the subsequent stage and the reset terminal R of the previous stage, a source terminal to which a low-level voltage VSS is provided, and a gate terminal connected to the clock terminal CKB; and the capacitor C11 provided between the gate and source terminals of the transistor Q13. The second output control circuit can be configured using the transistor Q16 (second output control transistor) having a drain terminal to which the enable signal EN1 or EN2 is provided, a source terminal connected to the scanning line Gi, and a gate terminal connected to the node N2 (second node) having a voltage of the same logic level as the node N1; the transistor Q17 having a drain terminal connected to the scanning line Gi, a source terminal to which a low-level voltage VSS is provided, and a gate terminal connected to the clock terminal CKB; the transistor Q15 having a conductive terminal (one conductive terminal) connected to the source terminal of the transistor Q11, a conductive terminal (other conductive terminal) connected to the gate terminal of the transistor Q16, and a gate terminal to which a high-level voltage VDD is provided; and the capacitor C12 provided between the gate and source terminals of the transistor Q16.

Each pixel circuit 18 includes the organic EL element L1 (electro-optical element); the transistor Q1 (drive transistor) provided in series with the organic EL element L1; the transistor Q2 (write control transistor) provided between the data line Sj and the gate terminal of the transistor Q1, and having a gate terminal connected to the scanning line Gi; the transistor Q3 (read control transistor) provided between the monitoring line Mj and the source terminal (one conductive terminal) of the transistor Q1, and having a gate terminal connected to the scanning line Gi; and the capacitor C1 provided between the gate and source terminals of the transistor Q1. Therefore, the display device including: the pixel circuits, each including an electro-optical element, three transistors, and a capacitor; and the monitoring lines can measure currents in the pixel circuits while preventing a reduction in the image quality of a display image using simple circuits.

The display control circuit 12 outputs the enable signal EN1 for the unit circuits 41 of the odd-numbered stages (the odd-numbered stages of the shift register) and the enable signal EN2 for the unit circuits 41 of the even-numbered stages (the even-numbered stages of the shift register). By thus supplying different enable signals to the odd-numbered stages of the shift register and even-numbered stages thereof, voltages of adjacent scanning lines can be prevented from going to a high level in the same time slot.

In addition, an oxide semiconductor containing indium, gallium, zinc, and oxygen has higher mobility than amorphous silicon. Hence, by forming the transistors Q11 to Q17 included in the scanning line drive circuit 13 using the oxide semiconductor, the transistor size is reduced, enabling to reduce the layout area of the scanning line drive circuit 13. Therefore, when the pixel circuits 18 are integrally formed with the scanning line drive circuit 13 (also called a gate driver monolithic configuration), the area of a picture-frame formed around a pixel region can be reduced. In addition, a transistor formed using the oxide semiconductor has a feature that off-leakage current is small. Therefore, when the gate monolithic configuration is adopted, it is possible to implement a pixel circuit whose voltage held therein is less likely to fluctuate and which is suitable for pause driving, and a scanning line drive circuit that is less likely to malfunction even when a period where operation is paused is long.

The shift register included in the scanning line drive circuit 13 performs, in the drive period, shift operation every line period and performs, in the pause period, shift operation every pause line period which is longer than the line period. By thus making the current measurement period longer than the line period, writing of a measurement voltage, measurement of a current, and writing of a data voltage can be performed taking necessary time in the current measurement period. In addition, the display device 1 further includes the correction computing unit 17 that corrects video signals X1 based on currents measured by the source driver 14. Therefore, by correcting the video signals X1 based on the current measurement results, a reduction in the luminances of the pixels is compensated for, enabling to improve the image quality of a display image.

2. Second Embodiment

<2.1 Configuration>

Figure 15:
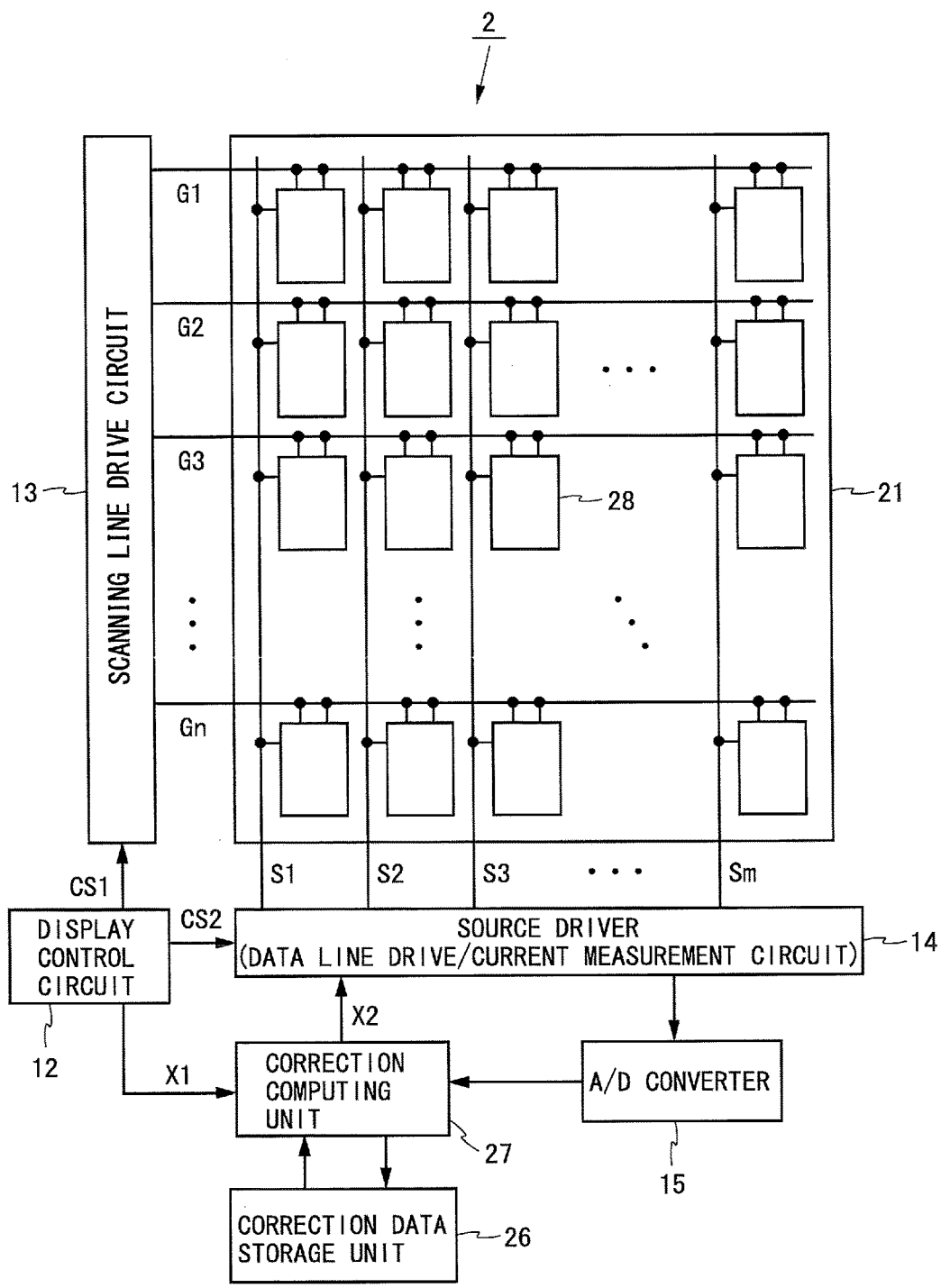
FIG. 15 is a block diagram showing a configuration of a display device according to a second embodiment of the present invention.

FIG. 15 is a block diagram showing a configuration of a display device according to a second embodiment of the present invention. A display device 2 shown in FIG. 15 is such that the display unit 11, the correction data storage unit 16, and the correction computing unit 17 of the display device 1 according to the first embodiment are replaced by a display unit 21, a correction data storage unit 26, and a correction computing unit 27, respectively. The display device 2 has a feature that one line serves as a data line and as a monitoring line. Of the components of the present embodiment, the same components as those of the first embodiment are denoted by the same reference characters and description thereof is omitted.

The display unit 21 includes n scanning lines G1 to Gn, m data lines S1 to Sm, and (m×n) pixel circuits 28. The scanning lines G1 to Gn are arranged parallel to each other. The data lines S1 to Sm are arranged parallel to each other and orthogonal to the scanning lines G1 to Gn. The (m×n) pixel circuits 28 are arranged two-dimensionally at the respective intersections of the scanning lines G1 to Gn and the data lines S1 to Sm. To the pixel circuits 28 is supplied a reference voltage Vref using a wiring line which is not shown, in addition to a high-level power supply voltage ELVDD and a low-level power supply voltage ELVSS.

Figure 16:
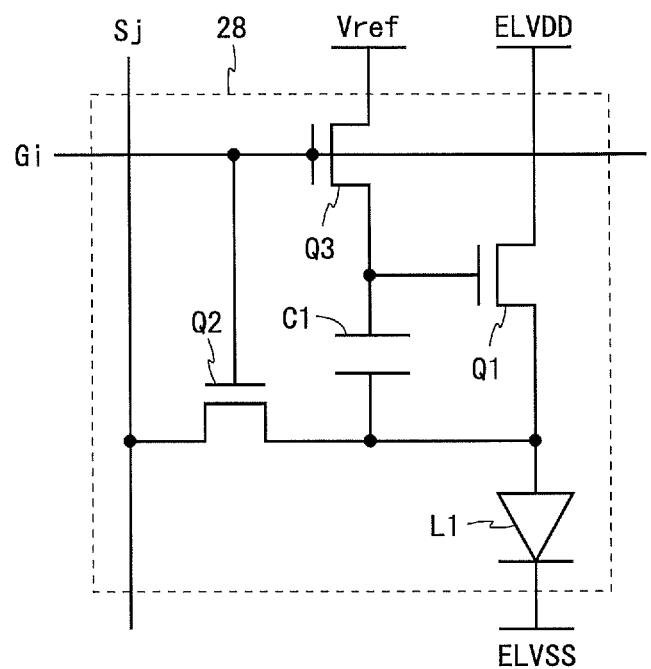
FIG. 16 is a circuit diagram of a pixel circuit of the display device shown in FIG. 15.

FIG. 16 is a circuit diagram of a pixel circuit 28 of an ith row and a jth column. As shown in FIG. 16, the pixel circuit 28 includes an organic EL element L1, transistors Q1 to Q3, and a capacitor C1, and is connected to a scanning line Gi and a data line Sj. The transistor Q1 and the organic EL element L1 are connected in the same manner as the pixel circuit 18. One conductive terminal (a left-side terminal in FIG. 16) of the transistor Q2 is connected to the data line Sj, and the other conductive terminal of the transistor Q2 is connected to a source terminal of the transistor Q1 and an anode terminal of the organic EL element L1. A drain terminal of the transistor Q3 is connected to a wiring line having a reference voltage Vref, and a source terminal of the transistor Q3 is connected to a gate terminal of the transistor Q1. The gate terminals of the transistors Q2 and Q3 are connected to the scanning line Gi. The capacitor C1 is provided between the gate and source terminals of the transistor Q1. The transistor Q1 functions as a drive transistor, the transistor Q2 functions as a write control transistor, and the transistor Q3 functions as a reference voltage application transistor.

<2.2 Drive Method>

Figure 17:
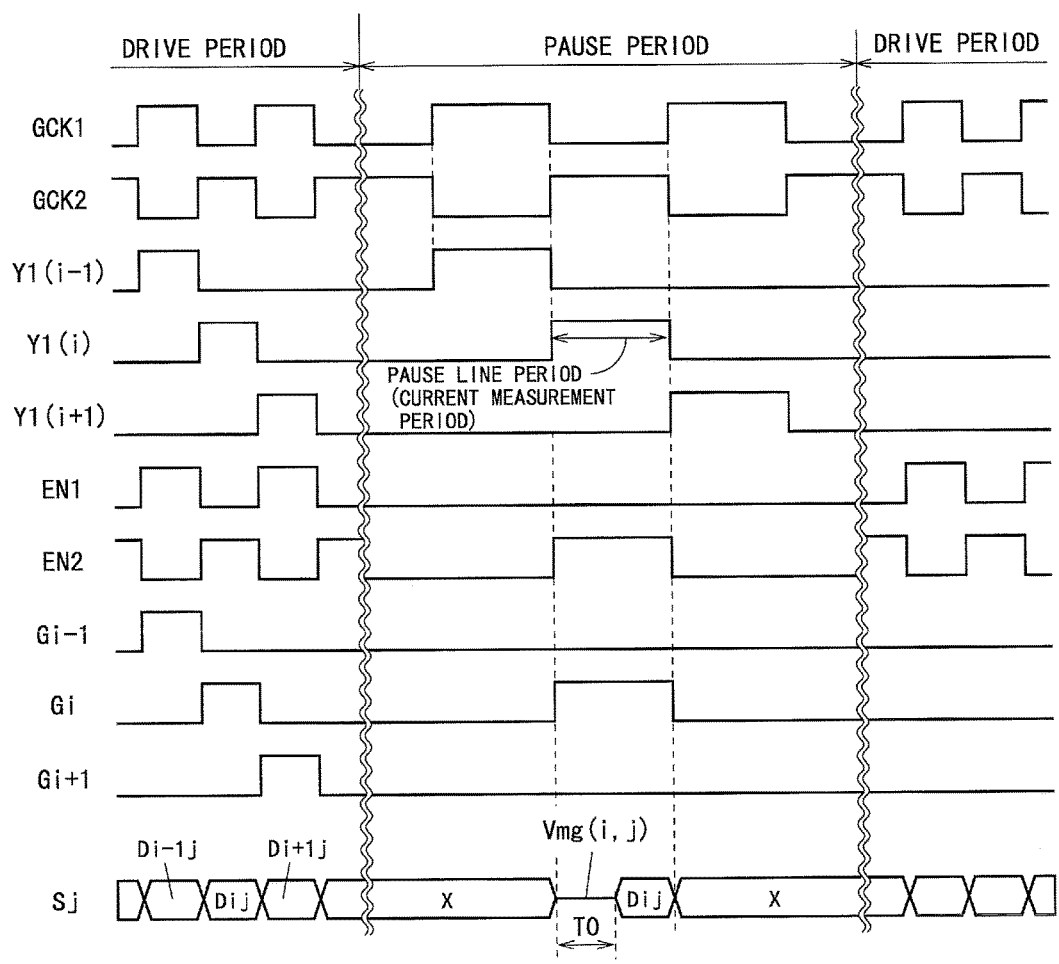
FIG. 17 is a detailed timing chart for the display device shown in FIG. 15.

As with the display device 1, the display device 2 operates according to the timing charts shown in FIGS. 9 and 11. FIG. 17 is a detailed timing chart for the display device 2. The timing chart shown in FIG. 17 is such that a change in the voltage of the monitoring line Mj is removed from the timing chart shown in FIG. 12. As with the display device 1, the display device 2 can also drive the scanning lines G1 to Gn according to timing shown in FIG. 17, using the scanning line drive circuit 13 shown in FIGS. 3 and 4. In the display device 2, a display control circuit 12 changes a pause line period during which high-level enable signals EN1 and EN2 are outputted, every two pause periods. Therefore, a scanning line to be selected in a pause period is changed every two pause periods.

The operation of the pixel circuit 28 of the ith row and the jth column for when the scanning line Gi and the data line Sj are driven at the timing shown in FIG. 17 in a drive period will be described below. During an ith line period, the voltage of the scanning line Gi is at a high level and thus the transistors Q2 and Q3 go into an on state. At this time, the source driver 14 applies a data voltage Dij to the data line Sj. Therefore, the voltage between the gate and source of the transistor Q1 is (Vref−Dij).

At the end of the ith line period, the voltage of the selected scanning line Gi changes to a low level. Accordingly, the transistors Q2 and Q3 go into an off state. After this, the voltage between the gate and source of the transistor Q1 is maintained at (Vref−Dij) by the action of the capacitor C1. When the data voltage Dij is less than or equal to a predetermined level, the transistor Q1 goes into an on state, and an amount of current depending on the voltage between the gate and source of the transistor Q1 flows through the organic EL element L1. The organic EL element L1 emits light at a luminance determined depending on the amount of current flowing therethrough.

In an ith pause line period (current measurement period), the voltage of the selected scanning line Gi changes to a high level. Accordingly, the transistors Q2 and Q3 go into an on state. During the first half part of the ith pause line period, the source driver 14 applies a measurement voltage Vmg(i,j) to the data line Sj. Therefore, the voltage between the gate and source of the transistor Q1 becomes {Vref−Vmg(i,j)}. At this time, the transistor Q1 goes into an on state, and a current that passes through the transistors Q1 and Q2 from an electrode having a high-level power supply voltage ELVDD flows through the data line Sj. In a period T0 shown in FIG. 17, the current flows through the data line Sj. The source driver 14 measures a current outputted to the data line Sj in the first half part of the ith pause line period.

During the second half part of the ith pause line period, the source driver 14 applies a data voltage Dij to the data line Sj. At this time, the pixel circuit 28 operates in the same manner as for the ith line period. At the end of the ith pause line period, the voltage of the scanning line Gi changes to a low level. After this, the organic EL element L1 emits light at a luminance depending on the data voltage Dij.

<2.3 Correction Computation and Update to Correction Data>

Figure 18:
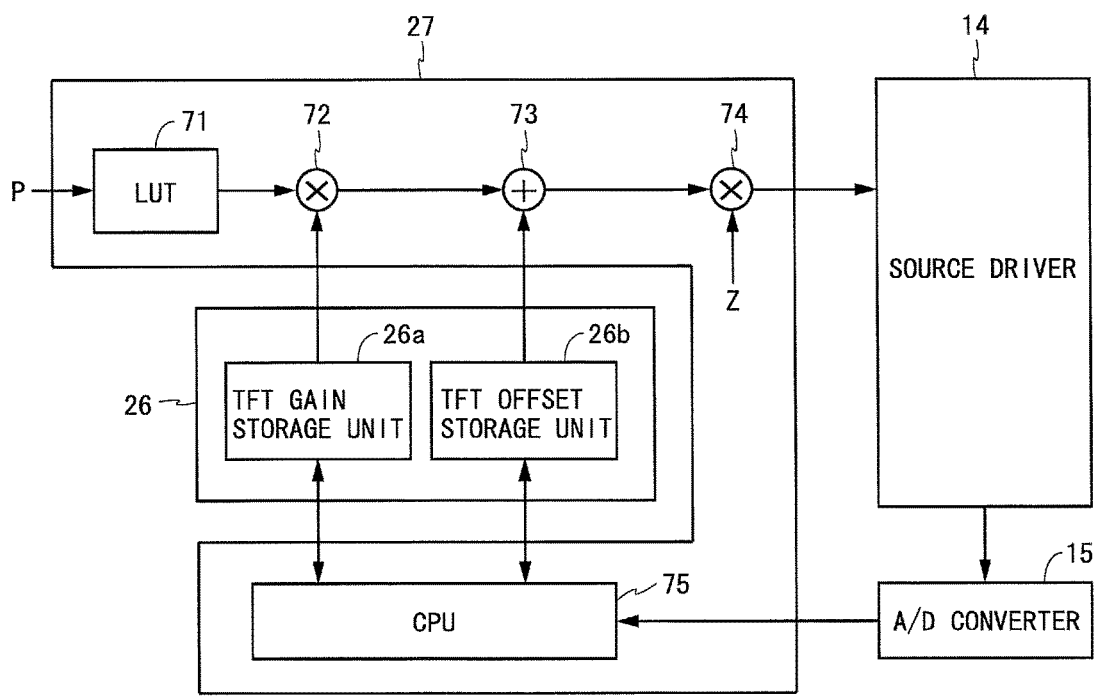
FIG. 18 is a block diagram showing details of a correction data storage unit and a correction computing unit of the display device shown in FIG. 15.

FIG. 18 is a block diagram showing details of the correction data storage unit 26 and the correction computing unit 27. As shown in FIG. 18, the correction data storage unit 26 includes a TFT gain storage unit 26a and a TFT offset storage unit 26b. Each of the two storage units 26a and 26b stores (m×n) pieces of correction data for the (m×n) pixel circuits 28. The TFT gain storage unit 26a stores TFT gains, and the TFT offset storage unit 26b stores TFT offsets.

The correction computing unit 27 includes a LUT 71, multipliers 72 and 74, an adder 73, and a CPU 75. To the correction computing unit 27 are inputted a tone value P included in a video signal X1, a tone value P for TFT characteristic detection, and an output from an A/D converter 15. Correction data for the pixel circuit 28 of the ith row and jth column are read from the two storage units 26a and 26b.

The LUT 71 performs gamma correction on the tone value P. The multiplier 72 multiplies an output from the LUT 71 by the TFT gain read from the TFT gain storage unit 26a. The adder 73 adds the TFT offset read from the TFT offset storage unit 26b, to an output from the multiplier 72. The multiplier 74 multiplies an output from the adder 73 by a factor Z for compensating for attenuation of a data voltage. In a video signal period, the correction computing unit 27 outputs a video signal X2 including an output from the multiplier 74, to the source driver 14. In a current measurement period, the correction computing unit 27 outputs the output from the multiplier 74 to the source driver 14, as data corresponding to a measurement voltage Vmg(i,j).

Figure 19:
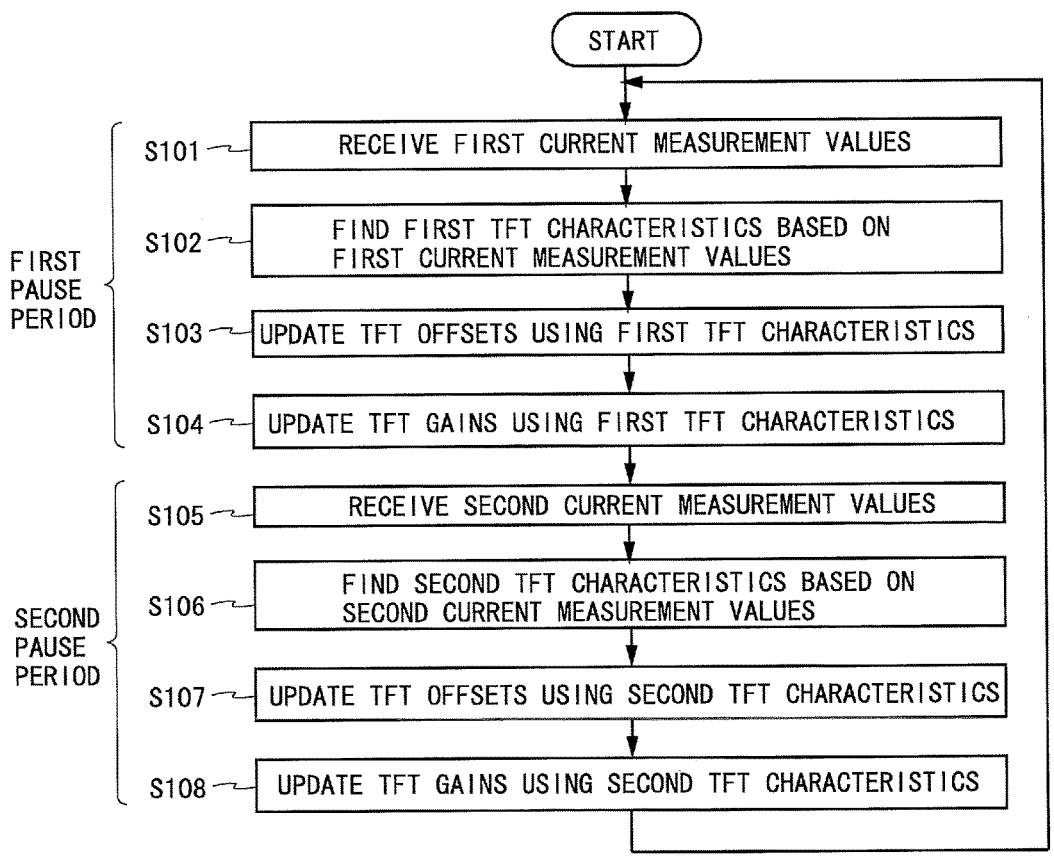
FIG. 19 is a flowchart showing the operation of a CPU of the display device shown in FIG. 15.

The CPU 75 updates the correction data stored in the two storage units 26a and 26b, based on the output from the A/D converter 15. FIG. 19 is a flowchart showing the operation of the CPU 75. The CPU 75 performs steps S101 to S108 shown in FIG. 19 every two pause periods. The CPU 75 performs steps S101 to S104 in a first pause period, and performs steps S105 to S108 in a second pause period. Steps S101 to S108 are the same as those of the first embodiment except that TFT offsets stored in the TFT offset storage unit 26b are updated at steps S103 and S107, and TFT gains stored in the TFT gain storage unit 26a are updated at steps S104 and S108.

As described above, in the display device 2, a scanning line to be selected during a pause period is changed every two pause periods. The source driver 14 measures, in a first pause period and a second pause period, currents outputted from pixel circuits 28 to which first measurement voltages and second measurement voltages have been written, respectively. The correction computing unit 27 updates corresponding correction data stored in the correction data storage unit 26, in the first pause period and the second pause period, based on first current measurement values and second current measured values, respectively.

<2.4 Effects, Etc.>

As described above, the display device 2 according to the present embodiment includes: the display unit 21 including the n scanning lines G1 to Gn, the m data lines S1 to Sm, and the (m×n) pixel circuits 28 arranged two-dimensionally; the display control circuit 12; the scanning line drive circuit 13; and the source driver 14. During a current measurement period, the scanning line drive circuit 13 applies a scanning signal of a high-level (for current measurement and for writing a voltage) to a scanning line Gi selected from among the scanning lines G1 to Gn. In the current measurement period, the source driver 14 applies measurement voltages to the data lines S1 to Sm, measures currents outputted to the data lines S1 to Sm from pixel circuits 28, and applies data voltages to the data lines S1 to Sm.

Each pixel circuit 28 includes the organic EL element L1 (electro-optical element); the transistor Q1 (drive transistor) provided in series with the organic EL element L1; the transistor Q2 (write control transistor) provided between the data line Sj and the source terminal (one conductive terminal) of the transistor Q1, and having a gate terminal (control terminal) connected to the scanning line Gi; the transistor Q3 (reference voltage application transistor) provided between the gate of the transistor Q1 and a wiring line having a reference voltage Vref, and having a gate terminal connected to the scanning line Gi; and the capacitor C1 provided between the gate and source terminals of the transistor Q1. Therefore, the display device including the pixel circuits, each including an electro-optical element, three transistors, and a capacitor; and the wiring line having the reference voltage can measure currents in the pixel circuits while preventing a reduction in the image quality of a display image using simple circuits.

3. Third Embodiment

<3.1 Configuration>

Figure 20:
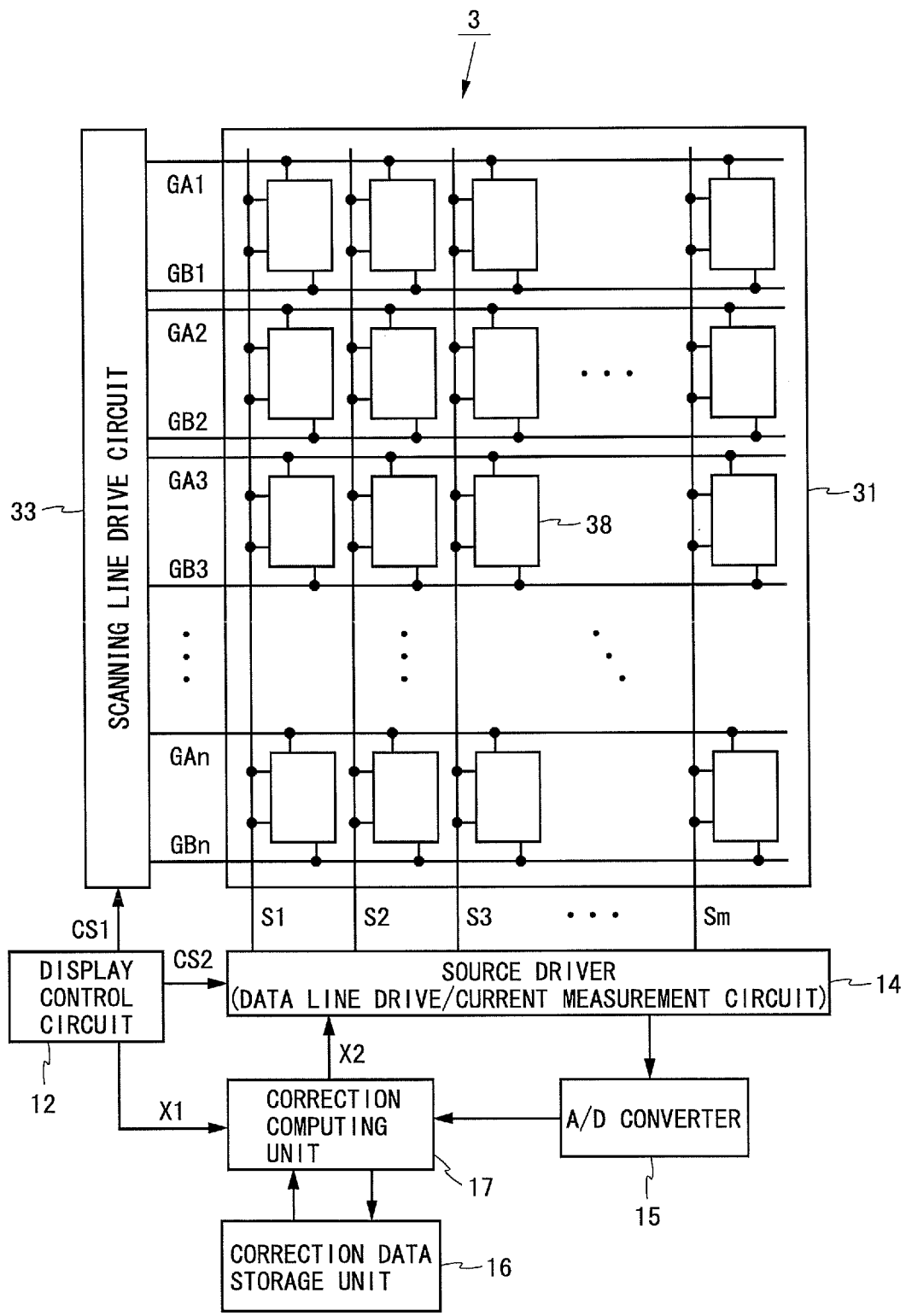
FIG. 20 is a block diagram showing a configuration of a display device according to a third embodiment of the present invention.

FIG. 20 is a block diagram showing a configuration of a display device according to a third embodiment of the present invention. A display device 3 shown in FIG. 20 is such that the display unit 11 and the scanning line drive circuit 13 of the display device 1 according to the first embodiment are replaced by a display unit 31 and a scanning line drive circuit 33, respectively. Of the components of the present embodiment, the same components as those of the first embodiment are denoted by the same reference characters and description thereof is omitted.

The display unit 31 includes 2n scanning lines GA1 to GAn and GB1 to GBn, m data lines S1 to Sm, and (m×n) pixel circuits 38. The scanning lines GA1 to GAn and GB1 to GBn are arranged parallel to each other. The data lines S1 to Sm are arranged parallel to each other and orthogonal to the scanning lines GA1 to GAn and GB1 to GBn. The (m×n) pixel circuits 38 are arranged two-dimensionally at the respective intersections of the scanning lines GA1 to GAn and the data lines S1 to Sm. Note that the scanning lines GA1 to GAn correspond to first scanning lines and the scanning lines GB1 to GBn correspond to second scanning lines. Note also that signals provided to the scanning lines GA1 to GAn correspond to first scanning signals and signals provided to the scanning lines GB1 to GBn correspond to second scanning signals.

Figure 21:
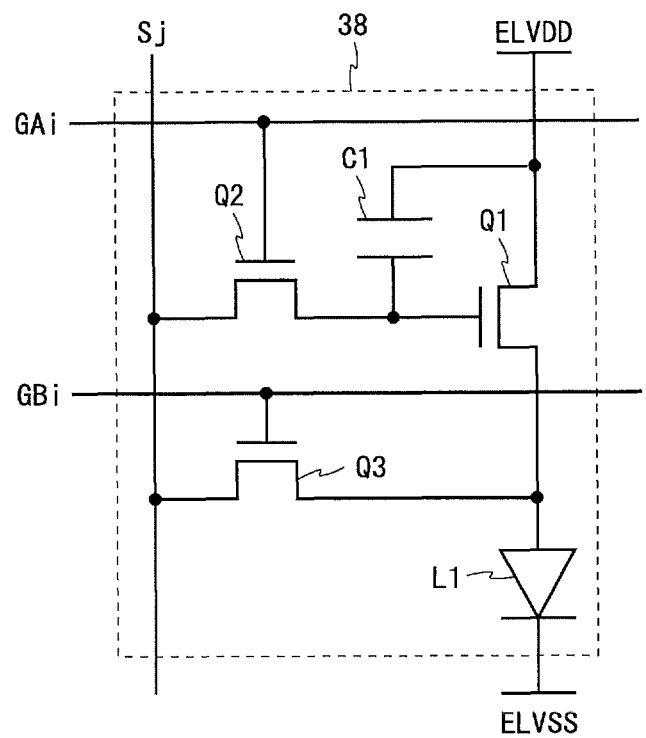
FIG. 21 is a circuit diagram of a pixel circuit of the display device shown in FIG. 20.

FIG. 21 is a circuit diagram of a pixel circuit 38 of an ith row and a jth column. As shown in FIG. 21, the pixel circuit 38 includes an organic EL element L1, transistors Q1 to Q3, and a capacitor C1, and is connected to scanning lines GAi and GBi and a data line Sj. The pixel circuit 38 has the same configuration as the pixel circuit 18 except for the following: one conductive terminal (a left-side terminal in FIG. 21) of the transistor Q3 is connected to the data line Sj; gate terminals of the transistors Q2 and Q3 are connected to the scanning lines GAi and GBi, respectively; and the capacitor C1 is provided between the gate and drain terminals of the transistor Q1.

Figure 22:
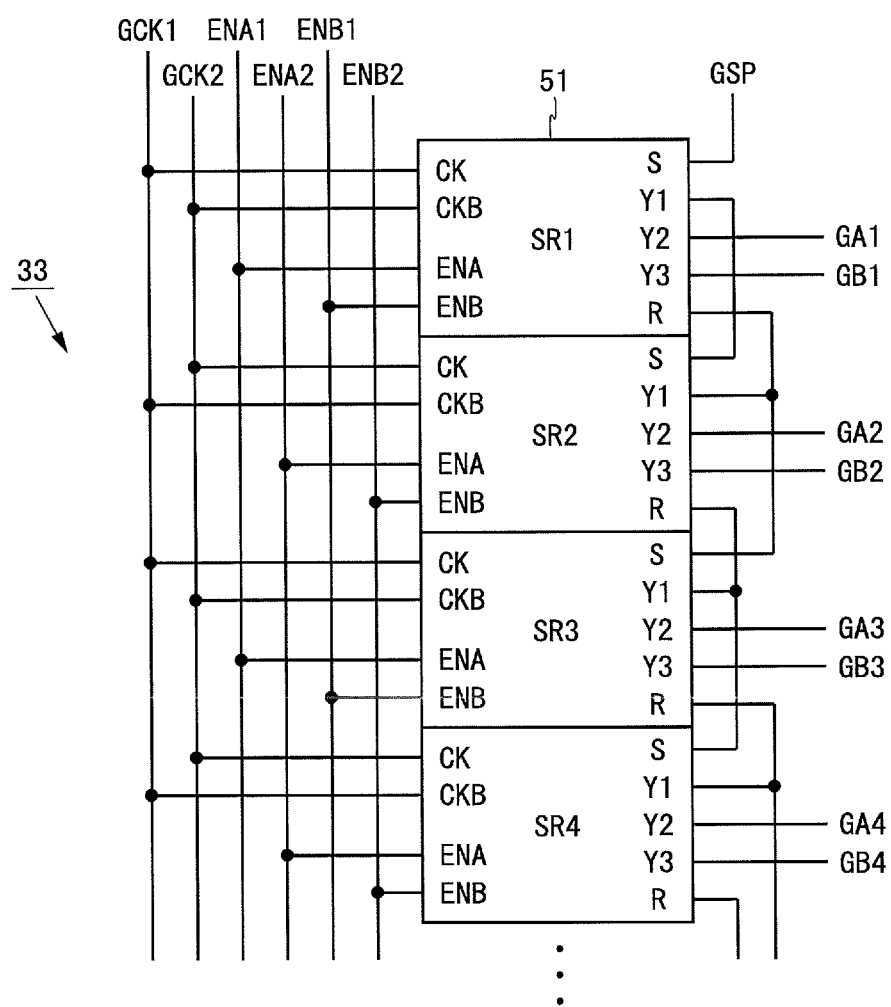
FIG. 22 is a block diagram of a scanning line drive circuit of the display device shown in FIG. 20.

FIG. 22 is a block diagram showing a configuration of the scanning line drive circuit 33. As shown in FIG. 22, the scanning line drive circuit 33 includes a shift register having n cascaded unit circuits 51. Each unit circuit 51 has clock terminals CK and CKB, enable terminals ENA and ENB, a set terminal S, a reset terminal R, and output terminals Y1 to Y3.

Control signals CS1 supplied to the scanning line drive circuit 33 include a gate start pulse GSP, gate clocks GCK1 and GCK2, and enable signals ENA1, ENA2, ENB1, and ENB2.

The connection configuration of the unit circuits 51 is the same as that of the unit circuits 41 according to the first embodiment, except for the following: the enable signals ENA1 and ENB1 are provided to the enable terminals ENA and ENB of unit circuits 51 of the odd-numbered stages, respectively; the enable signals ENA2 and ENB2 are provided to the enable terminals ENA and ENB of unit circuits 51 of the even-numbered stages, respectively; and the output terminals Y2 and Y3 of a unit circuit 51 of an ith stage are connected to scanning lines GAi and GBi, respectively.

Figure 23:
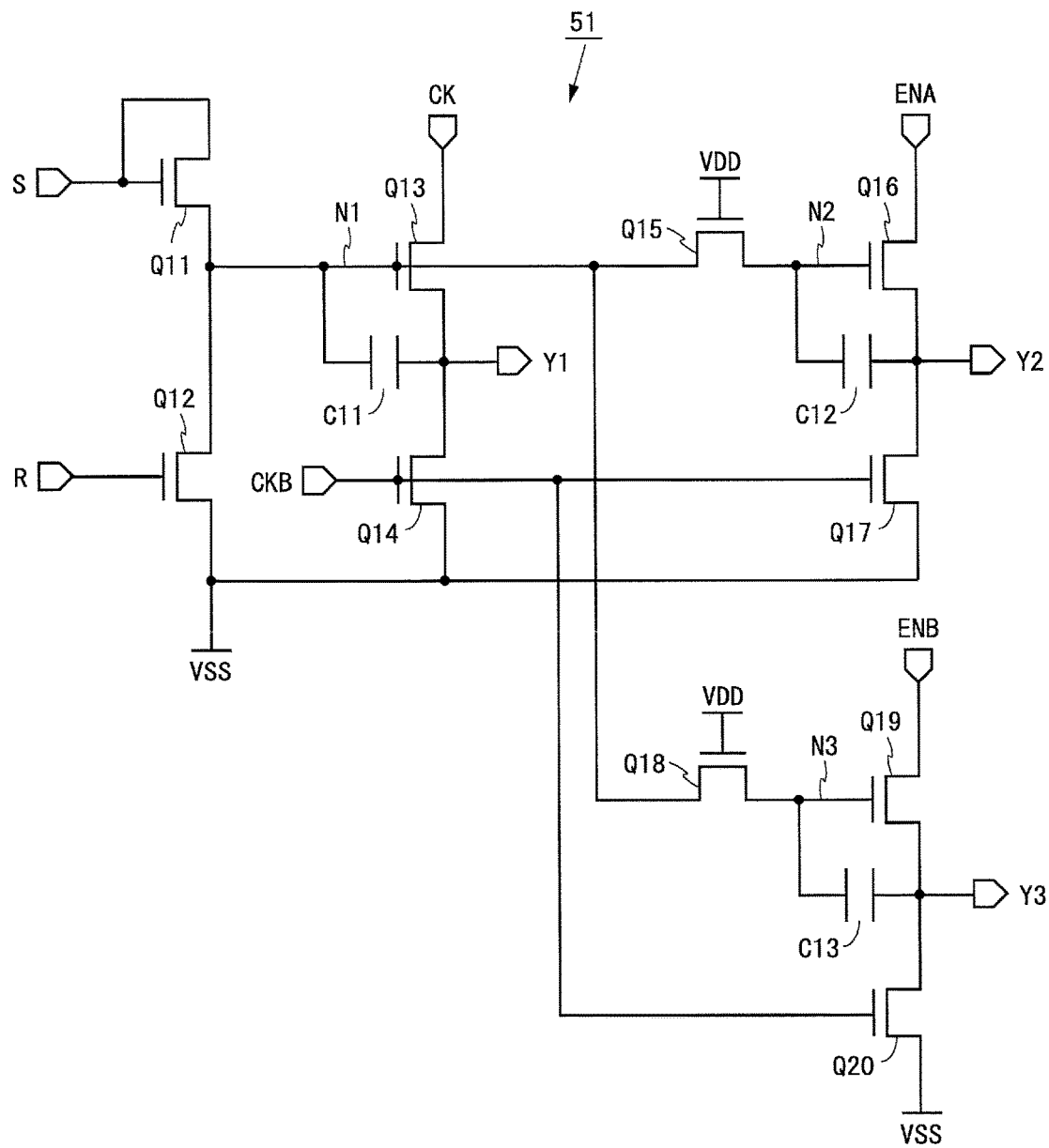
FIG. 23 is a circuit diagram of a unit circuit of the scanning line drive circuit shown in FIG. 22.

FIG. 23 is a circuit diagram of a unit circuit 51. As shown in FIG. 23, the unit circuit 51 is such that transistors Q18 to Q20 which are N-channel TFTs and a capacitor C13 are added to the unit circuit 41. Transistors Q11 to Q17 and capacitors C11 and C12 are connected in the same manner as the unit circuit 41. Note, however, that a drain terminal of the transistor Q16 is connected to an enable terminal ENA.

One conductive terminal (a left-side terminal in FIG. 23) of the transistor Q18 is connected to a node N1. The other conductive terminal of the transistor Q18 is connected to a gate terminal of the transistor Q19, and a high-level voltage VDD is applied to a gate terminal of the transistor Q18. A drain terminal of the transistor Q19 is connected to an enable terminal ENB, and a source terminal of the transistor Q19 is connected to a drain terminal of the transistor Q20 and an output terminal Y3. A gate terminal of the transistor Q20 is connected to a clock terminal CKB, and a low-level voltage VSS is applied to a source terminal of the transistor Q20. The capacitor C13 is provided between the gate and source terminals of the transistor Q19. A node to which the gate terminal of the transistor Q19 is connected is hereinafter referred to as node N3.

The transistors Q11 and Q12 function as a node control circuit, and the transistors Q13 and Q14 and the capacitor C11 function as a first output control circuit. The transistors Q15 to Q20 and the capacitors C12 and C13 function as a second output control circuit that applies to a scanning line GAi an enable signal ENA1 or ENA2 outputted from the display control circuit 12 and applies to a scanning line GBi an enable signal ENB1 or ENB2 outputted from the display control circuit 12, when the voltage of the node N1 is at a high level. Note that, in the present embodiment, a first boost capacitance is implemented by the capacitor C12 and a second boost capacitance is implemented by the capacitor C13.

In the unit circuit 51, as with the unit circuit 41, when the voltage of the node N1 is at a high level, a clock signal CK is outputted from the output terminal Y1 and an enable signal ENA is outputted from the output terminal Y2. In addition, the transistors Q18 to Q20 and the capacitor C13 are connected in the same manner as the transistors Q15 to Q17 and the capacitor C12. The node N3 has a voltage of the same logic level as the node N1. Therefore, when the voltages of the nodes N1 and N3 are at a high level, an enable signal ENB is outputted from the output terminal Y3.

Since the unit circuit 51 is configured in the above-described manner, the unit circuit 51 can drive both the scanning line GAi and the scanning line GBi based on one shift clock. Regarding this, the same also applies to a fourth embodiment and a fifth embodiment. Note that a first output node is implemented by the output terminal Y1, a second output node is implemented by the output terminal Y2, and a third output node is implemented by the output terminal Y3. In addition, a first scanning control transistor is implemented by the transistor Q16 and a second scanning control transistor is implemented by the transistor Q19. Furthermore, a first node control portion is implemented by the transistor Q11, an output signal control portion is implemented by the transistor Q12, a first scanning signal control portion is implemented by the transistor Q16 and the capacitor C12, a second scanning signal control portion is implemented by the transistor Q19 and the capacitor C13, an output signal resetting portion is implemented by the transistor Q14, a first scanning signal resetting portion is implemented by the transistor Q17, and a second scanning signal resetting portion is implemented by the transistor Q20.

<3.2 Drive Method>

Figure 24:
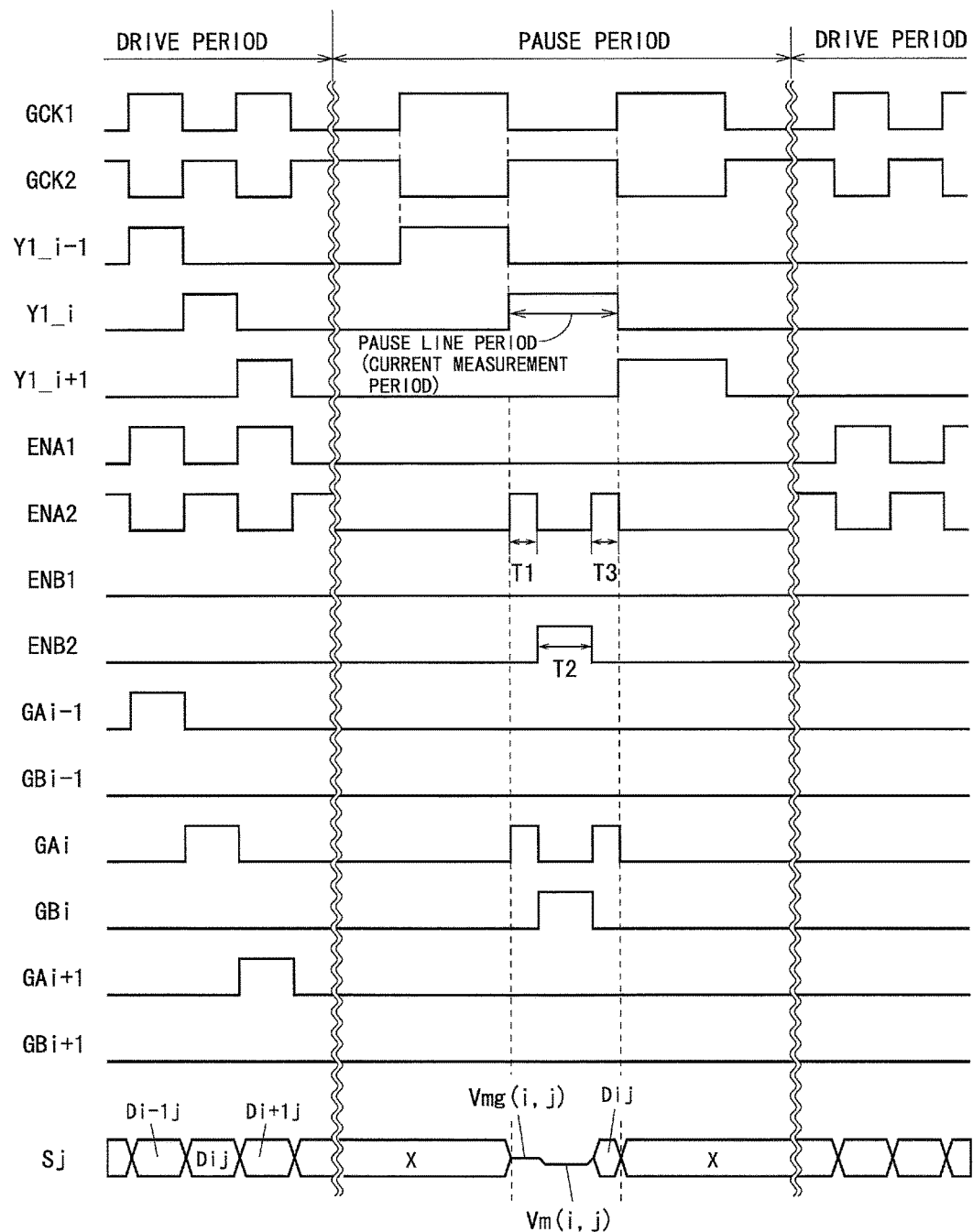
FIG. 24 is a detailed timing chart for the display device shown in FIG. 20.

As with the display device 1, the display device 3 operates according to the timing charts shown in FIGS. 9 and 11. FIG. 24 is a detailed timing chart for the display device 3. FIG. 24 shows timing for when an even-numbered scanning line Gi (i is an even number) is selected in a pause period. The gate start pulse GSP and the gate clocks GCK1 and GCK2 change in the same manner as in the first embodiment. Note that a row corresponding to the scanning line Gi corresponds to a measurement target row.

During the drive period, the enable signals ENA1 and ENA2 change in the same manner as the gate clocks GCK1 and GCK2, respectively, and the enable signals ENB1 and ENB2 are maintained at a low level. Therefore, in the drive period, the voltages of the scanning lines GA1 to GAn go to a high level only in the first to nth pause line periods, respectively, and the voltages of the scanning lines GB1 to GBn are maintained at a low level.

Figure 25:
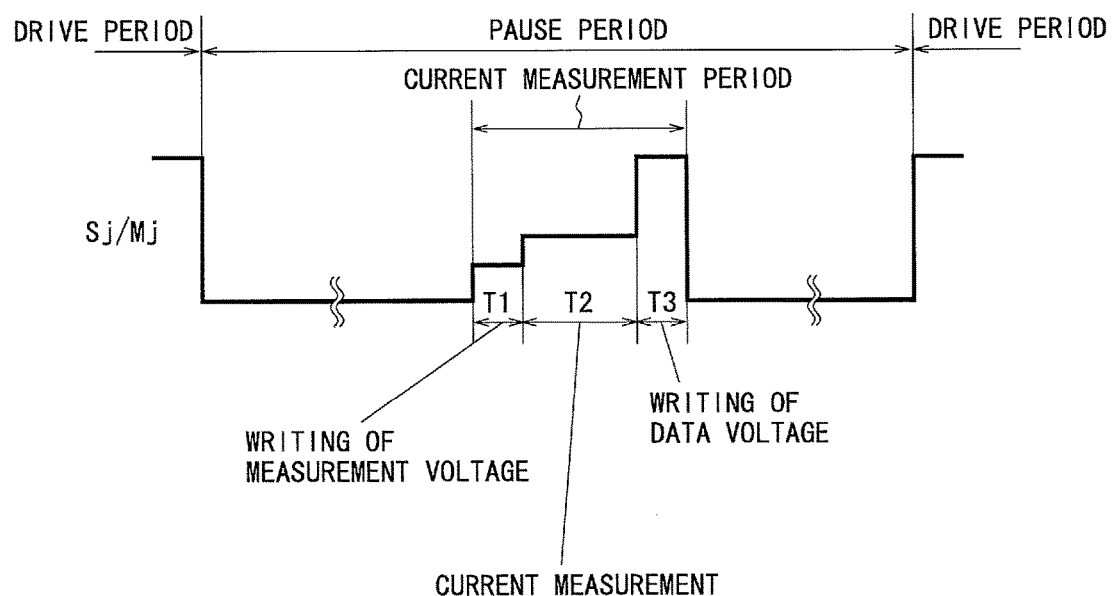
FIG. 25 is a schematic diagram showing changes in the voltage of a data line during a pause period of the display device shown in FIG. 20.

In an ith pause line period (current measurement period), as shown in FIG. 24, periods T1 to T3 are set. Note that, as shown in FIG. 25, the period T1 is a period for writing a measurement voltage, the period T2 is a period for performing current measurement, and the period T3 is a period for writing a data voltage. As for FIG. 24, when i is an odd number, the enable signal ENA1 goes to a high level during the periods T1 and T3, and the enable signal ENB1 goes to a high level during the period T2. When i is an even number, the enable signal ENA2 goes to a high level during the periods T1 and T3, and the enable signal ENB2 goes to a high level during the period T2. The enable signals ENA1, ENA2, ENB1, and ENB2 go to a low level during other periods in the pause period. When i is an odd number, in a unit circuit 51 of an ith stage, the output signals Y2 and Y3 change in the same manner as the enable signals ENA1 and ENB1, respectively. When i is an even number, in the unit circuit 51 of the ith stage, the output signals Y2 and Y3 change in the same manner as the enable signals ENA2 and ENB2, respectively. In unit circuits 51 of the first to nth stages (excluding the ith stage), since the enable signals ENA1, ENA2, ENB1, and ENB2 are at a low level, the output signals Y2 and Y3 are at a low level. Therefore, in the pause period, the voltage of the scanning line GAi goes to a high level only during the periods T1 and T3, the voltage of the scanning line GBi goes to a high level only during the period T2, and the voltages of the scanning lines GA1 to GAn and GB1 to GBn (excluding GAi and GBi) are maintained at a low level.

The operation of a pixel circuit 38 of an ith row and a jth column for when the scanning lines GAi and GBi and the data line Sj are driven at the timing shown in FIG. 24 will be described below. During an ith line period, the voltage of the scanning line GAi is at a high level and the voltage of the scanning line GBi is at a low level. Hence, the transistor Q2 goes into an on state and the transistor Q3 goes into an off state. At this time, the source driver 14 applies a data voltage Dij corresponding to a video signal X2, to the data line Sj. Therefore, the gate voltage of the transistor Q1 becomes Dij.

At the end of the ith line period, the voltage of the scanning line GAi changes to a low level. Accordingly, the transistor Q2 goes into an off state. After this, the gate voltage of the transistor Q1 is maintained at Dij by the action of the capacitor C1. When the data voltage Dij is greater than or equal to a predetermined level, the transistor Q1 goes into an on state, and an amount of current depending on the voltage between the gate and source of the transistor Q1 flows through the organic EL element L1. The organic EL element L1 emits light at a luminance depending on the amount of current flowing therethrough. Therefore, the organic EL element L1 emits light at a luminance depending on the data voltage Dij.

During the period T1 in the ith pause line period (current measurement period), the voltage of the scanning line GAi is at a high level and the voltage of the scanning line GBi is at a low level. Hence, the transistor Q2 goes into an on state and the transistor Q3 goes into an off state. At this time, the source driver 14 applies a measurement voltage Vmg(i,j) to the data line Sj. Therefore, the gate voltage of the transistor Q1 becomes Vmg(i,j). The measurement voltage Vmg(i,j) is either a TFT characteristic measurement voltage or an OLED characteristic measurement voltage. Note that the TFT characteristic measurement voltage is a voltage that brings the transistor Q1 into an on state, and the OLED characteristic measurement voltage is a voltage that brings the transistor Q1 into an off state.

During the period T2, the voltage of the scanning line GAi is at a low level and the voltage of the scanning line GBi is at a high level. Hence, the transistor Q2 goes into an off state and the transistor Q3 goes into an on state. When the TFT characteristic measurement voltage is applied in the period T1, a current that passes through the transistors Q1 and Q3 from an electrode having a high-level power supply voltage ELVDD flows through the data line Sj. Note that the value of the measurement voltage Vmg(i,j) is set such that a current does not flow through the organic EL element L1 at this time. When the OLED characteristic measurement voltage is applied in the period T1, the source driver 14 further applies a voltage Vm(i,j) for allowing a current to flow through the organic EL element L1, to the data line Sj. By this, a current that passes through the transistor Q3 and the organic EL element L1 from the data line Sj flows through an electrode having a low-level power supply voltage ELVSS. The source driver 14 measures, in the period T2, the current flowing through the data line Sj.

During the period T3, the voltage of the scanning line GAi is at a high level and the voltage of the scanning line GBi is at a low level. At this time, the source driver 14 and the pixel circuit 38 operate in the same manner as for the ith line period. After the period T3, the organic EL element L1 emits light at a luminance depending on the data voltage Dij.

<3.3 Correction Computation and Update to Correction Data>

Details of a correction data storage unit 16 and a correction computing unit included in the display device 3 are the same as those of the first embodiment (see FIG. 13). The operation of a CPU 69 included in the correction computing unit 17 is the same as that of the first embodiment (see FIG. 14).

<3.4 Effects, Etc.>

As described above, the display device 3 according to the present embodiment includes: the display unit 31 including the 2n scanning lines GA1 to GAn and GB1 to GBn, the m data lines S1 to Sm, and the (m×n) pixel circuits 38 arranged two-dimensionally; the display control circuit 12; the scanning line drive circuit 33; and the source driver 14. In a current measurement period, the scanning line drive circuit 33 applies scanning signals (a scanning signal for current measurement and a scanning signal for writing a voltage) which go to a high level in periods T1 to T3, to scanning lines GAi and GBi which are selected from among the scanning lines GA1 to GAn and GB1 to GBn. In the current measurement period, the source driver 14 applies measurement voltages to the data lines S1 to Sm, measures currents outputted to the data lines S1 to Sm from pixel circuits 38, and applies data voltages to the data lines S1 to Sm.

The display control circuit 12 outputs the enable signals ENA1 and ENA2 as first enable signals, and outputs the enable signals ENB1 and ENB2 as second enable signals. Each unit circuit 51 (each stage of the shift register) includes the node control circuit (the transistors Q11 and Q12), the first output control circuit (the transistors Q13 and Q14 and the capacitor C11), and the second output control circuit (the transistors Q15 to Q20 and the capacitors C12 and C13).

The second output control circuit can be configured using the transistor Q16 (second output control transistor) having a drain terminal (first conductive terminal) to which the enable signal ENA1 or ENA2 is provided, a source terminal (second conductive terminal) connected to the scanning line GAi (first scanning line), and a gate terminal (control terminal) connected to the node N2 (second node) having a voltage of the same logic level as the node N1; and the transistor Q19 (third output control transistor) having a drain terminal to which the enable signal ENB1 or ENB2 is provided, a source terminal connected to the scanning line GBi (second scanning line), and a gate terminal connected to the node N3 (third node) having a voltage of the same logic level as the node N1.

Each pixel circuit 38 includes the organic EL element L1 (electro-optical element); the transistor Q1 (drive transistor) provided in series with the organic EL element L1; the transistor Q2 (write control transistor) provided between the data line Sj and the gate terminal of the transistor Q1, and having a gate terminal (control terminal) connected to the scanning line GAi; the transistor Q3 (read control transistor) provided between the data line Sj and the source terminal (one conductive terminal) of the transistor Q1, and having a gate terminal connected to the scanning line GBi; and the capacitor C1 provided between the gate terminal and drain terminal (other conductive terminal) of the transistor Q1. Therefore, the display device including the pixel circuits, each including an electro-optical element, three transistors, and a capacitor; and two types of scanning lines can measure currents in the pixel circuits while preventing a reduction in the image quality of a display image using simple circuits.

4. Fourth Embodiment

<4.1 Configurations, Etc.>

An overall configuration of a display device, a configuration of pixel circuits, a configuration of a scanning line drive circuit, and a configuration of unit circuits are the same as those of the third embodiment, and thus, description thereof is omitted (see FIGS. 20 to 23). The display device according to the present embodiment differs from the display device according to the third embodiment in drive method. Specifically, in the third embodiment, pause driving is adopted, and current measurement for characteristic detection (characteristic detection for a drive transistor or an organic EL) is performed in a pause period. In the present embodiment, on the other hand, pause driving does not necessarily need to be adopted, and current measurement for characteristic detection is performed in a normal display period.

<4.2 Drive Method>

Figure 26:
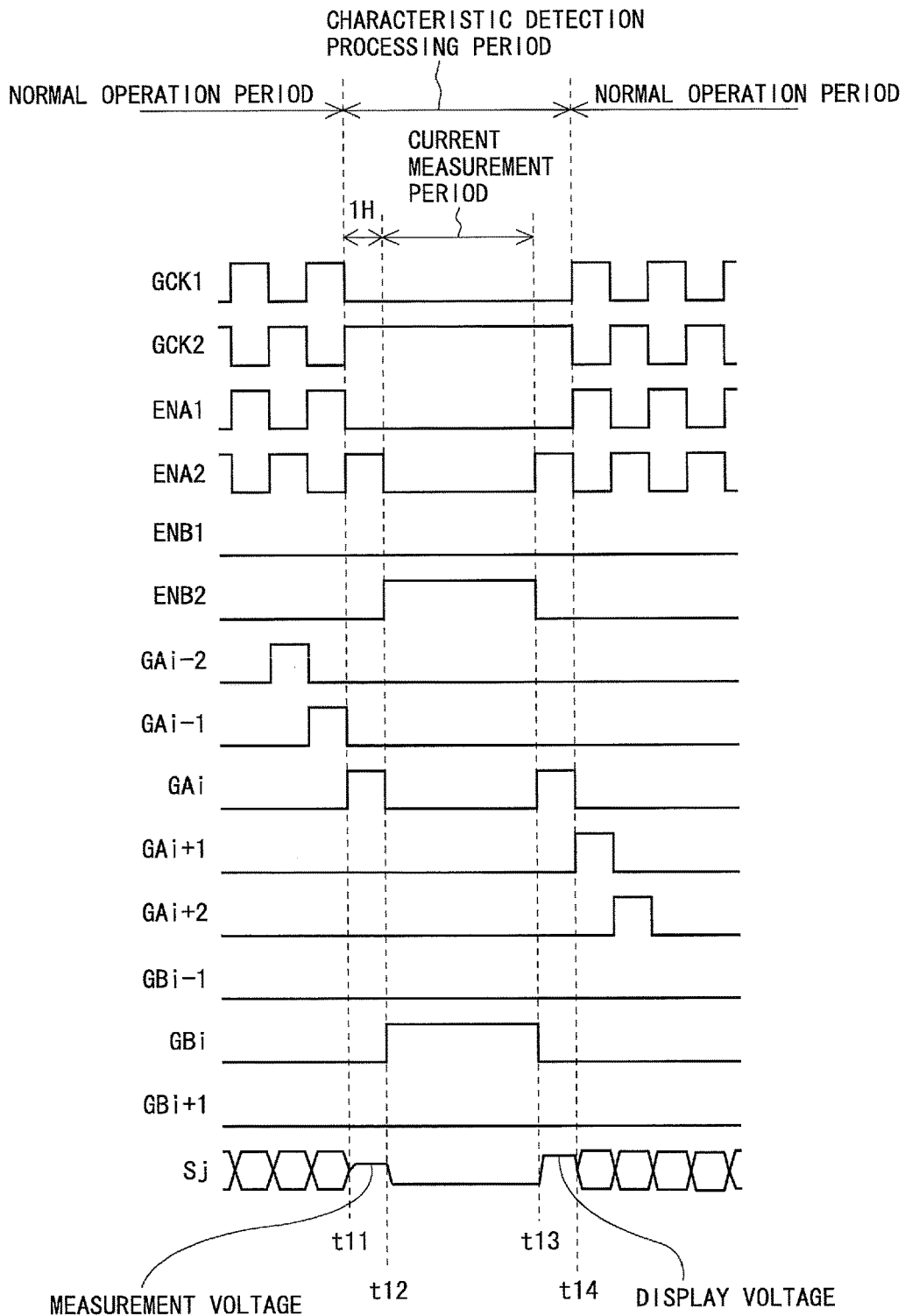
FIG. 26 is a timing chart for describing a drive method of a fourth embodiment of the present invention.

FIG. 26 is a timing chart for describing a drive method of the present embodiment. It is assumed that current measurement (current measurement for characteristic detection) for an ith row (i is an even number) is performed in the timing chart shown in FIG. 26. That is, the ith row corresponds to a measurement target row. Here, a period during which a process for characteristic detection is performed is referred to as "characteristic detection processing period", and a period during which a normal display process is performed is referred to as "normal operation period". In FIG. 26, a period from time t11 to time t14 is the characteristic detection processing period, and a period before time t11 and a period after time t14 are the normal operation periods. In addition, a period from time t12 to time t13 is a current measurement period during which current measurement is actually performed. Current measurement for characteristic detection is performed row by row in one frame period or on a per plurality of rows basis in one frame period. In the present embodiment, the length of a period during which the scanning lines GA1 to GAn are maintained at the high level when the scanning lines GA1 to GAn go to a high level is the same between the normal operation period and the characteristic detection processing period.

Note that, in the present embodiment, the period from time t11 to time t12 corresponds to a measurement preparation period, the period from time t12 to time t13 corresponds to an amount-of-electricity measurement period, and the period from time t13 to time t14 corresponds to a display preparation period. Note, however, that in the present embodiment, since current measurement is performed, the amount-of-electricity measurement period is a current measurement period. It is preferred that the current measurement period be set to be a longer period than the measurement preparation period and set to be a longer period than the display preparation period. In addition, the scanning lines GA1 to GAn correspond to first scanning lines, and the scanning lines GB1 to GBn correspond to second scanning lines.

During the normal operation period, an enable signal ENA2 changes in the same manner as a gate clock GCK2, and an enable signal ENB2 is maintained at a low level. Therefore, in the normal operation period, the voltages of the scanning lines GA1 to GAn sequentially go to a high level line by line, and the voltages of the scanning lines GB1 to GBn are maintained at a low level.

At time t11 to time t12 in the characteristic detection processing period, the voltage of a scanning line GAi goes to a high level. By this, in a pixel circuit 38 of an ith row (see FIG. 21), a transistor Q2 goes into an on state. The voltage of a scanning line GBi is maintained at the low level. Therefore, a transistor Q3 is maintained in an off state. At this time, a measurement voltage is supplied to a data line Sj from a source driver 14. Based on the measurement voltage, a capacitor C1 is charged. Note that the measurement voltage is either a TFT characteristic measurement voltage or an OLED characteristic measurement voltage.

At time t12 to time t13 (current measurement period) in the characteristic detection processing period, the voltage of the scanning line GAi goes to a low level and the voltage of the scanning line GBi goes to a high level. Hence, the transistor Q2 goes into an off state and the transistor Q3 goes into an on state. When the TFT characteristic measurement voltage is applied as the measurement voltage at time t11 to time t12, a current that passes through the transistors Q1 and Q3 from an electrode having a high-level power supply voltage ELVDD flows through the data line Sj. When the OLED characteristic measurement voltage is applied as the measurement voltage at time t11 to time t12, a voltage Vm(i,j) for allowing a current to flow through an organic EL element L1 is further applied to a monitoring line Mj at time t12 to time t13. By this, a current that passes through the transistor Q3 and the organic EL element L1 from the data line Sj flows through an electrode having a low-level power supply voltage ELVSS. In a state such as that described above, the source driver 14 measures the current flowing through the data line Sj.

At time t13 to time t14 in the characteristic detection processing period, the voltage of the scanning line GAi goes to a high level and the voltage of the scanning line GBi goes to a low level. By this, the transistor Q2 goes into anon state and the transistor Q3 goes into an off state. At this time, a display voltage for image display is supplied to the data line Sj from the source driver 14. The capacitor C1 is charged based on the display voltage, and the transistor Q1 goes into an on state. By this, an amount of current depending on the display voltage flows through the organic EL element L1. By the above, the organic EL element L1 emits light at a luminance depending on the display voltage.

<4.3 Transistors in Unit Circuits and Pixel Circuits>

In the present embodiment, in a unit circuit 51 of a row where current measurement is performed (see FIG. 23), the voltage of the node N1 is maintained at a high level for a longer period than a normal operation period. Since such driving is performed, an excellent holding characteristic is required compared to a normal drive method where the scanning lines are sequentially brought to a high level on a per horizontal scanning period basis. If the channel lengths of the transistors in the unit circuit 51 are increased in order to achieve an excellent holding characteristic, then the layout area of the unit circuit 51 increases. Hence, in order to prevent an increase in the layout area of the unit circuit 51, it is preferred to adopt a transistor formed using an oxide semiconductor, for the transistors in the unit circuit 51. In particular, a transistor formed using an oxide semiconductor containing indium (In), gallium (Ga), zinc (Zn), and oxygen (O) has very small off-leakage and thus is ideal for the transistors in the unit circuit 51 of the present embodiment.

In addition, in the present embodiment, due to the following reason, it is also preferred to adopt a transistor formed using an oxide semiconductor (particularly, an oxide semiconductor containing indium (In), gallium (Ga), zinc (Zn), and oxygen (O)), for the transistors in the pixel circuit 38. Each data line Sj is connected to pixel circuits 38 of all rows of a corresponding column. Hence, the larger the leakage current from each pixel circuit 38, the worse the S/N ratio for when current measurement is performed. Therefore, in order to increase the S/N ratio for when current measurement is performed, it is preferred to adopt transistors with an excellent off-leakage characteristic (transistors with small off-leakage current), for the transistors in the pixel circuit 38.

Meanwhile, in order to perform writing of a measurement voltage and writing of a display voltage in a shorter period than the current measurement period, it is preferred that the current capability of transistors provided for the scanning lines GA1 to GAn be higher than that of transistors provided for the scanning lines GB1 to GBn. Specifically, in the unit circuit 51 shown in FIG. 23, it is preferred that the current capability of the transistor Q16 be higher than that of the transistor Q19. In order to achieve this, for example, it is considered to make the channel width of the transistor Q16 larger than that of the transistor Q19. By this, writing to a pixel can be performed in a sufficiently short time, enabling to secure a current measurement period of a sufficient length.

<4.4 Effects>

According to the present embodiment, even when pause driving is not adopted, as in the third embodiment, currents in the pixel circuits can be measured using simple circuits while preventing a reduction in the image quality of a display image. By this, it is possible to compensate for variations in the characteristic (e.g., variations in threshold voltage) of the drive transistor or degradation of the organic EL element (a reduction in light-emission efficiency).

5. Fifth Embodiment

<5.1 Configuration>

Figure 27:
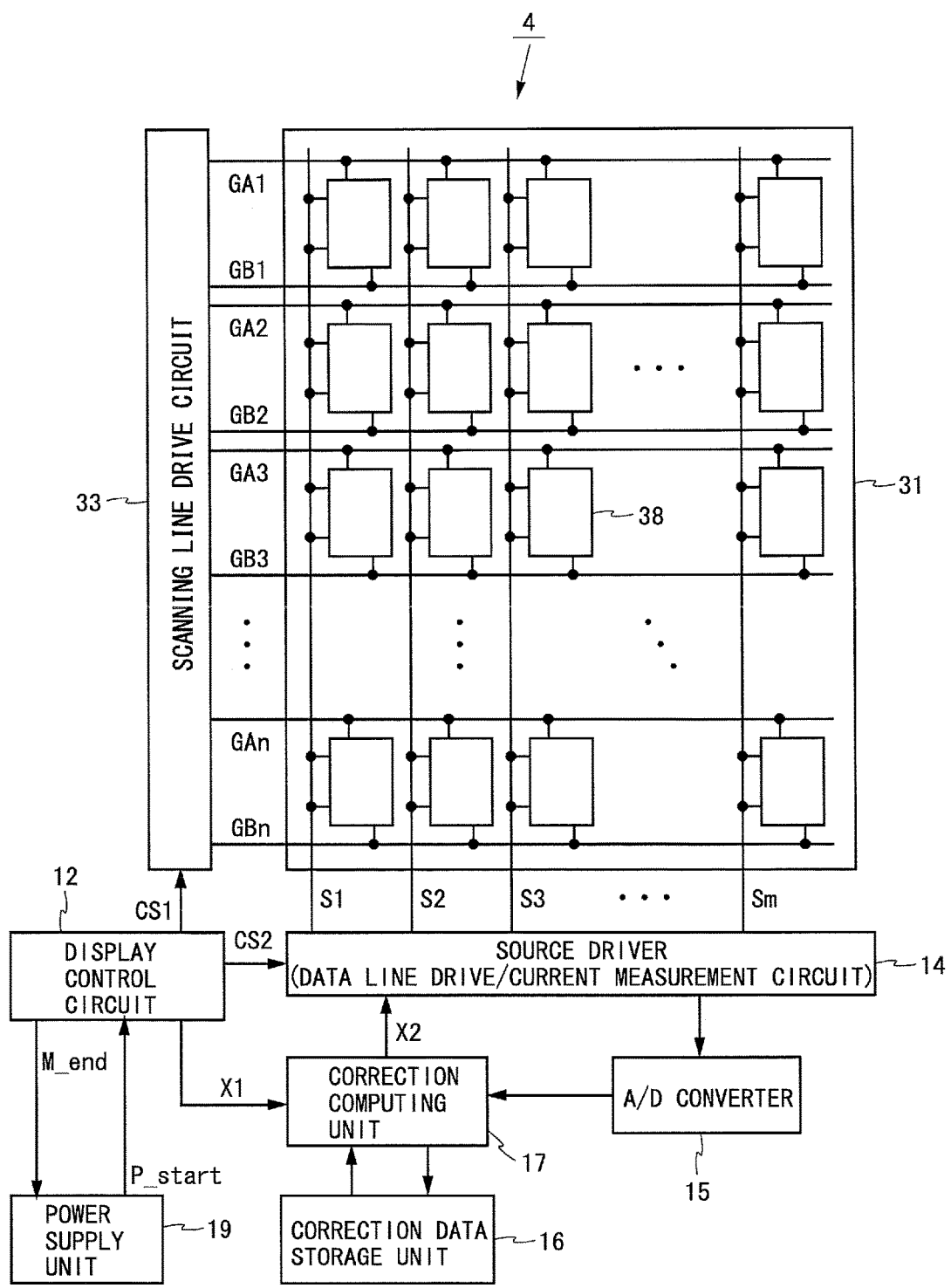
FIG. 27 is a block diagram showing a configuration of a display device according to a fifth embodiment of the present invention.

FIG. 27 is a block diagram showing a configuration of a display device according to a fifth embodiment of the present invention. A display device 4 shown in FIG. 27 is such that a power supply unit 19 is added to the display device 3 according to the third embodiment. The display device 4 according to the present embodiment differs from the display device 3 according to the third embodiment in drive method. Specifically, in the third embodiment, pause driving is adopted and current measurement for characteristic detection is performed in a pause period. In the present embodiment, on the other hand, current measurement for characteristic detection is performed at power-on or power-off. More specifically, a dedicated period for performing current measurement is provided immediately after a power-on button of the display device 3 is pressed or immediately after a power-off button of the display device 3 is pressed.

Figure 28:
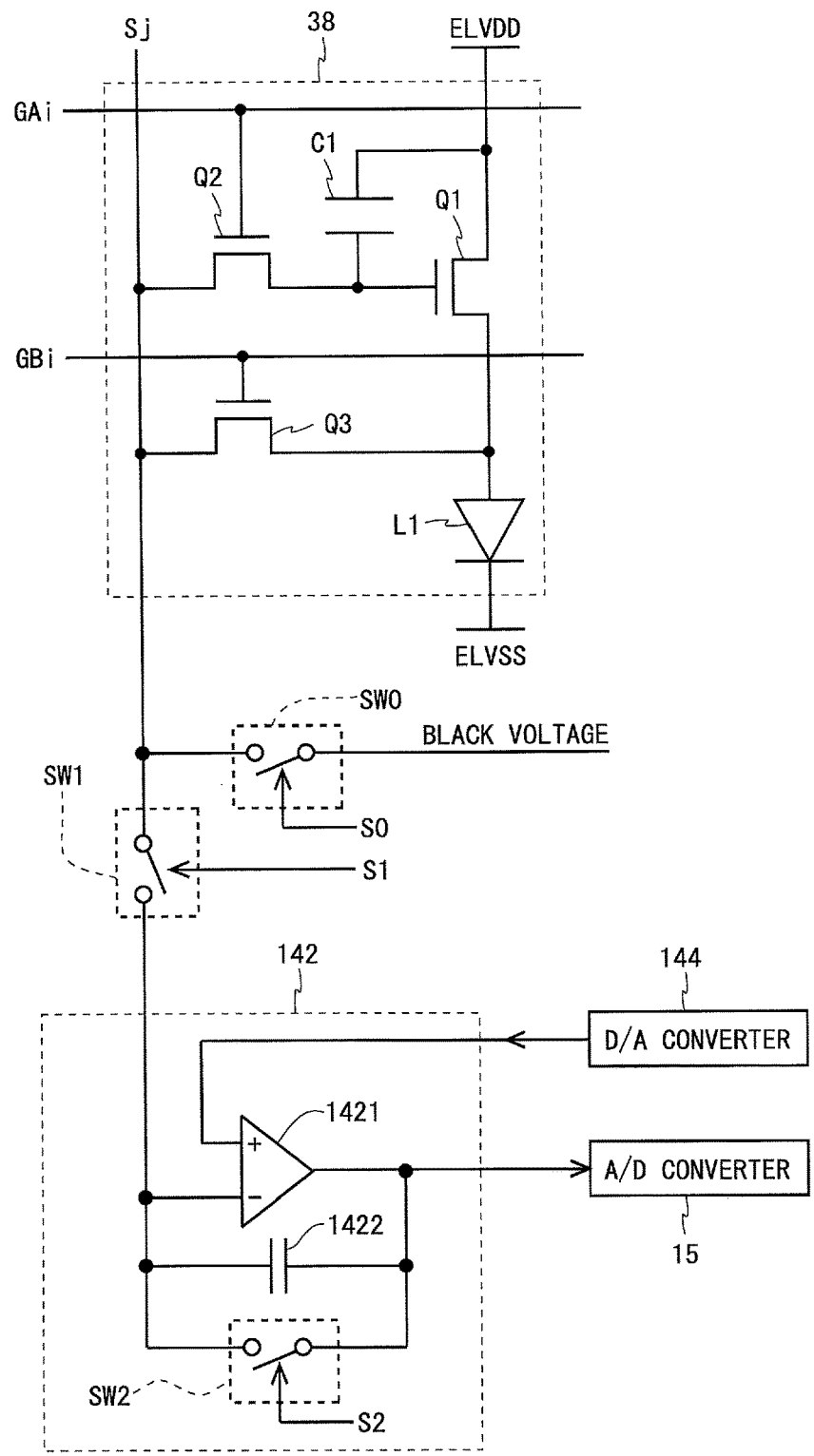
FIG. 28 is a circuit diagram showing a configuration of a region including a pixel circuit and a current measuring unit of the fifth embodiment.

A source driver 14 functionally includes a data line driving unit that drives data lines S1 to Sm; and a current measuring unit that measures currents flowing through the data lines S1 to Sm. FIG. 28 is a circuit diagram showing a configuration of a region including a pixel circuit 38 and a current measuring unit 142. A circuit configuration of the pixel circuit 38 is the same as that of the third embodiment (see FIG. 21). A switch SW0 that controls the application of a black voltage (a voltage for displaying black) to a data line Sj is provided near the data line Sj. On the data line Sj is provided a switch SW1 that controls an electrical connection between the pixel circuit 38 and the current measuring unit 142. The current measuring unit 142 includes an operational amplifier 1421, a capacitor 1422, and a switch SW2. The operational amplifier 1421 is connected at its inverting input terminal to the data line Sj and connected at its non-inverting input terminal to an output terminal of a D/A converter 144 provided in the source driver 14. An output terminal of the operational amplifier 1421 is connected to an input terminal of an A/D converter 15. The capacitor 1422 and the switch SW2 are provided between the output terminal of the operational amplifier 1421 and the data line Sj. The states of the switches SW0, SW1, and SW2 are controlled by control signals S0, S1, and S2, respectively. As described above, the current measuring unit 142 is composed of an integrating circuit.

<5.2 Drive Method>

Figure 29:
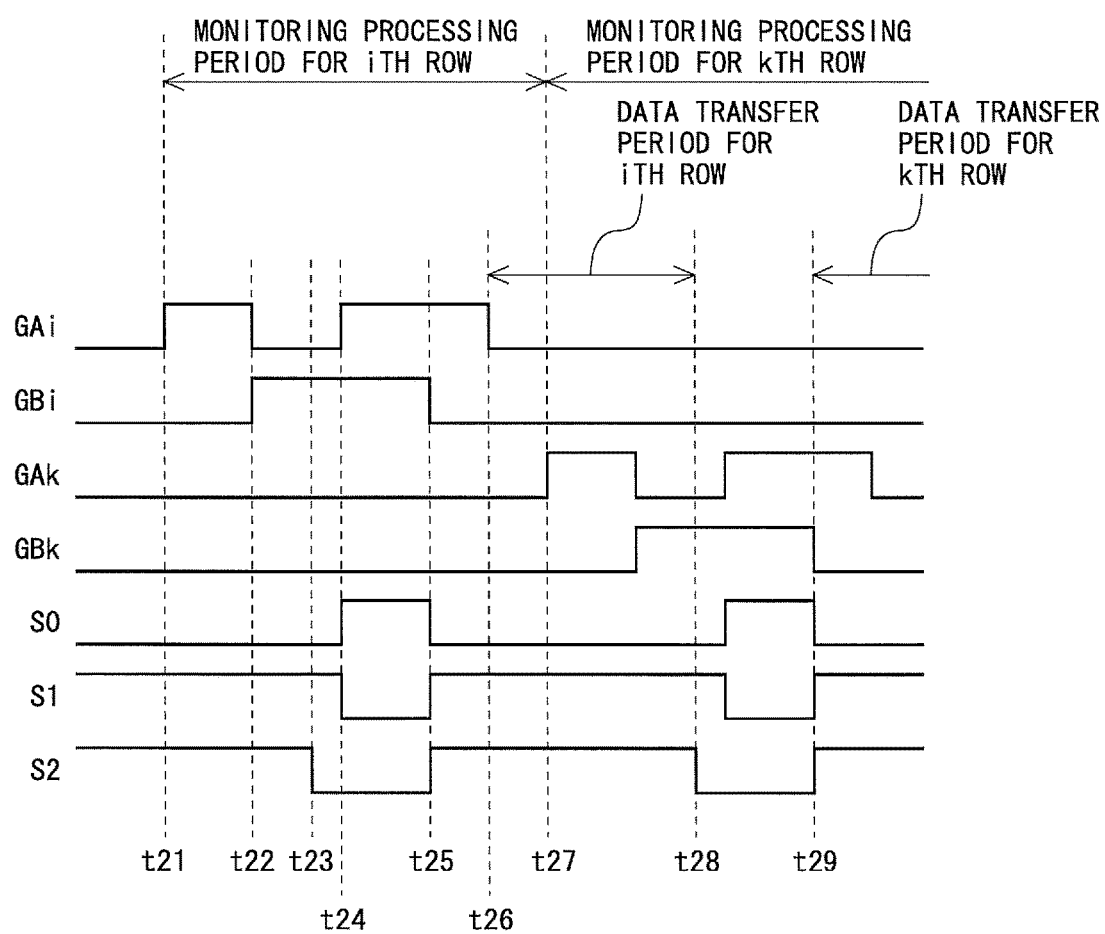
FIG. 29 is a timing chart for describing operation for when current measurement for characteristic detection is performed in the fifth embodiment.

With reference to FIG. 29, operation for when current measurement for characteristic detection is performed in the present embodiment will be described. As described above, current measurement is performed at power-on or power-off. Note that typically current measurement for multiple rows is performed intensively at power-on or power-off. FIG. 29 shows a timing chart for periods where current measurement is performed for an ith row and a kth row among periods where current measurement for multiple rows is performed. Note that the ith row and the kth row may be rows adjacent to each other or may be rows apart from each other.

At time t21, the voltage of a scanning line GAi goes to a high level. By this, a transistor Q2 goes into an on state. At this time, the voltage of a scanning line GBi is at a low level and thus a transistor Q3 is in an off state. In addition, since control signals S0, S1, and S2 are at a low level, a high level, and a high level, respectively, switches SW0, SW1, and SW2 are in an off state, an on state, and an on state, respectively. In addition, at this time, a measurement voltage is outputted from the D/A converter 144. By the above, the measurement voltage is applied to a data line Sj, and a capacitor C1 is charged based on the measurement voltage. Note that the measurement voltage is either a TFT characteristic measurement voltage or an OLED characteristic measurement voltage.

At time t22, the voltage of the scanning line GAi goes to a low level and the voltage of the scanning line GBi goes to a high level. Hence, the transistor Q2 goes into an off state and the transistor Q3 goes into an on state. By this, when the TFT characteristic measurement voltage is applied as the measurement voltage, a current that passes through the transistors Q1 and Q3 from an electrode having a high-level power supply voltage ELVDD flows through the data line Sj, and when the OLED characteristic measurement voltage is applied as the measurement voltage, a current that passes through the transistor Q3 and an organic EL element L1 from the data line Sj flows through an electrode having a low-level power supply voltage ELVSS.

At time t23, the control signal S2 goes to a low level. Hence, the switch SW2 goes into an off state. By this, due to the presence of a capacitor 1422, an output voltage from the operational amplifier 1421 changes depending on the magnitude of current flowing through the data line Sj. In this manner, during a period from time t23 to time t24 at which a switch S1 goes into an off state, current measurement is performed. Note that the output voltage from the operational amplifier 1421 is provided to the A/D converter 15.

At time t24, the voltage of the scanning line GAi goes to a high level. Hence, the transistor Q2 goes into an on state. At this time, the voltage of the scanning line GBi is maintained at the high level. Hence, the transistor Q3 is maintained in the on state. In addition, at time t24, the control signals S0, S1, and S2 go to a high level, a low level, and a low level, respectively. Hence, the switches SW0, SW1, and SW2 go into an on state, an off state, and an off state, respectively. By the above, a black voltage is applied to the data line Sj, and writing based on the black voltage is performed on a pixel circuit 38 of the ith row. Meanwhile, the control signal S1 and the control signal S2 are maintained at the low level until time t25. Hence, during a period from time t24 to time t25, the switches SW1 and SW2 are maintained in off. By this, during the period from time t24 to time t25, an output from the operational amplifier 1421 goes into a hold state, and the A/D converter 15 performs AD conversion based on a result of the current measurement at time t23 to time t24. As such, current measurement is performed at time t23 to time t24, and AD conversion is performed at time t24 to time t25. Note that by performing writing based on the black voltage, the organic EL element L1 is prevented from unnecessarily emitting light in a non-display period.

After the transistor Q2 goes into an off state by the voltage of the scanning line GAi going to a low level at time t26, data for the ith row obtained by the AD conversion is transferred to a correction computing unit 17. Current measurement for the kth row starts at time t28 at which the control signal S2 changes from the high level to a low level the next time. Thus, the transfer of the data for the ith row is performed in a period before time t28. Note that this data transfer is transfer of data that is stored in a buffer after the AD conversion. For the data transfer, for example, a publicly known technique using a serial bus such as I2C (Inter-Integrated Circuit) or SPI (Serial Peripheral Interface) can be adopted.

In the present embodiment, at power-on or power-off, a process such as that described above is repeated a number of times equal to the number of rows where current measurement is performed.

Figure 30:
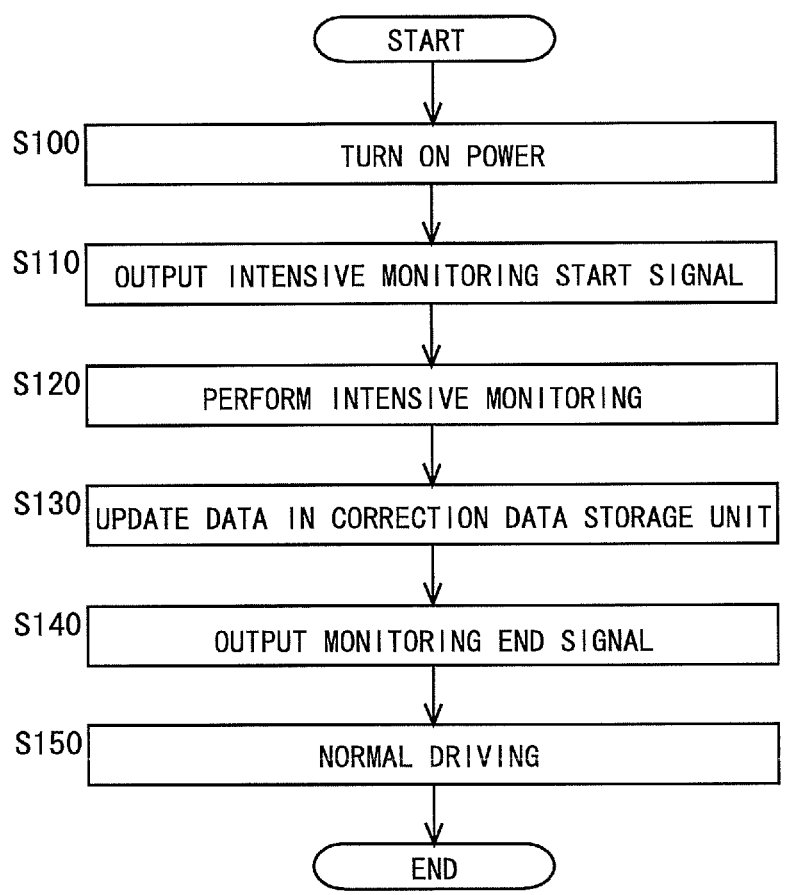
FIG. 30 is a flowchart showing a processing procedure for when current measurement for multiple rows is performed intensively at power-on in the fifth embodiment.

Next, with reference to FIG. 30, a processing procedure for when current measurement for multiple rows is performed intensively at power-on will be described. Note that performing of current measurement for multiple rows intensively is hereinafter referred to as "intensive monitoring". When the power to the device is turned on (step S100), an intensive monitoring start signal P_start is outputted from the power supply unit 19 (step S110). When a display control circuit 12 receives the intensive monitoring start signal P_start, it performs intensive monitoring in the manner described above (see FIG. 29) (step S120). Then, based on current measurement values obtained by the intensive monitoring, correction data stored in a correction data storage unit 16 is updated (step S130). Thereafter, a monitoring end signal M_end indicating that the intensive monitoring is completed is outputted to the power supply unit 19 from the display control circuit 12 (step S140). By this, normal driving starts (step S150).

Figure 31:
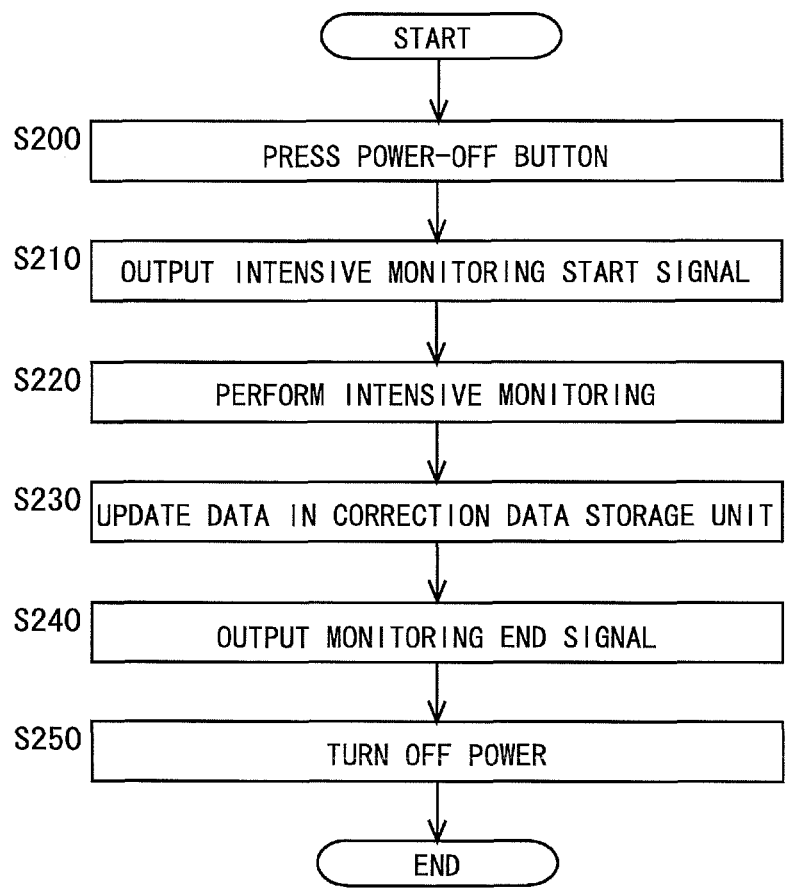
FIG. 31 is a flowchart showing a processing procedure for when intensive monitoring is performed at power-off in the fifth embodiment.

Next, with reference to FIG. 31, a processing procedure for when intensive monitoring is performed at power-off will be described. When the power-off button of the device is pressed (step S200), an intensive monitoring start signal P_start is outputted from the power supply unit 19 (step S210). When the display control circuit 12 receives the intensive monitoring start signal P_start, it performs intensive monitoring in the manner described above (see FIG. 29)

(step S220). Then, based on current measurement values obtained by the intensive monitoring, correction data stored in the correction data storage unit 16 is updated (step S230). Thereafter, a monitoring end signal M_end indicating that the intensive monitoring is completed is outputted to the power supply unit 19 from the display control circuit 12 (step S240). By this, the power to the device is turned off (step S250).

<5.3 Effects, Etc.>

According to the present embodiment, as in the fourth embodiment, even when pause driving is not adopted, currents in the pixel circuits can be measured using simple circuits. In addition, since current measurement is performed at power-on or power-off, a display process is not influenced by the current measurement. Therefore, currents in the pixel circuits can be measured without influencing at all the image quality of a display image.

6. Variants

<6.1 First Variant>

In the above-described embodiments, the display device is provided with the source driver having the function of measuring currents that are outputted to the monitoring lines M1 to Mm or data lines S1 to Sm from pixel circuits. That is, current measurement is performed in order to obtain a characteristic of a circuit element (the drive transistor Q1 or the organic EL element L1) in a pixel circuit. However, the present invention is not limited thereto, and voltage measurement may be performed in order to obtain a characteristic of a circuit element in the pixel circuit. Here, an example in which voltage measurement is performed instead of current measurement regarding the third embodiment will be described.

Figure 32:
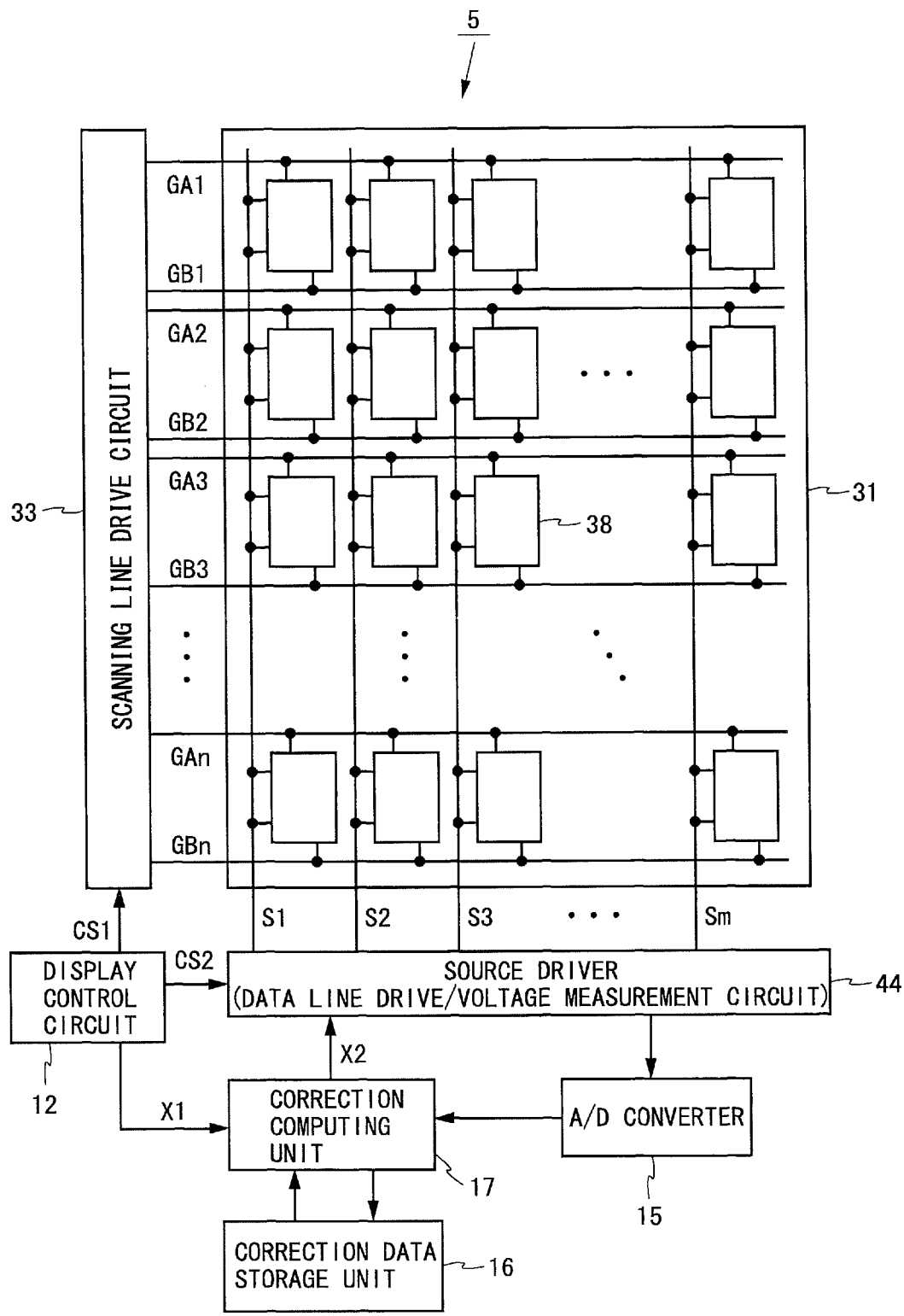
FIG. 32 is a block diagram showing a configuration of a display device according to a first variant.

FIG. 32 is a block diagram showing a configuration of a display device according to the present variant. A display device 5 shown in FIG. 32 is such that the source driver 34 of the display device 3 according to the third embodiment that functions as a data line drive circuit and a current measurement circuit is replaced by a source driver 44 that functions as a data line drive circuit and a voltage measurement circuit. The source driver 44 has the function of driving data lines S1 to Sm, and the function of measuring voltages at predetermined locations on the data lines S1 to Sm for when a constant current is supplied to pixel circuits 18 in order to obtain TFT characteristics or OLED characteristics. More specifically, the source driver 44 applies m data voltages generated corresponding to video signals X2 to the data lines S1 to Sm, respectively, according to control signals CS2. In addition, the source driver 44 applies m measurement voltages to the data lines S1 to Sm, respectively, and then measures m voltages that appear at predetermined locations on the data lines S1 to Sm when a constant current is supplied to the data lines S1 to Sm, and outputs the m voltages obtained by the measurement, according to the control signals CS2. Note that the pixel circuits 38 have the same circuit configuration as in the third embodiment (see FIG. 21).

Figure 33:
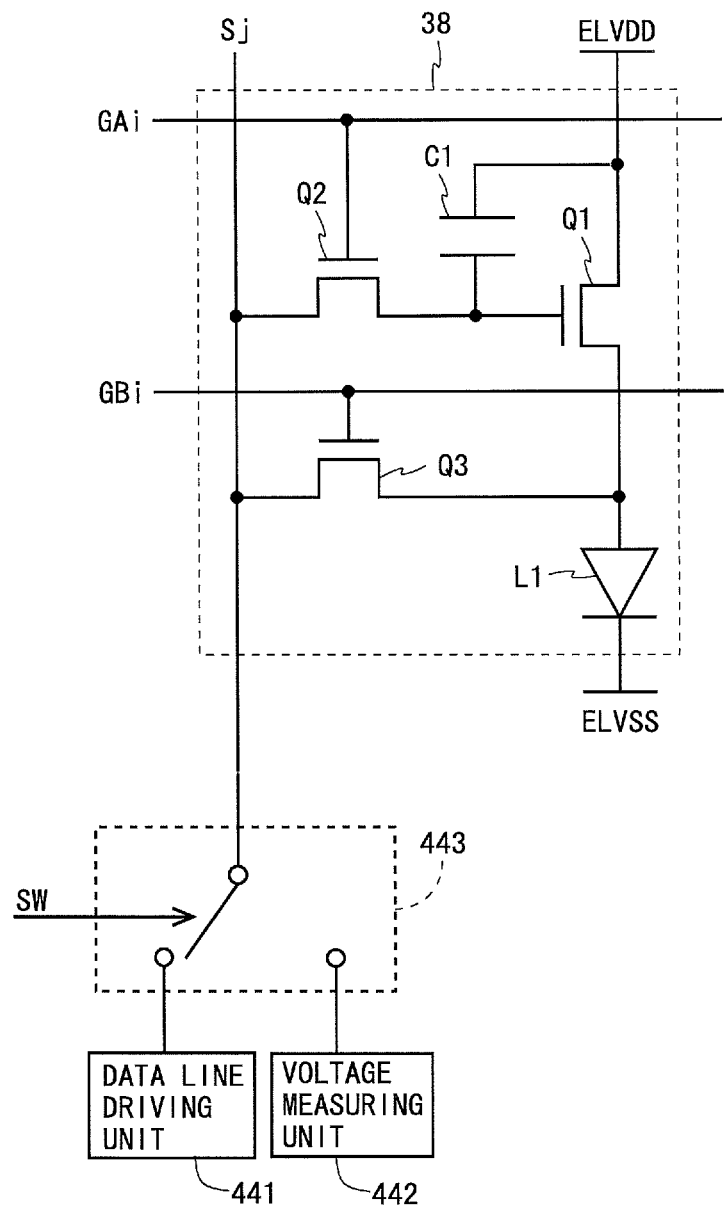
FIG. 33 is a diagram for describing switching of a connection destination of a data line in the first variant.

The source driver 44 functionally includes a data line driving unit that drives the data lines S1 to Sm; and a voltage measuring unit that measures voltages at predetermined locations on the data lines S1 to Sm. In the present variant, as shown in FIG. 33, there is provided a switching portion 443 for switching between a state in which a data line Sj is connected to a data line driving unit 441 and a state in which the data line Sj is connected to a voltage measuring unit 442. Then, the configuration is such that the data line Sj is connected to either the data line driving unit 441 or the voltage measuring unit 442, based on a switching control signal SW which is provided to the switching portion 443 from a display control circuit 12.

Figure 34:
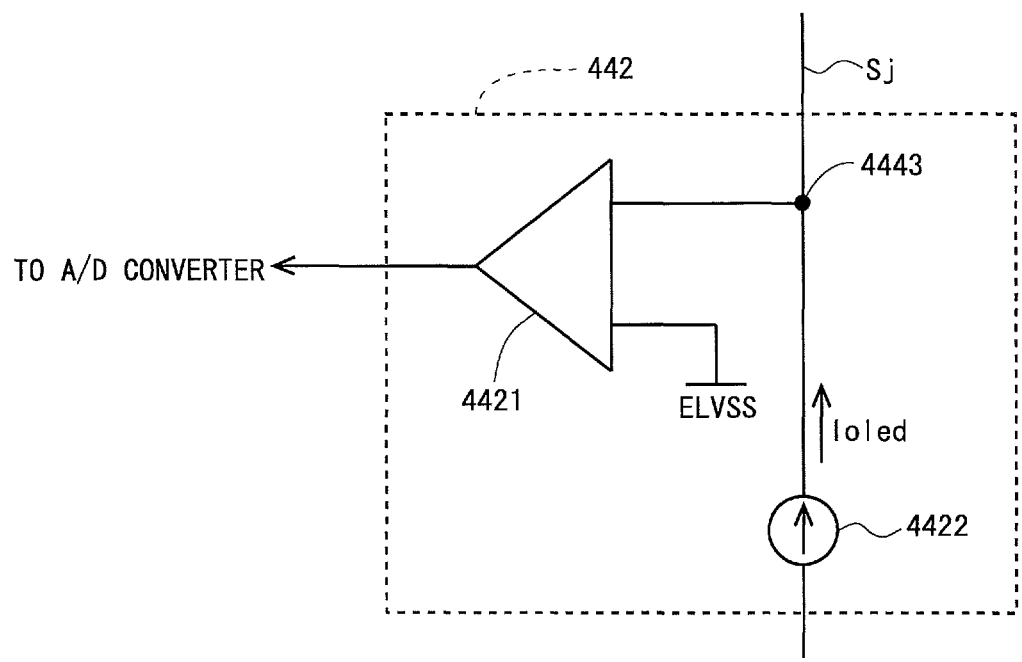
FIG. 34 is a diagram showing an exemplary configuration of a voltage measuring unit of the first variant.

FIG. 34 is a diagram showing an exemplary configuration of the voltage measuring unit 442. As shown in FIG. 34, the voltage measuring unit 442 includes an amplifier 4421 and a constant current source 4422. In such a configuration, a voltage between an electrode having a low-level power supply voltage ELVSS and a node 4443 is amplified by the amplifier 4421, with a constant current being supplied to the data line Sj by the constant current source 4422. Then, the amplified voltage is provided to an A/D converter 15.

Figure 35:
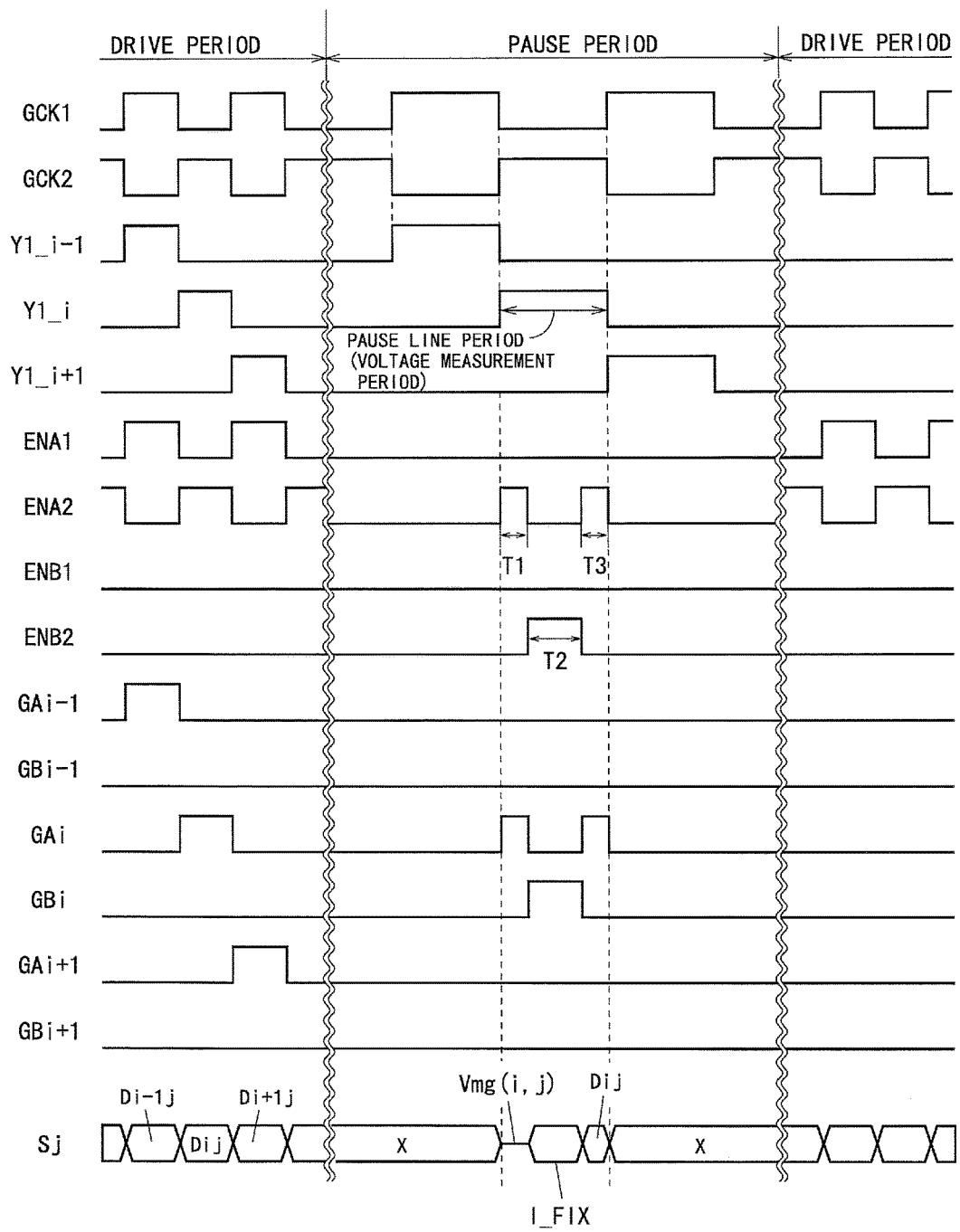
FIG. 35 is a detailed timing chart for the display device shown in FIG. 32.

FIG. 35 is a detailed timing chart for the display device 5 according to the present variant. The present variant differs from the third embodiment in operation performed in a pause line period. The operation of a pixel circuit 38 of an ith row and a jth column performed in an ith pause line period (voltage measurement period) for when scanning lines GAi and GBi and a data line Sj are driven at the timing shown in FIG. 35 will be described below.

During a period T1, the voltage of the scanning line GAi is at a high level and the voltage of the scanning line GBi is at a low level. Hence, a transistor Q2 goes into an on state and a transistor Q3 goes into an off state. At this time, the source driver 44 applies a measurement voltage Vmg(i,j) to the data line Sj. Therefore, the gate voltage of a transistor Q1 becomes Vmg(i,j). The measurement voltage Vmg(i,j) is either a TFT characteristic measurement voltage or an OLED characteristic measurement voltage. The TFT characteristic measurement voltage is a voltage that brings the transistor Q1 into an on state and prevents a current from flowing through an organic EL element L1. The OLED characteristic measurement voltage is a voltage that brings the transistor Q1 into an off state.

During a period T2, the voltage of the scanning line GAi is at a low level and the voltage of the scanning line GBi is at a high level. Hence, the transistor Q2 goes into an off state and the transistor Q3 goes into an on state. In this state, a constant current I_FIX is supplied to the data line Sj. The constant current I_FIX flows from the pixel circuit 38 to the source driver 44 upon TFT characteristic measurement, and flows from the source driver 44 to the pixel circuit 38 upon OLED characteristic measurement. In a case where the TFT characteristic measurement voltage is applied to the data line Sj during the period T1, a current that passes through the transistors Q1 and Q3 from an electrode having a high-level power supply voltage ELVDD flows toward the data line Sj. At this time, the TFT characteristic measurement voltage supplied during the period T1 is set so as to satisfy "the TFT characteristic measurement voltage<a threshold voltage of the organic EL element L1+a threshold voltage of the transistor Q1". By thus setting the TFT characteristic measurement voltage, upon TFT characteristic measurement, a current does not flow through the organic EL element L1 and only a characteristic of the transistor Q1 can be measured. In a case where the OLED characteristic measurement voltage is applied to the data line Sj during the period T1, a current that passes through the transistor Q3 and the organic EL element L1 from the data line Sj flows through an electrode having a low-level power supply voltage ELVSS. At this time, the OLED characteristic measurement voltage supplied during the period T1 is set so as to satisfy "the OLED characteristic measurement voltage<the threshold voltage of the organic EL element L1+the threshold voltage of the transistor Q1". By thus setting the OLED characteristic measurement voltage, upon OLED characteristic measurement, the transistor Q1 does not go into an on state and only a characteristic of the organic EL element L1 can be measured. The source driver 44 measures a voltage at a predetermined location (the node 4443 in FIG. 34) on the data line Sj in the period T2.

During a period T3, the voltage of the scanning line GAi is at a high level and the voltage of the scanning line GBi is at a low level. Hence, the transistor Q2 goes into an on state and the transistor Q3 is turned off. At this time, the source driver 44 applies a data voltage Dij generated corresponding to a video signal X2 to the data line Sj. Therefore, the gate voltage of the transistor Q1 becomes Dij and the organic EL element L1 emits light at a luminance depending on the data voltage Dij.

As described above, even when a configuration in which voltage measurement is performed instead of current measurement is adopted, a TFT characteristic or an OLED characteristic can be obtained and, for example, correction of a video signal can be performed based on the obtained information.

<6.2 Second Variant>

Although in the third embodiment it is premised that the length of the period T2 in the pause line period (current measurement period) is fixed, the present invention is not limited thereto. The length of the period T2 may be configured to be changeable depending on a current measurement target or the level of a predicted value of a measured current. A configuration in which the length of the period T2 is made changeable regarding the third embodiment will be described below.

Figure 36:
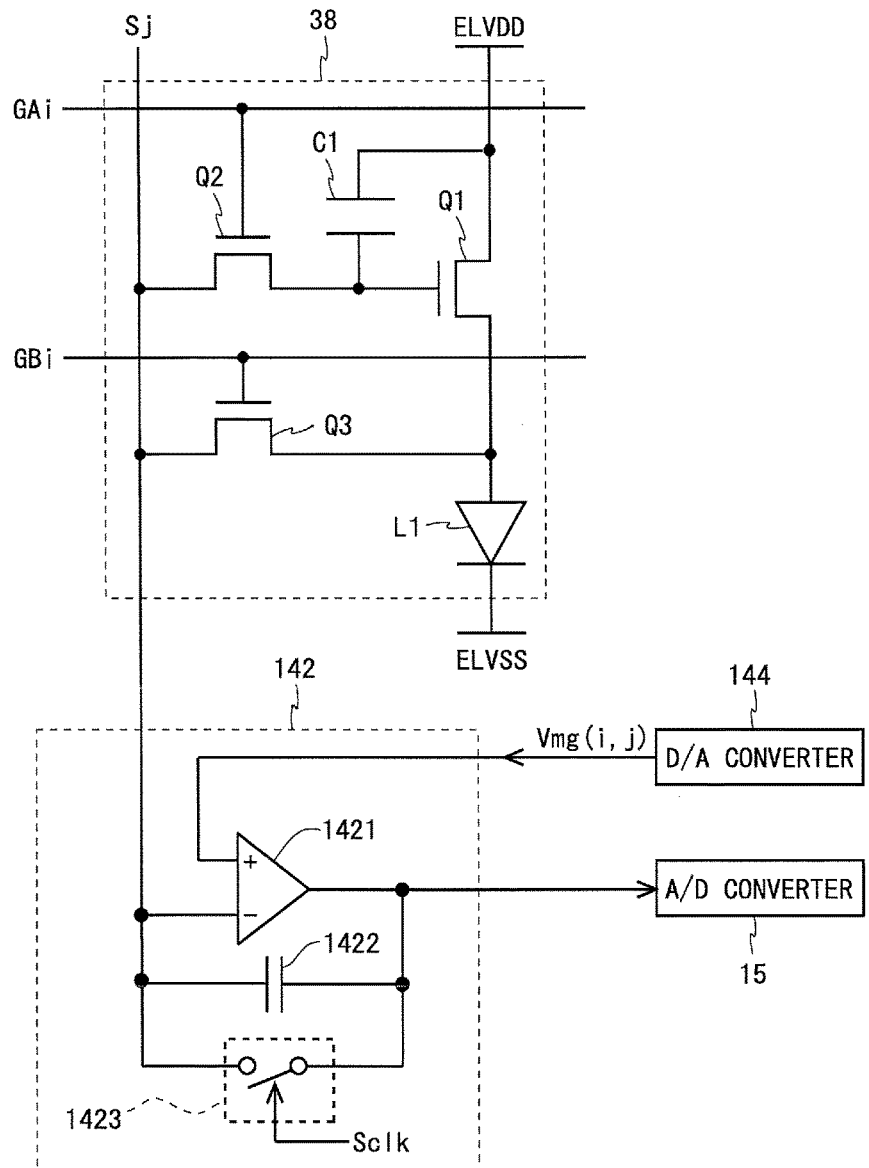
FIG. 36 is a circuit diagram showing configurations of a pixel circuit and a current measuring unit of a second variant.

A source driver 14 functionally includes a data line driving unit that drives data lines S1 to Sm; and a current measuring unit that measures currents flowing through the data lines S1 to Sm. FIG. 36 is a circuit diagram showing configurations of a pixel circuit 38 and a current measuring unit 142. The pixel circuit 38 has the same circuit configuration as in the third embodiment (see FIG. 21). The current measuring unit 142 includes an operational amplifier 1421, a capacitor 1422, and a switch 1423. The operational amplifier 1421 has an inverting input terminal connected to a data line Sj, and a non-inverting input terminal to which a measurement voltage Vmg(i,j) is provided when current measurement is performed. The capacitor 1422 and the switch 1423 are provided between an output terminal of the operational amplifier 1421 and the data line Sj. The state of the switch 1423 is controlled by a control clock signal Sclk. As described above, the current measuring unit 142 is composed of an integrating circuit. In such a configuration, first, the switch 1423 is brought into an on state by the control clock signal Sclk. By this, a short circuit occurs between the output terminal and inverting input terminal of the operational amplifier 1421, and the voltage at the output terminal of the operational amplifier 1421 and the voltage of the data line Sj become equal to the measurement voltage Vmg(i,j). Then, the switch 1423 is brought into an off state by the control clock signal Sclk. By this, due to the presence of the capacitor 1422, an output voltage from the operational amplifier 1421 changes depending on the magnitude of current flowing through the data line Sj. The output voltage from the operational amplifier 1421 is provided to an A/D converter 15.

Figure 37:
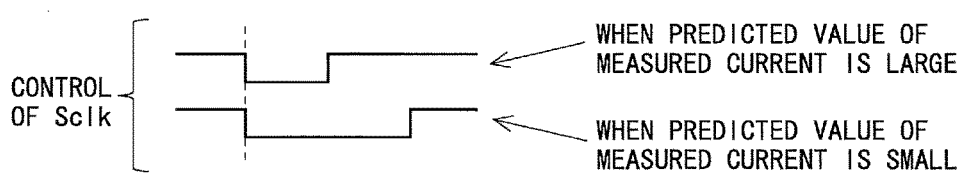
FIG. 37 is a diagram for describing control of a control clock signal of the second variant.
Figure 38:
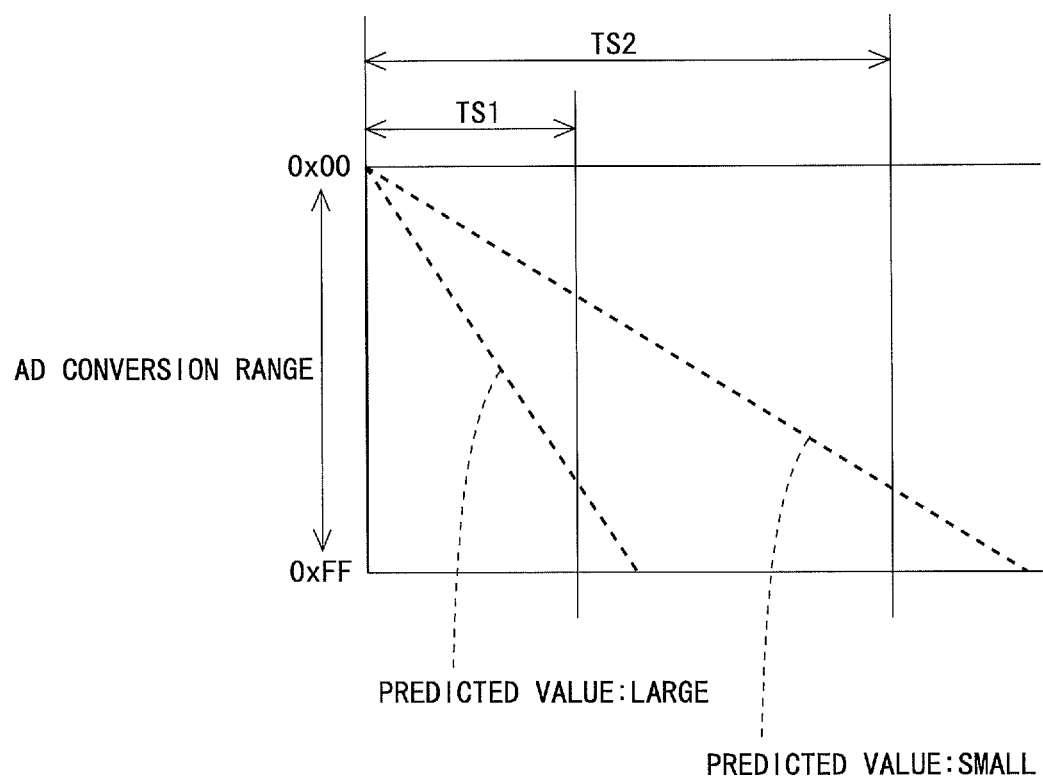
FIG. 38 is a diagram for describing an adjustment of integral time of the second variant.

As for current measurement, a predicted value of a measured current may be large at one time and may be small at other time, depending on a measurement target, etc. Regarding this, by controlling the control clock signal Sclk provided to the switch 1423 in the current measuring unit 142 in a manner shown in, for example, FIG. 37 to change the length of integral time (off-time of the control clock signal Sclk), the resolution of AD conversion by the A/D converter 15 can be effectively utilized. Specifically, by controlling the control clock signal Sclk, the integral time is reduced when the predicted value of a measured current is large, and the integral time is increased when the predicted value of a measured current is small, as shown in FIG. 38. Note that in FIG. 38, the integral time for the large predicted value of a measured current is represented by reference character TS1, and the integral time for the small predicted value of a measured current is represented by reference character TS2.

<6.3 Third Variant>

Although, in the above-described embodiments, the scanning line drive circuit is provided on one side of the display unit, the present invention is not limited thereto. It is also possible to adopt a configuration in which the scanning line drive circuits are provided on both sides of the display unit. Here, an example in which the scanning line drive circuits are provided on both sides of the display unit regarding the third embodiment will be described.

Figure 39:
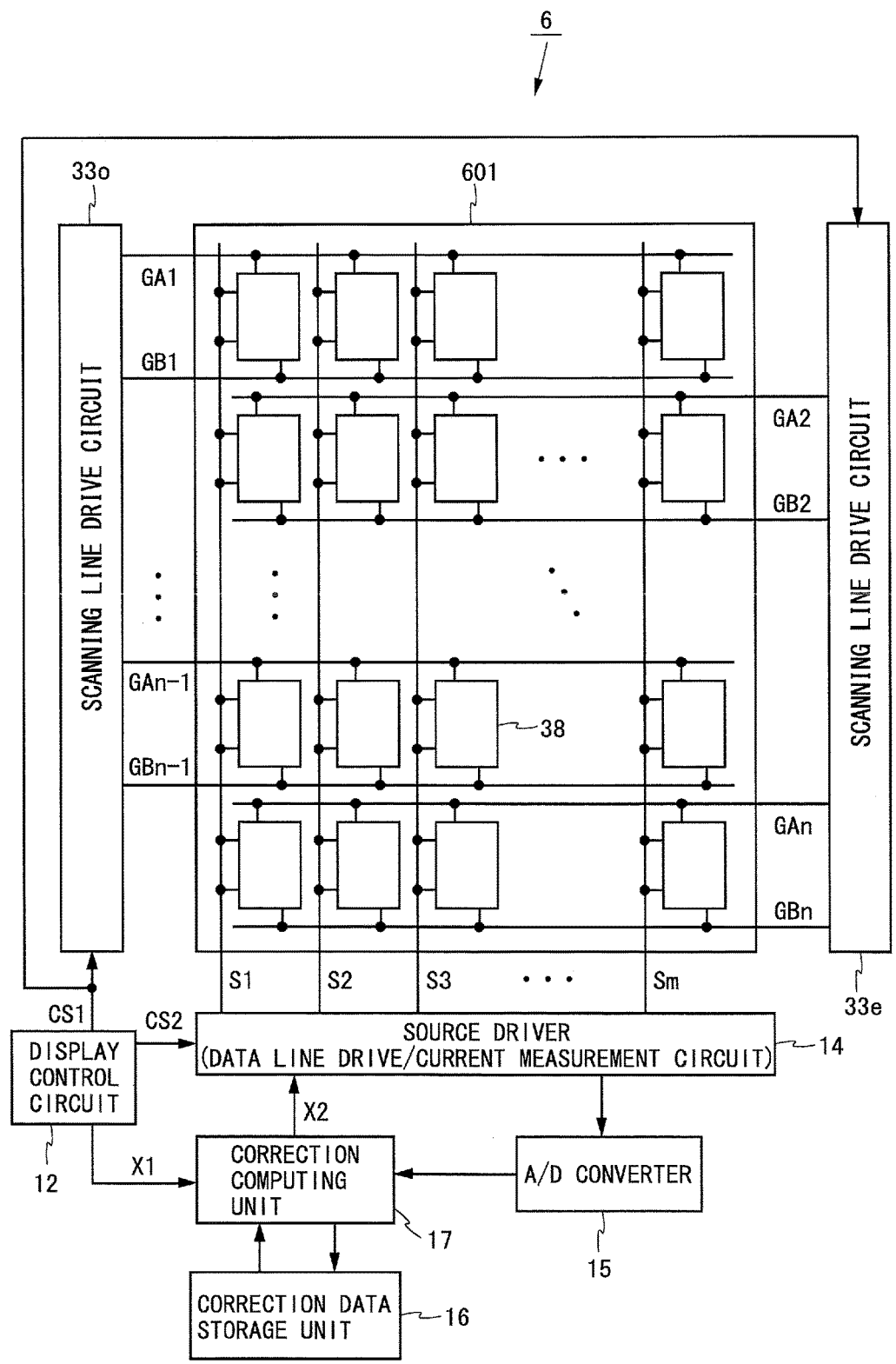
FIG. 39 is a block diagram showing a configuration of a display device according to a third variant.

FIG. 39 is a block diagram showing a configuration of a display device 6 according to the present variant. As shown in FIG. 39, in the present variant, scanning line drive circuits are provided on both of one side (the left side in FIG. 39) of a display unit 601 and the other side (the right side in FIG. 39) of the display unit 601. Note that the scanning line drive circuit provided on the one side of the display unit 601 is denoted by reference character 33o, and the scanning line drive circuit provided on the other side of the display unit 601 is denoted by reference character 33e. Scanning lines of the odd-numbered rows GA1, GB1, GA3, GB3, . . . , GAn−1 and GBn−1 are connected to the scanning line drive circuit 33o, and scanning lines of the even-numbered rows GA2, GB2, GA4, GB4, . . . , GAn and GBn are connected to the scanning line drive circuit 33e.

The configuration of the scanning line drive circuits 33o and 33e is the same as that shown in FIG. 22, except for the following: in the present variant, an enable signal EN_o is further provided to each unit circuit in the scanning line drive circuit 33o, and an enable signal EN_e is further provided to each unit circuit in the scanning line drive circuit 33e.

Figure 40:
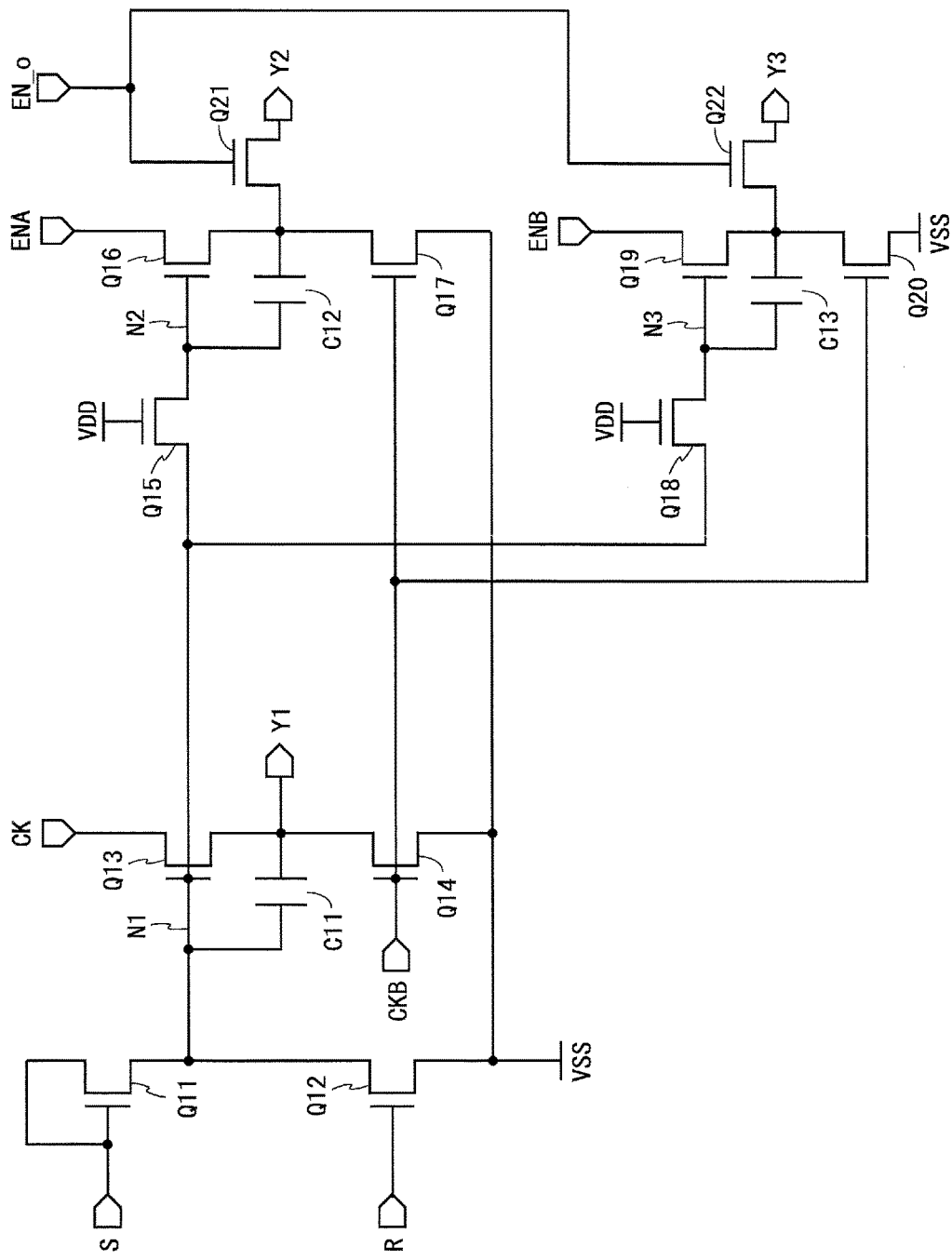
FIG. 40 is a circuit diagram of a unit circuit in a scanning line drive circuit of the third variant.

FIG. 40 is a circuit diagram of a unit circuit in the scanning line drive circuit 33o of the present variant. Transistors Q21 and Q22 and an enable terminal EN_o are provided in addition to the components provided to the unit circuit 51 shown in FIG. 23. One conductive terminal (a left-side terminal in FIG. 40) of the transistor Q21 is connected to a source terminal of a transistor Q16 and a drain terminal of a transistor Q17. The other conductive terminal (a right-side terminal in FIG. 40) of the transistor Q21 is connected to an output terminal Y2. A gate terminal of the transistor Q21 is connected to an enable terminal EN_o. One conductive terminal (a left-side terminal in FIG. 40) of the transistor Q22 is connected to a source terminal of a transistor Q19 and a drain terminal of a transistor Q20. The other conductive terminal (a right-side terminal in FIG. 40) of the transistor Q22 is connected to an output terminal Y3. A gate terminal of the transistor Q22 is connected to the enable terminal EN_o. Note that a unit circuit in the scanning line drive circuit 33e is provided with an enable terminal EN_e instead of the enable terminal EN_o shown in FIG. 40.

Figure 41:
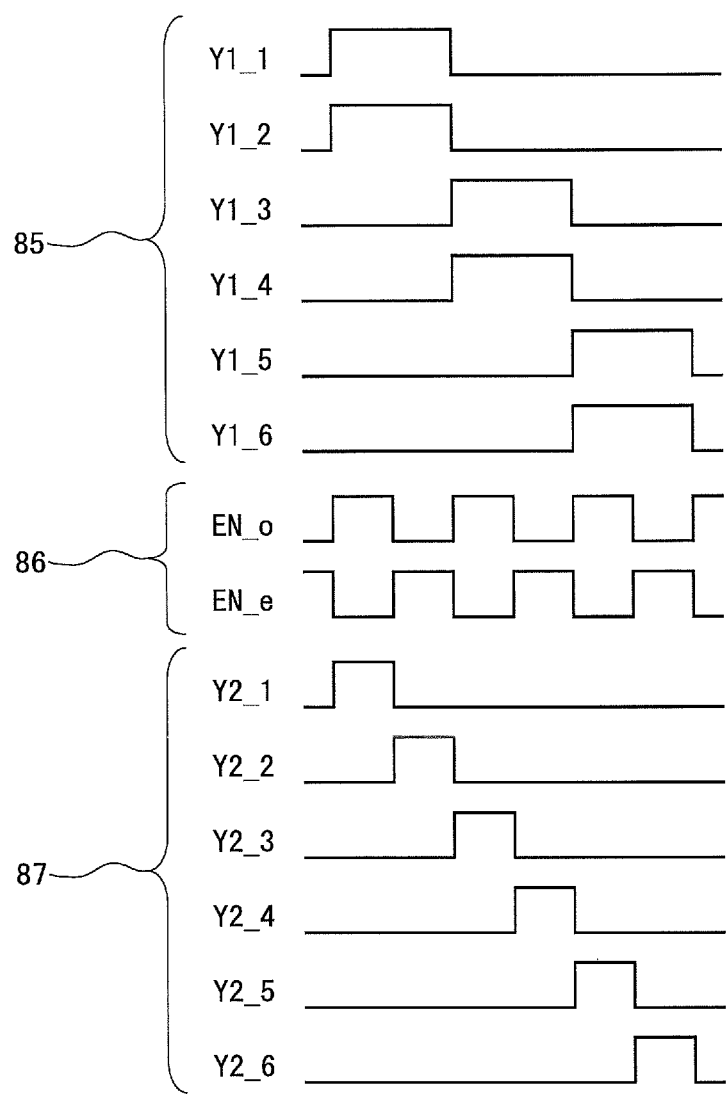
FIG. 41 is a timing chart for describing a method for driving scanning lines of the third variant.

Next, with reference to FIG. 41, a method for driving the scanning lines of the present variant will be described. FIG. 41 shows the waveforms of output signals Y1 of the first to sixth rows (Y1_1 to Y1_6), an enable signal EN_o, an enable signal EN_e, and output signals Y2 of the first to sixth rows (Y2_1 to Y2_6). When the scanning line drive circuits 33o and 33e are allowed to operate in the same manner as the scanning line drive circuit 33 of the third embodiment, the output signals Y1 (Y1_1 to Y1_6) sequentially go to a high level on a per two row basis, as shown in a portion indicated by reference character 85 in FIG. 41. Here, as for a period during which each of the output signals Y1 (Y1_1 to Y1_6) goes to a high level, the enable signal EN_o is brought to a high level during the first half period, and the enable signal EN_e is brought to a high level during the second half period, as shown in a portion indicated by reference character 86 in FIG. 41. By doing so, as shown in a portion indicated by reference character 87 in FIG. 41, the output signals Y2 (Y2_1 to Y2_6) sequentially go to a high level from the first row. By the above, even in a configuration in which the scanning line drive circuits are provided on both sides of the display unit, the scanning lines GA1 to GAn can be sequentially driven row by row. As for the scanning lines GB1 to GBn, too, only a desired scanning line GB can be brought to a high level by the enable signals EN_o and EN_e.

According to the present variant, the same size can be easily obtained for picture-frames on both the left and right sides of the display unit 601.

<6.4 Fourth Variant>

As for a configuration for providing enable signals to a unit circuit, various configurations are considered. For example, it is also possible to adopt a configuration in which an enable circuit is provided at the previous stage of a buffer unit (a configuration of the present variant).

Figure 42:
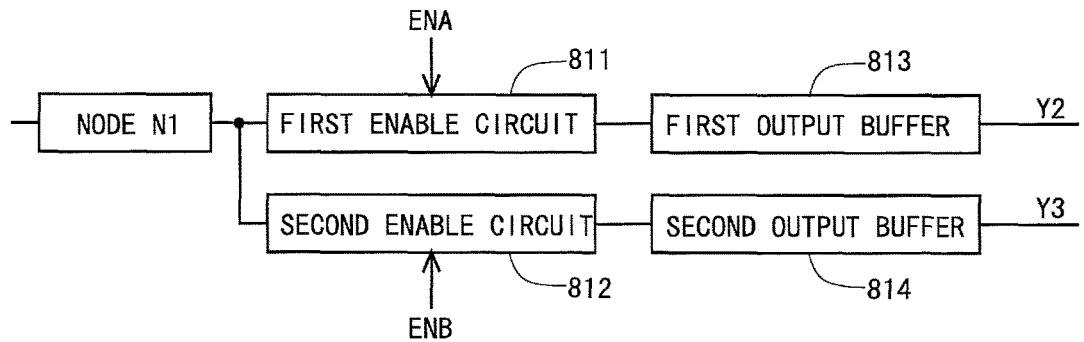
FIG. 42 is a block diagram showing a configuration of a main part of a unit circuit of a fourth variant.

FIG. 42 is a block diagram showing a configuration of a main part of a unit circuit 81 of the present variant. As can be grasped from FIG. 42, in the present variant, a first enable circuit 811 that is controlled by an enable signal ENA is connected to a first output buffer 813 that outputs an output signal Y2, and a second enable circuit 812 that is controlled by an enable signal ENB is connected to a second output buffer 814 that outputs an output signal Y3. The first enable circuit 811 and the second enable circuit 812 are connected to a node N1 through a capacitor (not shown in FIG. 42).

Figure 43:
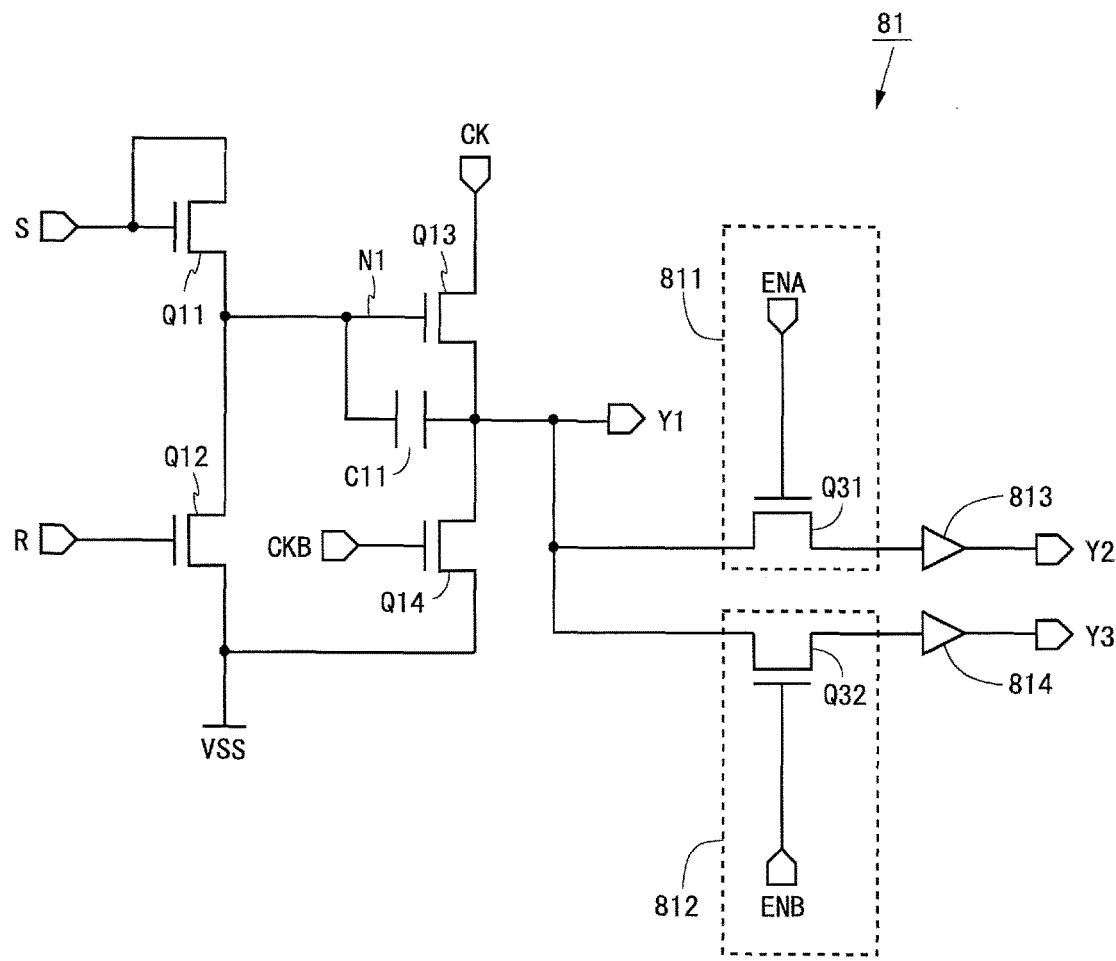
FIG. 43 is a circuit diagram of the unit circuit of the fourth variant.

FIG. 43 is a circuit diagram of the unit circuit 81 of the present variant. As shown in FIG. 43, the unit circuit 81 includes transistors Q11 to Q14 and Q31 to Q32, a capacitor C11, a first output buffer 813, and a second output buffer 814. The transistors Q11 to Q14 and Q31 to Q32 are N-channel TFTs. The drain and gate terminals of the transistor Q11 are connected to a set terminal S. A source terminal of the transistor Q11 is connected to a drain terminal of the transistor Q12 and a gate terminal of the transistor Q13. A drain terminal of the transistor Q13 is connected to a clock terminal CK. A source terminal of the transistor Q13 is connected to a drain terminal of the transistor Q14, an output terminal Y1, a drain terminal of the transistor Q31, and a drain terminal of the transistor Q32. A low-level voltage VSS is applied to source terminals of the transistors Q12 and Q14. A gate terminal of the transistor Q12 is connected to a reset terminal R, and a gate terminal of the transistor Q14 is connected to a clock terminal CKB. The capacitor C11 is provided between the gate and source terminals of the transistor Q13. A gate terminal of the transistor Q31 is connected to an enable terminal ENA, and a gate terminal of the transistor Q32 is connected to an enable terminal ENB. A source terminal of the transistor Q31 is connected to an input terminal of the first output buffer 813, and a source terminal of the transistor Q32 is connected to an input terminal of the second output buffer 814. An output terminal of the first output buffer 813 is connected to an output terminal Y2, and an output terminal of the second output buffer 814 is connected to an output terminal Y3.

In a configuration such as that described above, when both the clock signal CK and the enable signal ENA go to a high level with the voltage of the node N1 being at a high level, the output signal Y2 goes to a high level. In addition, when both the clock signal CK and the enable signal ENB go to a high level with the voltage of the node N1 being at a high level, the output signal Y3 goes to a high level. From such a fact, by controlling the enable signals as in the third embodiment, even when the unit circuit has a configuration such as that shown in FIG. 43, scanning lines GA1 to GAn and GB1 to GBn can be driven such that current measurement for characteristic detection is performed.

<6.5 Fifth Variant>

In the above-described embodiments, the reset signal R is used only to change the voltage of the node N1 to a low level. However, the present invention is not limited thereto, and the reset signal R may be used to change the voltage of output signals outputted from the unit circuit, in addition to the voltage of the node N1, to a low level. A configuration in which the voltage of the node N1 and the voltages of output signals Y1 to Y3 are changed to a low level using the reset signal R will be described below.

Figure 44:
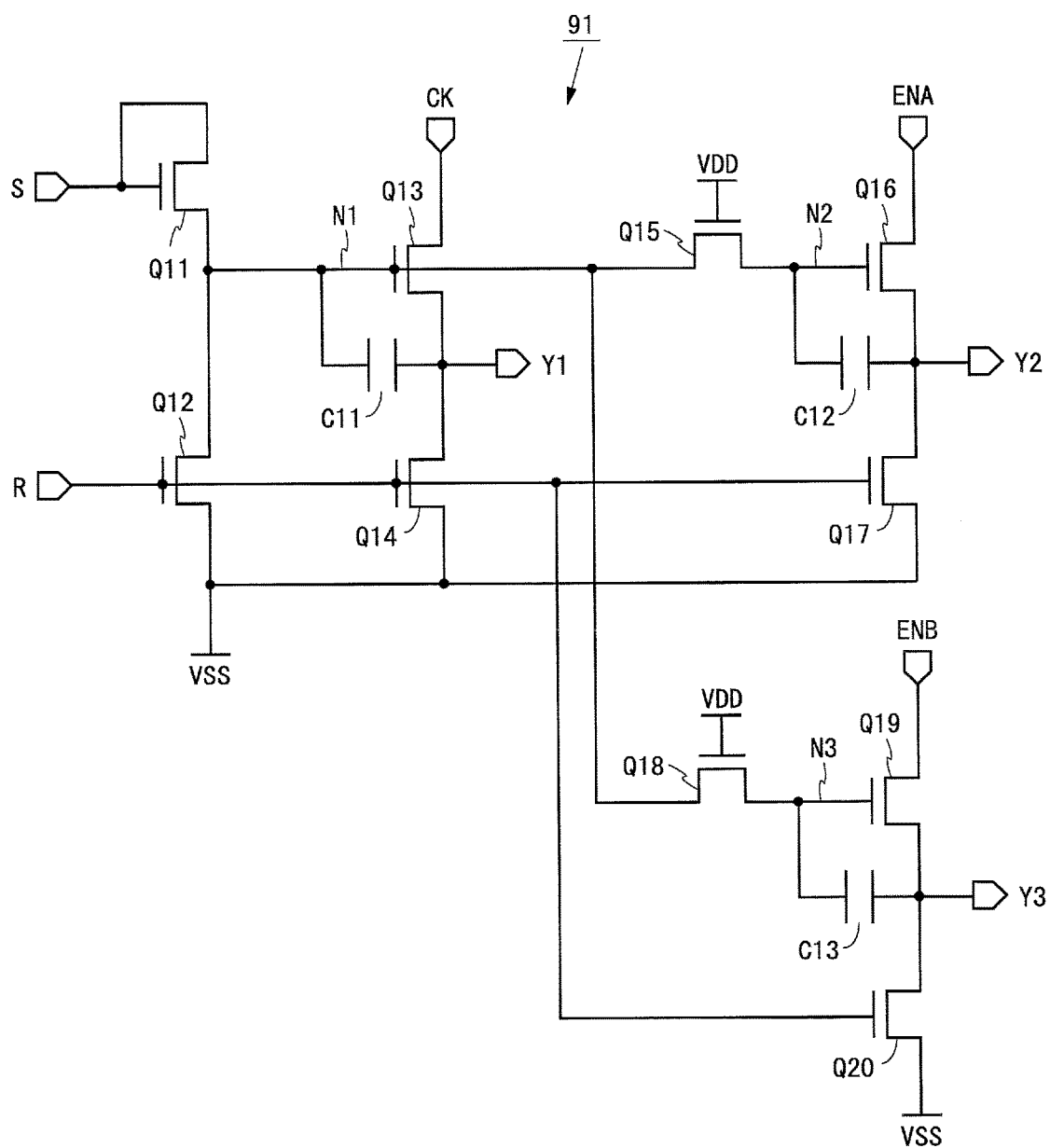
FIG. 44 is a circuit diagram of a unit circuit of a fifth variant.

FIG. 44 is a circuit diagram of a unit circuit 91 of the present variant. Although in the third embodiment (see FIG. 23) the gate terminals of the transistors Q14, Q17, and Q20 are connected to the clock terminal CKB, in the present variant the gate terminals of the transistors Q14, Q17, and Q20 are connected to the reset terminal R. As such, the reset signal R is provided to the gate terminals of the transistors Q14, Q17, and Q20 in addition to the gate terminal of the transistor Q12. Accordingly, in the present variant, the unit circuit 91 is not provided with a clock terminal CKB. Except for the above, the configuration is the same as that of the third embodiment.

Figure 45:
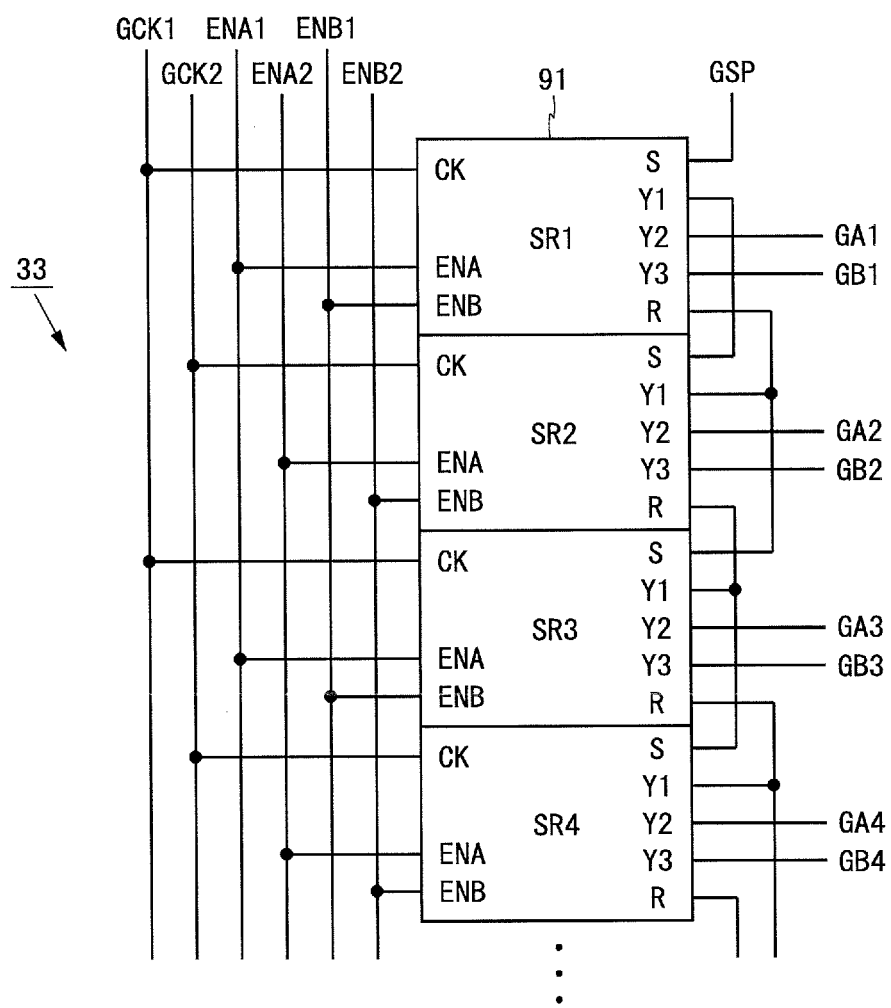
FIG. 45 is a block diagram showing a configuration of a scanning line drive circuit of the fifth variant.

FIG. 45 is a block diagram showing a configuration of a scanning line drive circuit 33 of the present variant. Unlike the configuration of the third embodiment (see FIG. 22), each unit circuit 91 is not provided with a clock terminal CKB. In the present variant, a gate clock GCK1 is provided to clock terminals CK of unit circuits 41 of the odd-numbered stages, and a gate clock GCK2 is provided to clock terminals CK of unit circuits 41 of the even-numbered stages.

In a configuration such as that described above, when the reset signal R goes to a high level, the transistors Q12, Q14, Q17, and Q20 go into an on state. By the transistor Q12 going into an on state, the voltage of a node N1 goes to a low level. By the transistor Q14 going into anon state, the voltage of an output signal Y1 goes to a low level. By the transistor Q17 going into an on state, the voltage of an output signal Y2 goes to a low level. By the transistor Q20 going into an on state, the voltage of an output signal Y3 goes to a low level. As described above, it is also possible to change the voltage of the node N1 and the voltages of the output signals Y1 to Y3, using the reset signal R.

<6.6 Sixth Variant>

Figure 46:
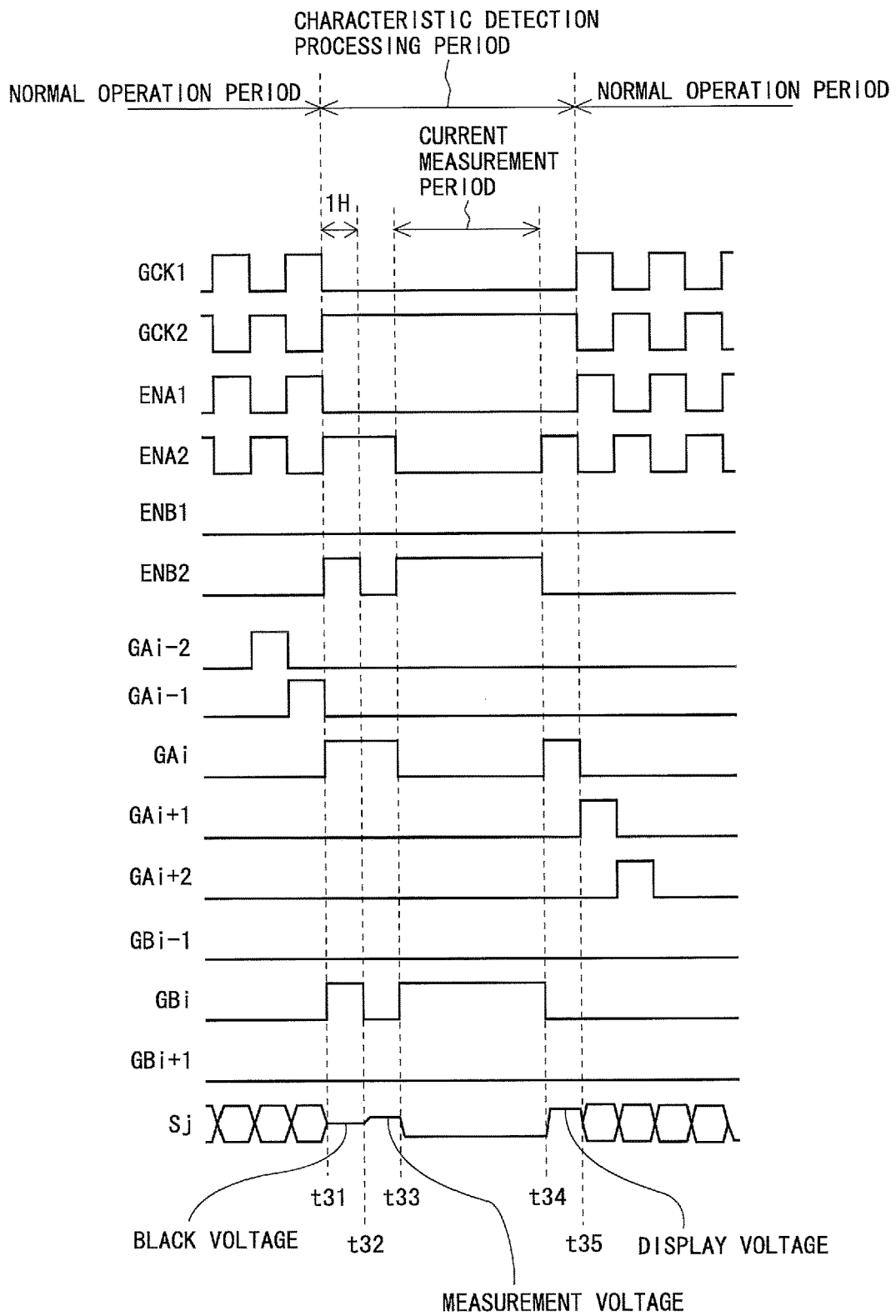
FIG. 46 is a timing chart for describing a drive method of a sixth variant.
Figure 47:
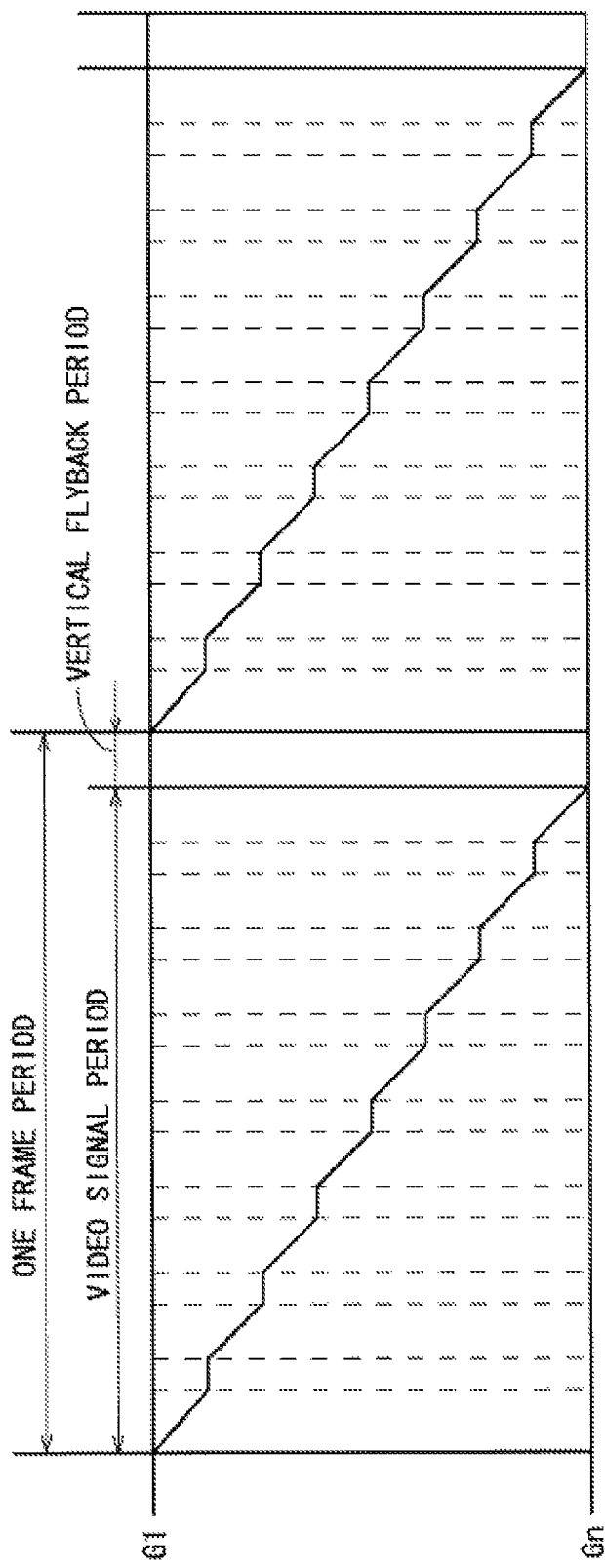
FIG. 47 is a timing chart for a display device having extended line periods.

As for the fourth embodiment (see FIG. 26), it is also possible to bring the display state of a pixel into a black display state before performing current measurement. FIG. 46 is a timing chart for describing a drive method of the present variant. In FIG. 46, a period from time t31 to time t35 is a characteristic detection processing period, and a period before time t31 and a period after time t35 are normal operation periods. In addition, a period from time t33 to time t34 is a current measurement period. Note that operation performed in the normal operation periods is the same as that in the fourth embodiment and thus description thereof is omitted.

At time t31 to time t32 in the characteristic detection processing period, the voltage of a scanning line GAi and the voltage of a scanning line GBi go to a high level. By this, in a pixel circuit 38 of an ith row (see FIG. 21), transistors Q2 and Q3 go into an on state. At this time, a black voltage (a voltage for displaying black) is supplied to a data line Sj from a source driver 14. Since the black voltage is thus supplied to the pixel circuit 38 of the ith row when the transistors Q2 and Q3 are in an on state, the display state of a pixel of the ith row goes into a black display state. Note that a pixel reset period is implemented by the period from time t31 to time t32.

At time t32 to time t33 in the characteristic detection processing period, the voltage of the scanning line GAi is maintained at the high level, and the voltage of the scanning line GBi goes to a low level. Hence, the transistor Q2 is maintained in the on state and the transistor Q3 goes into an off state. At this time, a measurement voltage is supplied to the data line Sj from the source driver 14. Based on the measurement voltage, a capacitor C1 is charged. Note that the measurement voltage is either a TFT characteristic measurement voltage or an OLED characteristic measurement voltage. In a period after time t33 in the characteristic detection processing period, the same operation as that performed in a period after time t12 in the fourth embodiment (see FIG. 26) is performed.

According to the present variant, the display state of a pixel is brought into a black display state immediately before performing current measurement. By this, it is possible to eliminate an influence exerted on a result of current measurement by a light-emission state of an organic EL element L1 that is before performing the current measurement.

<6.7 Other Variants>

As for display devices according to the first to third embodiments, the following variants can be formed. In the display devices according to the first to third embodiments, one current measurement period is set in a pause period, and the scanning line drive circuits 13 and 33 select one scanning line only once in the pause period. Instead, in a display device according to a variant, a plurality of current measurement periods may be set in a pause period. In this case, a scanning line drive circuit may select the same scanning line a plurality of times in the pause period, or may select each of a plurality of scanning lines once in the pause period. In addition, the scanning line drive circuit does not necessarily need to select a scanning line in all pause periods. In addition, n pause line periods may be provided at any position in a pause period.

In addition, instead of a unit circuit shown in each embodiment, other unit circuits having the same function may be used within a range not deviating from the spirit of the present invention. In a case where the unit circuit does not include the transistor Q15, the gate terminal of the transistor Q16 is connected to the node N1. In a case where the unit circuit does not include the transistor Q18, the gate terminal of the transistor Q19 is connected to the node N1.

7. Summary

As described above, according to a display device of the present invention, currents in pixel circuits can be measured using simple circuits while preventing a reduction in the image quality of a display image. Note that by any combining together the features of display devices according to the first to fifth embodiments and the variants thereof, provided that the combination does not go against their properties, a display device having features of a plurality of embodiments or variants can be configured.

Note that methods for driving a display device according to the first to third embodiments can also be defined as follows.

First Embodiment

A method for driving an active matrix-type display device having a display unit including a plurality of scanning lines, a plurality of data lines, a plurality of monitoring lines, and a plurality of pixel circuits arranged two-dimensionally; and having a drive period and a pause period, the method including:

a step of driving the plurality of scanning lines; and a step of driving the plurality of data lines and measuring currents outputted from the respective pixel circuits, wherein each of the pixel circuits includes:

an electro-optical element;

a drive transistor provided in series with the electro-optical element;

a write control transistor provided between a corresponding data line and a control terminal of the drive transistor, and having a control terminal connected to a corresponding scanning line;

a read control transistor provided between a corresponding monitoring line and one conductive terminal of the drive transistor, and having a control terminal connected to the corresponding scanning line; and a capacitor provided between the control terminal of the drive transistor and one conductive terminal thereof, in the step of driving the plurality of scanning lines, the plurality of scanning lines are selected in turn every line period and a scanning signal of a selection level is applied to the selected scanning line in the drive period; a scanning signal of the selection level is applied to a scanning line selected from among the plurality of scanning lines in a current measurement period set in the pause period; and a scanning signal of a non-selection level is applied to the plurality of scanning lines in a period other than the current measurement period in the pause period, and in the step of driving the plurality of data lines and measuring currents, data voltages are applied to the plurality of data lines every line period in the drive period, and currents outputted to the plurality of monitoring lines from pixel circuits provided for the selected scanning line are measured while measurement voltages are applied to the plurality of data lines and then data voltages generated corresponding to video signals are applied to the plurality of data lines in the current measurement period.

Second Embodiment

A method for driving an active matrix-type display device having a display unit including a plurality of scanning lines, a plurality of data lines, and a plurality of pixel circuits arranged two-dimensionally; and having a drive period and a pause period, the method including:

a step of driving the plurality of scanning lines; and a step of driving the plurality of data lines and measuring currents outputted from the respective pixel circuits, wherein
each of the pixel circuits includes:
an electro-optical element;
a drive transistor provided in series with the electro-optical element;
a write control transistor provided between a corresponding data line and one conductive terminal of the drive transistor, and having a control terminal connected to a corresponding scanning line;
a reference voltage application transistor provided between a control terminal of the drive transistor and a wiring line having a reference voltage, and having a control terminal connected to the corresponding scanning line; and
a capacitor provided between the control terminal of the drive transistor and one conductive terminal thereof,
in the step of driving the plurality of scanning lines, the plurality of scanning lines are selected in turn every line period and a scanning signal of a selection level is applied to the selected scanning line in the drive period; a scanning signal of the selection level is applied to a scanning line selected from among the plurality of scanning lines in a current measurement period set in the pause period; and a scanning signal of a non-selection level is applied to the plurality of scanning lines in a period other than the current measurement period in the pause period, and
in the step of driving the plurality of data lines and measuring currents, data voltages are applied to the plurality of data lines every line period in the drive period, and currents outputted to the plurality of data lines from pixel circuits provided for the selected scanning line are measured while measurement voltages are applied to the plurality of data lines and then data voltages generated corresponding to video signals are applied to the plurality of data lines in the current measurement period.

Third Embodiment

A method for driving an active matrix-type display device having a display unit including a plurality of first scanning lines, a plurality of second scanning lines, a plurality of data lines, and a plurality of pixel circuits arranged two-dimensionally; and having a drive period and a pause period, the method including:
a step of driving the plurality of scanning lines; and
a step of driving the plurality of data lines and measuring currents outputted from the respective pixel circuits, wherein
each of the pixel circuits includes:
an electro-optical element;
a drive transistor provided in series with the electro-optical element;
a write control transistor provided between a corresponding data line and a control terminal of the drive transistor, and having a control terminal connected to a corresponding first scanning line;
a read control transistor provided between the corresponding data line and one conductive terminal of the drive transistor, and having a control terminal connected to a corresponding second scanning line; and
a capacitor provided between the control terminal of the drive transistor and another conductive terminal thereof,
in the step of driving the plurality of scanning lines, the plurality of scanning lines are selected in turn every line period and a scanning signal of a selection level is applied to the selected scanning line in the drive period; a first period, a second period, and a third period are set in turn in a current measurement period set in the pause period, and a scanning signal of the selection level is applied to a scanning line selected from among the plurality of scanning lines in the first period and the third period, and a scanning signal of a non-selection level is applied to the selected scanning line in the second period; and a scanning signal of the non-selection level is applied to the plurality of scanning lines in a period other than the current measurement period in the pause period, and
in the step of driving the plurality of data lines and measuring currents, data voltages are applied to the plurality of data lines every line period in the drive period, measurement voltages are applied to the plurality of data lines in the first period, currents outputted to the plurality of data lines from pixel circuits provided for the selected scanning line are measured in the second period, and data voltages generated corresponding to video signals are applied to the plurality of data lines in the third period.

DESCRIPTION OF REFERENCE CHARACTERS 1, 2, 3, 4, 5, and 6: DISPLAY DEVICE
11, 21, 31, and 601: DISPLAY UNIT
12: DISPLAY CONTROL CIRCUIT
13, 33, 33a, and 33b: SCANNING LINE DRIVE CIRCUIT
14 and 44: SOURCE DRIVER
15: A/D CONVERTER
16 and 26: CORRECTION DATA STORAGE UNIT
17 and 27: CORRECTION COMPUTING UNIT
18, 28, and 38: PIXEL CIRCUIT
19: POWER SUPPLY UNIT
41, 51, 81, and 91: UNIT CIRCUIT
142: CURRENT MEASURING UNIT
144: D/A CONVERTER
442: VOLTAGE MEASURING UNIT
G1 to Gn, GA1 to GAn, and GB1 to GBn: SCANNING LINE
S1 to Sm: DATA LINE
M1 to Mm: MONITORING LINE
L1: ORGANIC EL ELEMENT
Q1 to Q3 and Q11 to Q20: TRANSISTOR
C1 and C11 to C13: CAPACITOR
EN1, EN2, ENA1, ENA2, ENB1, and ENB2: ENABLE SIGNAL
S: SET TERMINAL
R: RESET TERMINAL
CK and CKB: CLOCK TERMINAL

The invention claimed is:
1. An active matrix-type display device having a drive period and a pause period, the display device comprising:
a display unit including a plurality of scanning lines, a plurality of data lines, and a plurality of pixel circuits arranged two-dimensionally;
a scanning line drive circuit configured to drive the plurality of scanning lines; and
a data line drive circuit having a function of measuring currents outputted from the respective pixel circuits, in addition to a function of driving the plurality of data lines, wherein
the scanning line drive circuit applies scanning signals for current measurement and for writing a voltage to a scanning line selected from among the plurality of scanning lines, in a current measurement period set in the pause period, the data line drive circuit applies measurement voltages to the plurality of data lines, measures currents outputted from pixel circuits provided for the selected scanning line, and applies data voltages generated corresponding to video signals to the plurality of data lines, in the current measurement period, a length of the drive period is set to one frame period, and a length of the pause period is set to a plurality of frame periods.

2. The display device according to claim 1, wherein the scanning line drive circuit selects the plurality of scanning lines in turn every line period and applies a scanning signal of a selection level to the selected scanning line in the drive period, and it applies a scanning signal of a non-selection level to the plurality of scanning lines in a period other than the current measurement period in the pause period, and the data line drive circuit applies the data voltages to the plurality of data lines every line period in the drive period.

3. The display device according to claim 2, further comprising a display control circuit configured to output an enable signal that goes to the selection level in each line period in the drive period, and goes to the selection level in at least a part of the current measurement period in the pause period, wherein the scanning line drive circuit includes a shift register having a plurality of stages for the plurality of scanning lines and configured to output, based on the enable signal, scanning signals to be applied to the plurality of scanning lines.

4. The display device according to claim 3, wherein each of the stages of the shift register includes:

a node control circuit configured to switch a voltage of a first node between a selection level and a non-selection level, depending on signals inputted from a set terminal and a reset terminal;

a first output control circuit configured to apply a signal inputted from a clock terminal, to a set terminal of a subsequent stage and a reset terminal of a previous stage, when the voltage of the first node is at the selection level; and a second output control circuit configured to apply the enable signal to a corresponding scanning line when the voltage of the first node is at the selection level.

5. The display device according to claim 4, wherein the first output control circuit includes a first output control transistor having a first conductive terminal connected to the clock terminal; a second conductive terminal connected to the set terminal of the subsequent stage and the reset terminal of the previous stage; and a control terminal connected to the first node, and the second output control circuit includes a second output control transistor having a first conductive terminal to which the enable signal is provided; a second conductive terminal connected to the corresponding scanning line; and a control terminal connected to the first node or a second node having a voltage of a same logic level as the first node.

6. The display device according to claim 4, wherein the plurality of scanning lines include a plurality of first scanning lines and a plurality of second scanning lines, the enable signal includes a first enable signal and a second enable signal, the first output control circuit includes a first output control transistor having a first conductive terminal connected to the clock terminal; a second conductive terminal connected to the set terminal of the subsequent stage and the reset terminal of the previous stage; and a control terminal connected to the first node, and the second output control circuit includes:

a second output control transistor having a first conductive terminal to which the first enable signal is provided; a second conductive terminal connected to a corresponding first scanning line; and a control terminal connected to the first node or a second node having a voltage of a same logic level as the first node; and a third output control transistor having a first conductive terminal to which the second enable signal is provided; a second conductive terminal connected to a corresponding second scanning line; and a control terminal connected to the first node or a third node having a voltage of a same logic level as the first node.

7. The display device according to claim 6, wherein each of the pixel circuits includes:

an electro-optical element;

a drive transistor provided in series with the electro-optical element;

a write control transistor provided between a corresponding data line and a control terminal of the drive transistor, and having a control terminal connected to a corresponding first scanning line;

a read control transistor provided between the corresponding data line and one conductive terminal of the drive transistor, and having a control terminal connected to a corresponding second scanning line; and a capacitor provided between the control terminal of the drive transistor and another conductive terminal thereof.

8. The display device according to claim 3, wherein the display control circuit outputs an enable signal for an odd-numbered stage of the shift register and an enable signal for an even-numbered stage of the shift register.

9. The display device according to claim 3, wherein the display control circuit changes timing at which the enable signal of the selection level is outputted in the pause period, every plurality of pause periods.

10. The display device according to claim 3, wherein the scanning line drive circuit includes a transistor formed using an oxide semiconductor containing indium, gallium, zinc, and oxygen.

11. The display device according to claim 3, wherein the shift register performs, in the drive period, shift operation every line period and performs, in the pause period, shift operation in a longer cycle than the line period.

12. The display device according to claim 2, further comprising a correction computing unit configured to correct the video signals based on the currents measured by the data line drive circuit.

13. An active matrix-type display device that includes a plurality of pixel circuits forming a pixel matrix of a plurality of rows×a plurality of columns, each of the pixel circuits including a circuit element for displaying an image, the display device comprising:

data lines provided for respective columns of the pixel matrix in order to supply voltages to the respective pixel circuits;

first scanning lines provided for respective rows of the pixel matrix in order to control writing of voltages to the respective pixel circuits;
second scanning lines provided for the respective rows of the pixel matrix in order to control whether to perform measurement of an amount of electricity, the measurement being performed to obtain a characteristic of the circuit element;
a data line drive circuit having a function of measuring an amount of electricity in addition to a function of applying voltages to be supplied to the respective pixel circuits to the data lines; and
a scanning line drive circuit including a shift register and configured to apply first scanning signals and second scanning signals to the first scanning lines and the second scanning lines, respectively, the shift register including a plurality of stages, the plurality of stages having a one-to-one correspondence with the plurality of rows forming the pixel matrix, and each of the stages being connected to a corresponding first scanning line and a corresponding second scanning line, wherein
each of the stages of the shift register controls, based on one shift clock, levels of both a first scanning signal to be applied to a corresponding first scanning line and a second scanning signal to be applied to a corresponding second scanning line,
the display device adopts pause driving where a drive period during which normal display operation is performed and a pause period during which operation of the data line drive circuit and the scanning line drive circuit is stopped are repeated,
the data line drive circuit performs measurement of an amount of electricity in the pause period,
a length of the drive period is set to one frame period, and
a length of the pause period is set to a plurality of frame periods.

14. The display device according to claim 13, wherein each of the stages of the shift register includes:
a first node;
a first output node connected to a subsequent stage;
a second output node connected to a corresponding first scanning line;
a third output node connected to a corresponding second scanning line;
a first node control portion configured to change the first node from an off level to an on level when an output signal provided from the first output node changes from a non-selection level to a selection level;
an output signal control portion configured to control, when the first node is at the on level, a level of the output signal outputted from the first output node, based on a control clock;
a first scanning signal control portion configured to control, when the first node is at the on level, a level of the first scanning signal outputted from the second output node, based on a first enable signal; and
a second scanning signal control portion configured to control, when the first node is at the on level, a level of the second scanning signal outputted from the third output node, based on a second enable signal.

15. The display device according to claim 14, wherein each of the stages of the shift register further includes a first scanning signal resetting portion configured to bring the level of a first scanning signal outputted from the second output node to the non-selection level, and the first scanning signal control portion includes:
a first scanning control transistor having a control terminal connected to the first node; a first conductive terminal to which the first enable signal is provided; and a second conductive terminal connected to the second output node and the first scanning signal resetting portion; and
a first boost capacitance having one end connected to the first node; and another end connected to the second conductive terminal of the first scanning control transistor.

16. The display device according to claim 14, wherein each of the stages of the shift register further includes a second scanning signal resetting portion configured to bring a level of a third scanning signal outputted from the third output node to the non-selection level, and the second scanning signal control portion includes a second scanning control transistor having a control terminal connected to the first node; a first conductive terminal to which the second enable signal is provided; and a second conductive terminal connected to the third output node and the second scanning signal resetting portion.

17. The display device according to claim 14, wherein each of the stages of the shift register further includes:
a first scanning signal resetting portion configured to bring the level of a first scanning signal outputted from the second output node to the non-selection level; and
a second scanning signal resetting portion configured to bring the level of a second scanning signal outputted from the third output node to the non-selection level, and
based on a same signal, the first scanning signal resetting portion brings the level of the first scanning signal to the non-selection level and the second scanning signal resetting portion brings the level of the second scanning signal to the non-selection level.

18. The display device according to claim 14, wherein each of the stages of the shift register further includes:
an output signal resetting portion configured to bring the level of a output signal outputted from the first output node to the non-selection level;
a first scanning signal resetting portion configured to bring the level of a first scanning signal outputted from the second output node to the non-selection level; and
a second scanning signal resetting portion configured to bring the level of a second scanning signal outputted from the third output node to the non-selection level, and
based on a same signal, the output signal resetting portion brings the level of the output signal to the non-selection level, the first scanning signal resetting portion brings the level of the first scanning signal to the non-selection level, and the second scanning signal resetting portion brings the level of the second scanning signal to the non-selection level.

19. A method for driving an active matrix-type display device having a display unit including a plurality of scanning lines, a plurality of data lines, and a plurality of pixel circuits arranged two-dimensionally; and having a drive period and a pause period, the method comprising:
a step of driving the plurality of scanning lines; and
a step of driving the plurality of data lines and measuring currents outputted from the respective pixel circuits, wherein in the step of driving the plurality of scanning lines, scanning signals for current measurement and for writing a voltage are applied to a scanning line selected from among the plurality of scanning lines, in a current measurement period set in the pause period, in the step of driving the plurality of data lines and measuring currents, measurement voltages are applied to the plurality of data lines, currents outputted from pixel circuits provided for the selected scanning line are measured, and data voltages generated corresponding to video signals are applied to the plurality of data lines, in the current measurement period, a length of the drive period is set to one frame period, and a length of the pause period is set to a plurality of frame periods.

* * * * *